United States Patent
Zhang et al.

(10) Patent No.: US 11,133,828 B2
(45) Date of Patent: Sep. 28, 2021

(54) CODING METHOD AND APPARATUS

(71) Applicant: Huawei Technologies Co., Ltd., Shenzhen (CN)

(72) Inventors: Huazi Zhang, Hangzhou (CN); Jun Wang, Hangzhou (CN); Rong Li, Hangzhou (CN); Lingchen Huang, Hangzhou (CN); Jian Wang, Hangzhou (CN); Shengchen Dai, Hangzhou (CN); Jiajie Tong, Hangzhou (CN); Vladimir Gritsenko, Moscow (RU); Oleg Feat'evich Kurmaev, Moscow (RU); Aleksei Eduardovich Maevskii, Moscow (RU)

(73) Assignee: Huawei Technologies Co., Ltd., Shenzhen (CN)

( * ) Notice: Subject to any disclaimer, the term of this patent is extended or adjusted under 35 U.S.C. 154(b) by 198 days.

(21) Appl. No.: 16/459,008

(22) Filed: Jul. 1, 2019

(65) Prior Publication Data
US 2019/0326933 A1    Oct. 24, 2019

Related U.S. Application Data

(63) Continuation of application No. PCT/CN2018/071276, filed on Jan. 4, 2018.

(30) Foreign Application Priority Data

Jan. 5, 2017  (CN) .......................... 201710008407.2
Feb. 4, 2017  (CN) .......................... 201710064623.9

(51) Int. Cl.
*H03M 13/13*   (2006.01)
*H03M 13/00*   (2006.01)
(Continued)

(52) U.S. Cl.
CPC ......... *H03M 13/13* (2013.01); *H03M 13/616* (2013.01); *H04L 1/0057* (2013.01);
(Continued)

(58) Field of Classification Search
CPC .. H03M 13/13; H03M 13/09; H03M 13/2906; H03M 13/00; H03M 13/353;
(Continued)

(56) References Cited

U.S. PATENT DOCUMENTS

2008/0225819 A1* 9/2008 Niu ..................... H04N 21/2383
                                                                    370/342
2013/0117344 A1* 5/2013 Gross ................. H03M 13/1575
                                                                    708/490
(Continued)

FOREIGN PATENT DOCUMENTS

CN    103780329 A    5/2014
CN    104219019 A    12/2014
(Continued)

OTHER PUBLICATIONS

"Polar Code Construction for NR," 3GPP TSG RAN WG1 Meeting #86bis, Lisbon, Portugal, R1-1608862, pp. 1-3, 3rd Generation Partnership Project, Valbonne, France (Oct. 10-14, 2016).
(Continued)

*Primary Examiner* — April Y Blair
*Assistant Examiner* — Sazzad Hossain
(74) *Attorney, Agent, or Firm* — Leydig, Voit & Mayer, Ltd.

(57) ABSTRACT

A method comprises: obtaining a coded bit sequence by performing PC-polar coding on information bits based on first constructor parameters; and sending the coded bit sequence. A check equation of the first constructor parameters includes a first element representing a check-required information bit position and a second element representing
(Continued)

a check bit position, the first element corresponds to a first vector (V1) in a generator matrix for PC-polar codes, the second element corresponds to a second vector (V2) in the generator matrix, and if a first Hamming weight (HW1) of V1 is the same as a second Hamming weight (HW2) of V2, then a third Hamming weight (HW3) of an addition modulo 2 vector is greater than HW1 and greater than HW2, or if HW1 is different from HW2, then HW3 is greater than a smaller one of the HW1 and HW2.

6 Claims, 13 Drawing Sheets

(51) Int. Cl.
　　　*H04L 1/00* 　　(2006.01)
　　　*H03M 13/09* 　(2006.01)
　　　*H03M 13/35* 　(2006.01)
　　　*H03M 13/29* 　(2006.01)

(52) U.S. Cl.
　　　CPC ........... *H04L 1/0067* (2013.01); *H03M 13/00* (2013.01); *H03M 13/09* (2013.01); *H03M 13/134* (2013.01); *H03M 13/2906* (2013.01); *H03M 13/353* (2013.01); *H04L 1/0058* (2013.01); *H04L 1/0061* (2013.01)

(58) Field of Classification Search
　　　CPC .. H03M 13/134; H04L 1/0057; H04L 1/0058; H04L 1/0061
　　　See application file for complete search history.

(56) References Cited

U.S. PATENT DOCUMENTS

| | | |
|---|---|---|
| 2015/0222295 A1 | 8/2015 | Li et al. |
| 2016/0013810 A1* | 1/2016 | Gross ............... H03M 13/13 714/776 |
| 2016/0079999 A1 | 3/2016 | Shen et al. |

FOREIGN PATENT DOCUMENTS

| | | |
|---|---|---|
| CN | 105680883 A | 6/2016 |
| CN | 105933010 A | 9/2016 |
| CN | 106100794 A | 11/2016 |
| WO | 2016168962 A1 | 10/2016 |

OTHER PUBLICATIONS

Hadi et al., "On Enhancing the Minimum Hamming Distance of Polar Codes," pp. 1-5, Institute of Electrical and Electronics Engineers, New York, New York (2016).

Sybis et al.,"Channel Coding for Ultra-Reliable Low-Latency Communication in 5G Systems," Institute of Electrical and Electronics Engineers, New York, New York (2016).

"3rd Generation Partnership Project; Technical Specification Group Radio Access Network; Evolved Universal Terrestrial Radio Access (E-UTRA); Multiplexing and channel coding (Release 14)," 3GPP TS 36.212 V14.1.1, pp. 1-149, 3rd Generation Partnership Project, Valbonne, France (Jan. 2017).

"Design Aspects of Polar and LDPC codes for NR," 3GPP TSG RAN WG1 Meeting #87, Reno, USA, R1-1613300, pp. 1-18, 3rd Generation Partnership Project, Valbonne, France (Nov. 14-18, 2016).

"3rd Generation Partnership Project; Technical Specification Group Radio Access Network; Evolved Universal Terrestrial Radio Access (E-UTRA); Physical channels and modulation(Release 14)," 3GPP TS 36.211 V14.1.0 pp. 1-175, 3rd Generation Partnership Project, Valbonne, France (Dec. 2012).

* cited by examiner

CODING METHOD AND APPARATUS

CROSS-REFERENCE TO RELATED APPLICATIONS

This application is a continuation of International Application No. PCT/CN2018/071276, filed on Jan. 4, 2018, which claims priority to Chinese Patent Application No. 201710064623.9, filed on Feb. 4, 2017, and Chinese Patent Application No. 201710008407.2, filed on Jan. 5, 2017. The disclosures of the aforementioned applications are hereby incorporated by reference in their entireties.

TECHNICAL FIELD

This application relates to the field of communications technologies, and in particular, to a coding method and apparatus.

BACKGROUND

In communications systems of different radio access technologies, different coding schemes are usually used to adapt to various application scenarios. In a long term evolution (LTE) system, ultra short codes with an information vector length less than or equal to 13 are used for physical channels such as a physical hybrid automatic repeat request indicator channel (PHICH), a physical control format indicator channel (PCFICH), a physical uplink control channel (PUCCH), and a physical uplink shared channel (PUSCH). In existing LTE control channel scenarios, when K<15, repetition codes, simplex codes, RM (Reed-Muller) codes, and the like are separately used to obtain optimal performance.

For example, for the physical hybrid automatic repeat request indicator channel, an information vector length is 1, a code word vector length is 3, and the repetition code is used for coding. For the physical control format indicator channel, an information vector length is 2, a code word vector length is 32, and sequence mapping is used for coding. The sequence mapping may be equivalent to concatenating the simplex code and the repetition code. For the physical uplink control channel and the physical uplink shared channel, when an information vector length of uplink control information (UCI) is less than or equal to 2, coding is not performed, but a gain is obtained by applying, for example, frequency domain spreading and an orthogonal sequence after modulation; when the information vector length of the uplink control information is greater than or equal to 3 but less than or equal to 22, the LTE-RM code is used for coding; when the information vector length of the uplink control information is greater than 22, LTE-TBCC is used for coding.

However, LTE-TBCC cannot provide a uniform coding scheme for ultra short codes, while complexity of Hadamard decoding used in the case of LTE-RM is unacceptable when a code length becomes larger. Therefore, in an LTE communications system, a fifth generation (5G) communications system, or another possible communications system, to use a plurality of coding schemes, a terminal needs to support a plurality of sets of encoders and decoders. This inevitably increases costs of the terminal.

SUMMARY

Embodiments of this application provide a coding method and apparatus, to provide a uniform coding method for ultra short codes.

The specific technical solutions provided in the embodiments of this application are as follows:

According to a first aspect, a coding method is provided, including: obtaining, by a transmit end, to-be-coded information bits; performing PC-polar coding on the to-be-coded information bits based on first constructor parameters, to obtain a coded bit sequence; and sending the coded bit sequence. The first constructor parameters include a check equation, the check equation is an empty set or includes a first element representing a check-required information bit position and a second element representing a check bit position, the first element corresponds to a first vector in a generator matrix for PC-polar codes, the second element corresponds to a second vector in the generator matrix, and the first vector, the second vector, and an addition modulo 2 vector of the first vector and the second vector make true that, if a first Hamming weight of the first vector is the same as a second Hamming weight of the second vector, a third Hamming weight of the addition modulo 2 vector is greater than the first Hamming weight and greater than the second Hamming weight, or if the first Hamming weight is different from the second Hamming weight, the third Hamming weight is greater than a smaller one of the first Hamming weight and the second Hamming weight. Therefore, PC-polar coding can be used as a uniform coding method for ultra short codes. All functions can be implemented by using only one encoder and one decoder, saving hardware resources.

In a possible design, the first element and the second element are both row numbers of the generator matrix, the first vector is a row vector whose row number is a value of the first element, in the generator matrix for PC-polar codes, and the second vector is a row vector whose row number is a value of the second element, in the generator matrix for PC-polar codes; and the first element is less than the second element.

In a possible design, the first constructor parameters further include non-check-required information bit positions, and the non-check-required information bit positions make true that, according to a specified sorting manner, a first information bit position has a higher ranking than a second information bit position, where the specified sorting manner includes sorting by reliability or sorting by polarization weight, and a higher ranking means higher reliability or a greater polarization weight, the first information bit position is an information bit position having a lowest ranking among the non-check-required information bit positions, and the second information bit position is an information bit position that has a lowest ranking in a polar polar code obtained based on second polar code constructor parameters that include no check coding scheme.

In a possible design, the first constructor parameters further include information bit positions and frozen bit positions, and the information bit positions include check-required information bit positions and non-check-required information bit positions; K row vectors are selected from the generator matrix according to a descending order of bit position reliability, and a minimum row weight $W_{min}$ of the K row vectors is obtained, where K represents a length of the to-be-coded information bits and is a positive integer; bit positions corresponding to row vectors whose row weights are less than $W_{min}$, in the generator matrix are set as frozen bit positions, bit positions corresponding to row vectors whose row weights are greater than $W_{min}$, in the generator matrix are set as non-check-required information bit positions, and bit positions corresponding to row vectors whose row weights are equal to $W_{min}$, in the generator matrix are set as to-be-optimized bit positions; a set of candidate check equations is constructed based on the to-be-optimized bit positions; trial coding is performed on the to-be-coded information bits according to each candidate check equation in the set, and minimum code distances of bit sequences resulting from the trial coding are calculated; and a candidate check equation corresponding to a largest minimum code distance is selected as the check equation in the first constructor parameters.

In a possible design, the first constructor parameters further include a rate matching scheme and processing positions of the rate matching scheme; and rate matching is performed on a coding matrix for PC-polar codes based on the rate matching scheme and the processing positions of the rate matching scheme, to obtain the generator matrix.

In a possible design, if $N=N_0=2^m$, and $$K = \sum_{i=0}^{r} \binom{m}{i},$$

the check equation is an empty set, where $N_0$ represents a mother code length of a PC-polar code, K is the length of the to-be-coded information bits, N represents a length of the coded bit sequence, m, $N_0$, K, N are all positive integers, $0 \leq r \leq m$, and r is an integer.

In a possible design, if bit positions are denoted by row numbers 1, 2, . . . , and $N_0$ of the generator matrix, $N_0$ represents a mother code length of a PC-polar code, K represents a length of the to-be-coded information bits, N represents a length of the coded bit sequence, $N_0$, K, and N are all positive integers, R represents a rate matching scheme, P represents a processing position of the rate matching scheme, F represents a frozen bit position, I represents an information bit position, PC represents a check bit position, and PF represents the check equation, then if K is 1 and $N_0$ is 2^ceil($\log_2 N$), where ceil is an up-rounding operation, the first constructor parameters are as follows: R is puncturing, P is any ($N_0$-N) bit positions, F is 1 to $N_0$-1, I is $N_0$, and PC and PF are both empty sets; or if K is 2, 3, 4, or 5 and $N_0$ is $2^K$, the first constructor parameters are as follows: R is shortening to $N_0$-1 followed by repeating to the length N, with a low-order bit of a code word punctured when N is a non-integer multiple of $N_0$, P is $\{N_0\}$, I includes all row numbers corresponding to row vectors whose row weights are $N_0/2$, F includes all row numbers except the row numbers in I, and PC and PF are both empty sets; or if K is 6, N is 32, and $N_0$ is 32, the first constructor parameters are as follows: R is no rate matching, P is an empty set, F is [1, 2, 3, 4, 5, 6, 7, 8, 9, 10, 11, 12, 13, 14, 15, 17, 18, 19, 20, 21, 22, 23, 25, 26, 27, 29], I is [16, 24, 28, 30, 31, 32], PC is an empty set, and PF is an empty set; or if K is 7, N is 32, and $N_0$ is 32, the first constructor parameters are as follows: R is no rate matching, P is an empty set, F is [1, 2, 3, 4, 5, 6, 7, 8, 9, 10, 11, 12, 13, 14, 15, 17, 18, 19, 20, 21, 22, 25, 27, 29], I is [16, 23, 24, 28, 30, 31, 32], PC is [26], and PF is [23, 26]; or if K is 8, N is 32, and $N_0$ is 32, the first constructor parameters are as follows: R is no rate matching, P is an empty set, F is [1, 2, 3, 4, 5, 6, 7, 8, 9, 10, 11, 12, 13, 15, 17, 18, 19, 20, 21, 22, 25, 29], I is [14, 16, 23, 24, 28, 30, 31, 32], PC is [26, 27], and PF is {[23, 26], [14, 27]}; or if K is 9, N is 32, and $N_0$ is 32, the first constructor parameters are as follows: R is no rate matching, P is an empty set, F is [1, 2, 3, 4, 5, 6, 7, 8, 9, 10, 11, 12, 13, 17, 18, 19, 21, 25, 29], I is [14, 15, 16, 23, 24, 28, 30, 31, 32], PC is [20, 22, 26, 27], and PF is {[15, 20], [15, 22], [15, 23, 26], [14, 27]} or {[15, 20], [22], [23, 26], [14, 27]}; or if K is 10, N is 32, and $N_0$ is 32, the first constructor parameters are as follows: R is no rate matching, P is an empty set, F is [1, 2, 3, 4, 5, 6, 7, 8, 9, 10, 11, 13, 17, 18, 19, 21, 25], I is [12, 14, 15, 16, 23, 24, 28, 30, 31, 32], PC is [20, 22, 26, 27, 29], and PF is {[15, 20], [12 22], [23, 26], [14, 27], [12, 29]} or {[15, 20], [12, 15, 22], [15, 23, 26], [14, 27], [12, 29]}; or if K is 11, N is 32, and $N_0$ is 32, the first constructor parameters are as follows: R is no rate matching, P is an empty set, F is [1, 2, 3, 4, 5, 6, 7, 8, 9, 10, 11, 13, 17, 18, 19, 21, 25], I is [12, 14, 15, 16, 23, 24, 28, 29, 30, 31, 32], PC is [20, 22, 26, 27], and PF is {[15, 20], [12, 15, 22], [15, 23, 26], [14, 27]} or {[15, 20], [12 22], [23, 26], [14, 27]}; or if K is 5, N is 24, and $N_0$ is 32, the first constructor parameters are as follows: R is puncturing, P is [1, 2, 3, 4, 5, 6, 9, 10], F is [1, 2, 3, 4, 5, 6, 7, 8, 9, 10, 11, 12, 13, 14, 15, 16, 17, 18, 19, 20, 21, 22, 23, 25, 26, 27, 29], I is [24, 28, 30, 31, 32], PC is an empty set, and PF is an empty set; or if K is 6, N is 24, and $N_0$ is 32, the first constructor parameters are as follows: R is puncturing, P is [1, 2, 3, 4, 9, 10, 17, 18], F is [1, 2, 3, 4, 5, 6, 7, 8, 9, 10, 11, 12, 13, 14, 15, 17, 18, 19, 20, 21, 22, 23, 25, 26, 27, 29], I is [16, 24, 28, 30, 31, 32], PC is an empty set, and PF is an empty set; or if K is 7, N is 24, and $N_0$ is 32, the first constructor parameters are as follows: R is puncturing, P is [1, 2, 3, 4, 5, 6, 7, 8], F is [1, 2, 3, 4, 5, 6, 7, 8, 9, 10, 11, 12, 13, 14, 15, 17, 18, 19, 20, 21, 22, 25, 27, 29], I is [16, 23, 24, 28, 30, 31, 32], PC is [26], and PF is {[23, 26]}; or if K is 8, N is 24, and $N_0$ is 32, the first constructor parameters are as follows: R is puncturing, P is [1, 2, 3, 4, 5, 6, 7, 8], F is [1, 2, 3, 4, 5, 6, 7, 8, 9, 10, 11, 12, 13, 15, 17, 18, 19, 20, 21, 22, 25, 29], I is [14, 16, 23, 24, 28, 30, 31, 32], PC is [26, 27], and PF is {[23, 26], [14, 27]}; or if K is 9, N is 24, and $N_0$ is 32, the first constructor parameters are as follows: R is puncturing, P is [1, 2, 3, 4, 5, 6, 7, 8], F is [1, 2, 3, 4, 5, 6, 7, 8, 9, 10, 11, 12, 13, 17, 18, 19, 21, 25, 29], I is [14, 15, 16, 23, 24, 28, 30, 31, 32], PC is [20, 22, 26, 27], and PF is {[15, 20], [15, 22], [15, 23, 26], [14, 27]}; or if K is 10, N is 24, and $N_0$ is 32, the first constructor parameters are as follows: R is puncturing, P is [1, 2, 3, 4, 9, 10, 17, 18], F is [1, 2, 3, 4, 5, 6, 7, 8, 9, 10, 11, 13, 17, 18, 19, 21, 25], I is [12, 14, 15, 16, 23, 24, 28, 30, 31, 32], PC is [20, 22, 26, 27, 29], and PF is {[15, 20], [12 22], [23, 26], [14, 27], [12, 29]}; or if K is 11, N is 24, and $N_0$ is 32, the first constructor parameters are as follows: R is puncturing, P is [1, 2, 3, 4, 9, 10, 17, 18], F is [1, 2, 3, 4, 5, 6, 7, 8, 9, 10, 11, 13, 17, 18, 19, 21, 25], I is [12, 14, 15, 16, 23, 24, 28, 29, 30, 31, 32], PC is [20, 22, 26, 27], and PF is {[15, 20], [12, 15, 22], [15, 23, 26], [14, 27]} or {[15, 20], [12 22], [23, 26], [14, 27]}; or if K is 5, N is 20, and $N_0$ is 32, the first constructor parameters are as follows: R is puncturing, P is [1, 3, 6, 9, 12, 16, 18, 23, 24, 27, 31, 32], F is [1, 2, 3, 4, 5, 6, 7, 8, 9, 10, 11, 12, 13, 14, 15, 16, 17, 18, 19, 20, 21, 22, 23, 25, 26, 27, 29], I is [24, 28, 30, 31, 32], PC is an empty set, and PF is an empty set; or if K is 6, N is 20, and $N_0$ is 32, the first constructor parameters are as follows: R is puncturing, P is [1, 3, 6, 9, 12, 16, 18, 23, 24, 27, 31, 32], F is [1, 2, 3, 4, 5, 6, 7, 8, 9, 10, 11, 12, 13, 14, 15, 17, 18, 19, 20, 21, 22, 23, 25, 26, 27, 29], I is [16, 24, 28, 30, 31, 32], PC is an empty set, and PF is an empty set; or if K is 7, N is 20, and $N_0$ is 32, the first constructor parameters are as follows: R is puncturing, P is [1, 2, 3, 4, 5, 6, 7, 8, 9, 10, 17, 18], F is [1, 2, 3, 4, 5, 6, 7, 8, 9, 10, 11, 12, 13, 14, 15, 17, 18, 19, 20, 21, 23, 25, 26, 29], I is [16, 22, 24, 28, 30, 31, 32], PC is [27], and PF is {[22, 27]}; or if K is 8, N is 20, and $N_0$ is 32, the first constructor parameters are as follows: R is puncturing, P is [1, 2, 3, 4, 5, 6, 7, 8, 9, 10, 17, 18], F is [1, 2, 3, 4, 5, 6, 7, 8, 9, 10, 11, 12, 13, 15, 17, 18, 19, 20, 21, 22, 25, 29], I is [14, 16, 23, 24, 28, 30, 31, 32], PC is [26, 27], and PF is {[23, 26], [14, 27]}; or if K is 9, N is 20, and $N_0$ is 32, the first constructor parameters are as follows: R is puncturing, P is [1, 2, 3, 4, 5, 6, 7, 8, 9, 10, 11, 12], F is [1, 2, 3, 4, 5, 6, 7, 8, 9, 10, 11, 12, 13, 14, 15, 17, 18, 19, 21, 25], I is [16, 22, 23, 24, 28, 29, 30, 31, 32], PC is [20, 26, 27], and PF is {[16, 20], [16, 22, 23, 26], [22, 27]}; or if K is 10, N is 20, and $N_0$ is 32, the first constructor parameters are as follows: R is puncturing, P is [1, 2, 3, 4, 5, 6, 7, 8, 9, 10, 17, 18], F is [1, 2, 3, 4, 5, 6, 8, 9, 10, 11, 12, 13, 17, 18, 19, 21, 25], I is [14, 15, 16, 23, 24, 28, 29, 30, 31, 32], PC is [20, 22, 26, 27], and PF is {[15, 20], [15, 22], [15, 23, 26], [14, 27]}; or if K is 11, N is 20, and $N_0$ is 32, the first constructor parameters are as follows: R is puncturing, P is [1, 2, 3, 4, 5, 6, 7, 8, 9, 10, 17, 18], F is [1, 2, 3, 4, 5, 6, 7, 8, 9, 10, 11, 13, 17, 18, 19, 21, 25], I is [12, 14, 15, 16, 23, 24, 28, 29, 30, 31, 32], PC is [20, 22, 26, 27], and PF is {[15, 20], [12, 15, 22], [15, 23, 26], [14, 27]} or {[15, 20], [12 22], [23, 26], [14, 27]}; or if K is 12, N is 20, and $N_0$ is 32, the first constructor parameters are as follows: R is puncturing, P is [1, 2, 3, 4, 5, 6, 7, 8, 9, 10, 17, 18], F is [1, 2, 3, 4, 5, 6, 7, 8, 9, 10, 11, 13, 17, 18, 19, 21, 25], I is [12, 14, 15, 16, 20, 24, 27, 28, 29, 30, 31, 32], PC is [22, 23, 26], and PF is {[14, 20, 22], [14, 15, 20, 23], [12, 14, 15, 20, 26]}; or if K is 13, N is 20, and $N_0$ is 32, the first constructor parameters are as follows: R is puncturing, P is [1, 2, 3, 4, 5, 6, 7, 8, 9, 10, 11, 12], F is [1, 2, 3, 4, 5, 6, 7, 8, 9, 10, 11, 12, 13, 15, 17, 21, 25], I is [14, 16, 20, 22, 23, 24, 26, 27, 28, 29, 30, 31, 32], PC is [18, 19], and PF is {[14, 18], [14, 19]}; or if K is 5, N is 24, and $N_0$ is 32, the first constructor parameters are as follows: R is shortening, P is [4, 8, 12, 16, 20, 24, 28, 32], F is [1, 2, 3, 4, 5, 6, 7, 8, 9, 10, 11, 12, 13, 16, 17, 18, 19, 20, 21, 24, 25, 28, 32], I is [14, 15, 22, 30, 31], PC is [23, 26, 27, 29], and PF is {[14, 15, 23], [14, 15, 26], [14, 22, 27], [14, 29]}; or if K is 6, N is 24, and $N_0$ is 32, the first constructor parameters are as follows: R is shortening, P is [4, 8, 12, 16, 20, 24, 28, 32], F is [1, 2, 3, 4, 5, 6, 7, 8, 9, 10, 11, 12, 13, 16, 17, 18, 19, 20, 21, 24, 25, 28, 32], I is [14, 15, 22, 23, 30, 31], PC is [26, 27, 29], and PF is {[15, 26], [22, 27], [14, 29]}; or if K is 7, N is 24, and $N_0$ is 32, the first constructor parameters are as follows: R is shortening, P is [4, 8, 12, 16, 20, 24, 28, 32], F is [1, 2, 3, 4, 5, 6, 7, 8, 9, 10, 11, 12, 13, 16, 17, 18, 19, 20, 21, 24, 25, 28, 32], I is [14, 15, 22, 23, 26, 30, 31], PC is [27, 29], and PF is {[24, 26, 27], [14, 23, 26, 29]}; or if K is 8, N is 24, and $N_0$ is 32, the first constructor parameters are as follows: R is shortening, P is [4, 8, 12, 16, 20, 24, 28, 32], F is [1, 2, 3, 4, 5, 6, 7, 8, 9, 10, 11, 12, 13, 16, 17, 18, 19, 20, 21, 24, 25, 28, 32], I is [14, 15, 22, 23, 26, 27, 30, 31], PC is [29], and PF is {[14, 15, 22, 23, 26, 27, 29]}; or if K is 9, N is 24, and $N_0$ is 32, the first constructor parameters are as follows: R is shortening, P is [4, 8, 12, 16, 20, 24, 28, 32], F is [1, 2, 3, 4, 5, 6, 7, 8, 9, 10, 11, 12, 13, 16, 17, 18, 19, 20, 21, 24, 25, 28, 32], I is [14, 15, 22, 23, 26, 27, 29, 30, 31], PC is an empty set, and PF is an empty set; or if K is 10, N is 24, and $N_0$ is 32, the first constructor parameters are as follows: R is shortening, P is [4, 8, 12, 16, 20, 24, 28, 32], F is [1, 2, 3, 4, 5, 6, 7, 8, 9, 12, 16, 17, 20, 24, 28, 32], I is [6, 14, 15, 22, 23, 26, 27, 29, 30, 31], PC is [10, 11, 13, 18, 19, 21, 25], and PF is {[6, 10], [6, 11], [6, 13], [6, 18], [6, 19], [6, 21], [6, 25]}; or if K is 11, N is 24, and $N_0$ is 32, the first constructor parameters are as follows: R is shortening, P is [4, 8, 12, 16, 20, 24, 28, 32], F is [1, 2, 3, 4, 5, 8, 9, 12, 16, 17, 20, 24, 28, 32], I is [6, 7, 14, 15, 22, 23, 26, 27, 29, 30, 31], PC is [10, 11, 13, 18, 19, 21, 25], and PF is {[7, 10], [6, 7, 11], [6, 7, 13], [6, 7, 18], [6, 7, 19], [6, 7, 21], [6, 7, 25]}; or if K is 5, N is 20, and $N_0$ is 32, the first constructor parameters are as follows: R is shortening, P is [4, 6, 8, 12, 14, 16, 20, 22, 24, 28, 32], F is [1, 2, 3, 4, 5, 6, 7, 8, 9, 10, 11, 12, 13, 14, 16, 17, 19, 20, 21, 22, 24, 25, 28, 30, 32], I is [15, 23, 27, 29, 31], PC is [18, 26], and PF is {[15, 18], [23, 26]}; or if K is 6, N is 20, and $N_0$ is 32, the first constructor parameters are as follows: R is shortening, P is [4, 6, 8, 12, 14, 16, 20, 22, 24, 28, 32], F is [1, 2, 3, 4, 5, 6, 7, 8, 9, 10, 11, 12, 13, 14, 16, 17, 19, 20, 21, 22, 24, 25, 28, 30, 32], I is [15, 23, 26, 27, 29, 31], PC is [18], and PF is {[15, 18]}; or if K is 7, N is 20, and $N_0$ is 32, the first constructor parameters are as follows: R is shortening, P is [4, 6, 8, 12, 14, 16, 20, 22, 24, 28, 32], F is [1, 2, 3, 4, 5, 6, 7, 8, 9, 12, 14, 16, 17, 18, 19, 20, 22, 24, 25, 28, 30, 32], I is [10, 15, 23, 26, 27, 29, 31], PC is [11, 13, 21], and PF is {[10, 11], [10, 13], [10, 21]}; or if K is 8, N is 20, and $N_0$ is 32, the first constructor parameters are as follows: R is shortening, P is [4, 6, 8, 12, 14, 16, 20, 22, 24, 28, 32], F is [1, 2, 3, 4, 5, 6, 7, 8, 9, 11, 12, 14, 16, 17, 20, 22, 24, 28, 30, 32], I is [10, 13, 15, 23, 26, 27, 29, 31], PC is [18, 19, 21, 25], and PF is {[13, 18], [10, 19], [10, 13, 21], [10, 25]}; or if K is 9, N is 20, and $N_0$ is 32, the first constructor parameters are as follows: R is shortening, P is [4, 6, 8, 12, 14, 16, 20, 22, 24, 28, 30, 32], F is [1, 2, 3, 4, 5, 6, 7, 8, 9, 12, 14, 16, 17, 20, 22, 24, 25, 28, 30, 32], I is [10, 11, 13, 15, 23, 26, 27, 29, 31], PC is [18, 19, 21], and PF is {[11, 18], [11, 13, 19], [10, 21]} or {[11, 18], [13, 19], [10, 21]}; or if K is 10, N is 20, and $N_0$ is 32, the first constructor parameters are as follows: R is shortening, P is [4, 6, 8, 12, 14, 16, 20, 22, 24, 28, 30, 32], F is [1, 2, 3, 4, 5, 6, 8, 9, 12, 14, 16, 17, 20, 22, 24, 28, 30, 32], I is [7, 10, 11, 13, 15, 23, 26, 27, 29, 31], PC is [18, 19, 21, 25], and PF is {[7, 11, 18], [11, 13, 19], [10, 21], [7, 25]} or {[7, 11, 18], [11, 13, 19], [10, 21], [25]}; or if K is 11, N is 20, and $N_0$ is 32, the first constructor parameters are as follows: R is shortening, P is [4, 6, 8, 12, 14, 16, 20, 22, 24, 28, 32], F is [1, 2, 3, 4, 5, 6, 7, 8, 9, 12, 14, 16, 17, 20, 22, 24, 28, 30, 32], I is [10, 11, 13, 15, 18, 23, 26, 27, 29, 31], PC is [19, 21, 25], and PF is {[10, 13, 19], [7, 10, 11, 13, 21], [7, 10, 11, 13, 25]}; or if K is 12, N is 20, and No is 32, the first constructor parameters are as follows: R is shortening, P is [4, 6, 8, 12, 14, 16, 20, 22, 24, 28, 30, 32], F is [1, 2, 3, 4, 5, 6, 8, 9, 12, 14, 16, 17, 20, 22, 24, 28, 30, 32], I is [7, 11, 13, 15, 19, 21, 23, 25, 26, 27, 29, 31], PC is [10, 18], and PF is {[7, 10], [11, 18]}; or if K is 13, N is 20, and $N_0$ is 32, the first constructor parameters are as follows: R is shortening, P is [4, 6, 8, 12, 14, 16, 20, 22, 24, 28, 30, 32], F is [1, 2, 3, 4, 5, 6, 8, 9, 12, 14, 16, 17, 20, 22, 24, 28, 30, 32], I is [7, 11, 13, 15, 18, 19, 21, 23, 25, 26, 27, 29, 31], PC is [10], and PF is {[7, 10]}; or if K is 5, N is 16, and $N_0$ is 32, the first constructor parameters are as follows: R is no rate matching, P is an empty set, F is [1, 2, 3, 4, 5, 6, 7, 9, 10, 11, 13], I is [8, 12, 14, 15, 16, 17, 18, 19, 20, 21, 22, 23, 24, 25, 26, 27, 28, 29, 30, 31, 32], PC is an empty set, and PF is an empty set; or if K is 6, N is 16, and $N_0$ is 32, the first constructor parameters are as follows: R is no rate matching, P is an empty set, F is [1, 2, 3, 4, 5, 7, 9, 10], I is [8, 12, 14, 15, 16, 17, 18, 19, 20, 21, 22, 23, 24, 25, 26, 27, 28, 29, 30, 31, 32], PC is [11, 13], and PF is {[6, 11], [6, 13]}; or if K is 7, N is 16, and $N_0$ is 32, the first constructor parameters are as follows: R is no rate matching, P is an empty set, F is [1, 2, 3, 5, 7, 9], I is [4, 6, 8, 12, 14, 15, 16, 17, 18, 19, 20, 21, 22, 23, 24, 25, 26, 27, 28, 29, 30, 31, 32], PC is [10, 11, 13], and PF is {[4, 10], [4, 6, 11], [4, 13]}; or if K is 8, N is 16, and $N_0$ is 32, the first constructor parameters are as follows: R is no rate matching, P is an empty set, F is [1, 2, 3, 5, 9], I is [4, 7, 8, 11, 12, 14, 15, 16, 17, 18, 19, 20, 21, 22, 23, 24, 25, 26, 27, 28, 29, 30, 31, 32], PC is [6, 10, 13], and PF is {[4, 6], [7, 10], [4, 7, 11, 13]}; or if K is 9, N is 16, and $N_0$ is 32, the first constructor parameters are as follows: R is no rate matching, P is an empty set, F is [1, 2, 3, 5, 9], I is [4, 6, 7, 8, 10, 12, 14, 15, 16, 17, 18, 19, 20, 21, 22, 23, 24, 25, 26, 27, 28, 29, 30, 31, 32], PC is [11, 13], and PF is {[4, 7, 10, 11], [4, 13]}; or if K is 10, N is 16, and $N_0$ is 32, the first constructor parameters are as follows: R is no rate matching, P is an empty set, F is [1, 2, 3, 5, 9], I is [4, 6, 7, 8, 10, 11, 12, 14, 15, 16, 17, 18, 19, 20, 21, 22, 23, 24, 25, 26, 27, 28, 29, 30, 31, 32], PC is [13], and PF is {[6, 10, 11, 13]}; or if K is 11, N is 16, and $N_0$ is 32, the first constructor parameters are as follows: R is no rate matching, P is an empty set, F is [1, 2, 3, 5, 9], I is [4, 6, 7, 8, 10, 11, 12, 13, 14, 15, 16, 17, 18, 19, 20, 21, 22, 23, 24, 25, 26, 27, 28, 29, 30, 31, 32], PC is an empty set, and PF is an empty set. In this way, an optimal PC-polar code can be constructed by using a PC-polar coding scheme. This proves implementability of providing a uniform coding method for ultra short codes using PC-polar codes.

According to a second aspect, a coding apparatus is provided, where the coding apparatus is provided with functions of implementing the actions of the transmit end according to any one of the first aspect or the possible implementations of the first aspect. The functions may be implemented by hardware, or may be implemented by executing corresponding software by hardware. The hardware or the software includes one or more modules corresponding to the foregoing functions.

According to a third aspect, a coding apparatus is provided, where the coding apparatus includes a transceiver, a processor, and a memory, where the processor and the memory are connected by a bus system, the processor is configured to execute code stored in the memory, and when the code is executed, the processor is caused to perform the method according to any one of the first aspect or the possible implementations of the first aspect.

According to a fourth aspect, a system chip is provided, where the system chip includes a processor and a memory, where the processor and the memory are connected by a bus system, the processor is configured to execute code stored in the memory, and when the code is executed, the processor is caused to perform the method according to any one of the first aspect or the possible implementations of the first aspect.

According to a fifth aspect, a computer-readable storage medium is provided, where an instruction is stored in the computer-readable storage medium, and when the instruction runs on a computer, the computer is caused to perform the method according to any one of the foregoing aspects.

According to a sixth aspect, another aspect of this application further provides a computer program product containing an instruction, where when the computer program product runs on a computer, the computer is caused to perform the method according to any one of the foregoing aspects.

DESCRIPTION OF EMBODIMENTS

The embodiments of this application propose use of polar codes to provide a uniform coding method for ultra short codes, to apply polar codes in application of ultra short codes. For the ultra short code, a length of an information vector (or a length of information bits) does not exceed a specified length value. The embodiments of this application are applicable to coding of control channels in 5G NR, and can be applied to all scenarios in which a length of to-be-coded information bits in 5G NR is from 1 bit to 13 bits, and can also be applied to other scenarios in which a specified length is greater than 13.

Figure 1:
FIG. 1 is a schematic diagram of a system architecture according to an embodiment of this application.

As shown in FIG. 1, a system architecture to which the embodiments of this application are applied includes a network device 101 and a terminal 102. The network device 101 may be a base station or other network devices provided with functions of a base station, and in particular, may be a terminal that functions as a base station in device-to-device (D2D) communication. The base station is an apparatus deployed in a radio access network and configured to provide the terminal 102 with a function of radio communication. The base station may include various forms of macro base stations, micro base stations, relay stations, access points, and the like. The base station may be applied to systems of different radio access technologies, for example, LTE systems or other possible communications systems such as 5G communications systems. The terminal 102 may include various handheld devices, in-vehicle devices, wearable devices, and computing devices that are provided with a radio communication function, other processing devices connected to radio modems, and various forms of user equipment (UE), mobile stations (MS), and the like.

In this application, a transmit end may be a network device or a terminal. Correspondingly, a receive end may be a terminal or a network device.

To help understanding the embodiments of this application, the following describes polar coding in detail.

Polar codes are the only coding method theoretically proven to be able to gradually achieve the channel capacity, providing excellent decoding performance in a wide range of measures (including code length, code rate, and signal-to-noise ratio). Polar coding is characterized by high performance, low complexity, and flexible rate matching schemes. Polar coding can be expressed by the following equation: $x = u \cdot F_n$, where u is a binary vector of a length n, and $F_n$ is a Kronecker transform matrix and also a coding matrix for polar codes. In the equation, $$F_n = \begin{bmatrix} 1 & 0 \\ 1 & 1 \end{bmatrix}^{\otimes n},$$

which is a product of a 2×2 matrix $$\begin{bmatrix} 1 & 0 \\ 1 & 1 \end{bmatrix}.$$

Figure 2:
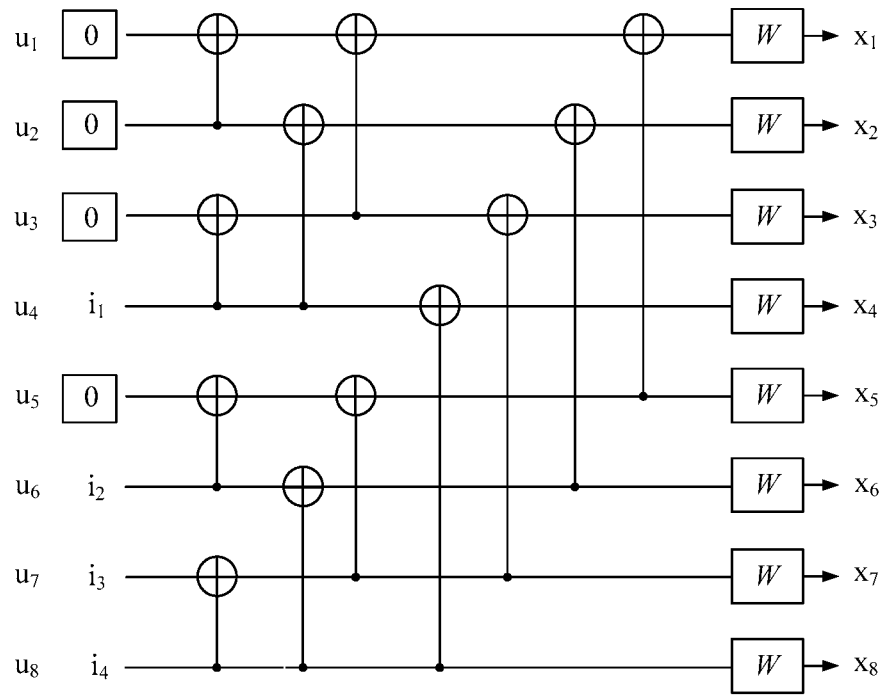
FIG. 2 is a schematic diagram of polar coding according to an embodiment of this application.

FIG. 2 shows an 8×8 coding matrix, where a vector u is denoted by $(0, 0, 0, U_4, 0, U_6, U_7, U_8)$, bits coded using the coding matrix are denoted by a vector $(X_1, X_2, X_3, X_4, X_5, X_6, X_7, X_8)$. When the bits are coded using polar coding and decoded using a successive cancellation (SC) decoding method, polarization results. To be specific, some bits of the vector u pass through a highly reliable equivalent channel with a high probability of being correctly decoded, and the rest bits pass through a lowly reliable equivalent channel with a low probability of being correctly decoded. Generally, a highly reliable channel is used to transmit information bits, while bits corresponding to a lowly reliable channel are frozen (for example, set to zero) without transmitting any data. As shown in FIG. 2, $\{u_1, u_2, u_3, u_5\}$ is set as frozen bit positions, $\{u_4, u_6, u_7, u_8\}$ is set as information bit positions, and 8 coded bits are generated after a 4-bit information vector $\{i_1, i_2, i_3, i_4\}$ is coded. After the foregoing coding, the coded bits are modulated and then pass through a noisy channel before being output.

For polar codes, dimensions of the coding matrix $F_n$ are an integer power of 2. Therefore a natural length of a polar code word generated by using the foregoing polar coding formula is also an integer power of 2. In a communications system, a code length is required to allow setting to any positive integer according to a system design. Therefore, for polar codes, rate matching needs to be performed on the coded vector, so that a code length of the polar code can be any length. The coded vector before polar code rate matching is referred to as a mother code vector. For convenience of denotation, it is assumed that a length of the mother code vector is $N_0$, and a length of the coded vector after rate matching is set to N, where $N_0$ is an integer power of 2, and N may be any positive integer.

Specifically, rate matching for polar codes includes one or a combination of any two or three of three schemes: repetition, puncturing, and shortening. In the repetition scheme, if $N_0 < N$, a mother code of a length $N_0$ is repeated until a code length N is reached. For the puncturing scheme and the shortening scheme, if $N_0 > N$, rate matching is implemented by not transmitting coded bits at mother code-specific positions.

Compared with the foregoing conventional polar code and the current cyclic redundancy check (CRC) assisted polar code, parity check polar (PC-polar) codes perform better in terms of code distance and block error rate (BLER) with a successive cancellation list (SCL) decoding algorithm. For PC-polar codes, check precoding is performed on information bits before polar coding. A check equation needs to be generated in a check precoding process, and a last element of the check equation is used to represent a check bit position, while the remaining elements are used to represent information bit positions. The check bit position provides an error correction function in a decoding process at a receive end, to improve a probability of successful decoding of the information bit positions. A value of the check bit position is a value obtained by performing an addition modulo 2 operation on values of the information bit positions in the check equation.

A large amount of simulation shows that an SCL algorithm with a finite-width list (for example, List=8) can basically achieve performance of maximum likelihood decoding, when an information vector is relatively short. The performance of maximum likelihood decoding is limited by a code distance in decoding, and is especially limited by a minimum code distance. Therefore, for short codes, optimization means increasing the minimum code distance to the longest possible.

A PC-polar code can be uniquely determined by frozen bit positions, check bit positions, a check equation, information bit positions, a rate matching scheme, and puncturing/shortening positions. These determinants may be referred to as constructor parameters of a PC-polar code. To increase a minimum code distance of a coded PC-polar code word, in the embodiments of this application, an optimal PC-polar code is constructed in accordance with a principle of maximizing the minimum code distance of the PC-polar code word.

Based on the foregoing description, the following describes the coding method provided in the embodiments of this application in detail with reference to the accompanying drawings.

In the following description, bit positions are denoted by row numbers $1, 2, \ldots,$ and $N_0$ of a generator matrix. Alternatively, the bit positions may be denoted by column numbers of the generator matrix. The row number is used as an example in the embodiments of this application. If $N_0$ represents a mother code length of a PC-polar code, K represents a length of to-be-coded information bits, N represents a length of a coded bit sequence, $N_0$, K, and N are all positive integers, R represents a rate matching scheme, P represents a processing position of the rate matching scheme, F represents a frozen bit position, I represents an information bit position, PC represents a check bit position, and PF represents a check equation, then a PC-polar code can be uniquely determined by a combination $\{F, I, PC, PF, R, P\}$ composed of the constructor parameters F, I, PC, PF, R, and P.

Methods of obtaining an optimal PC-polar code in two application scenarios are separately described based on whether rate matching is required.

1. Rate matching is not required, that is, $N = N_0$.

Figure 3:
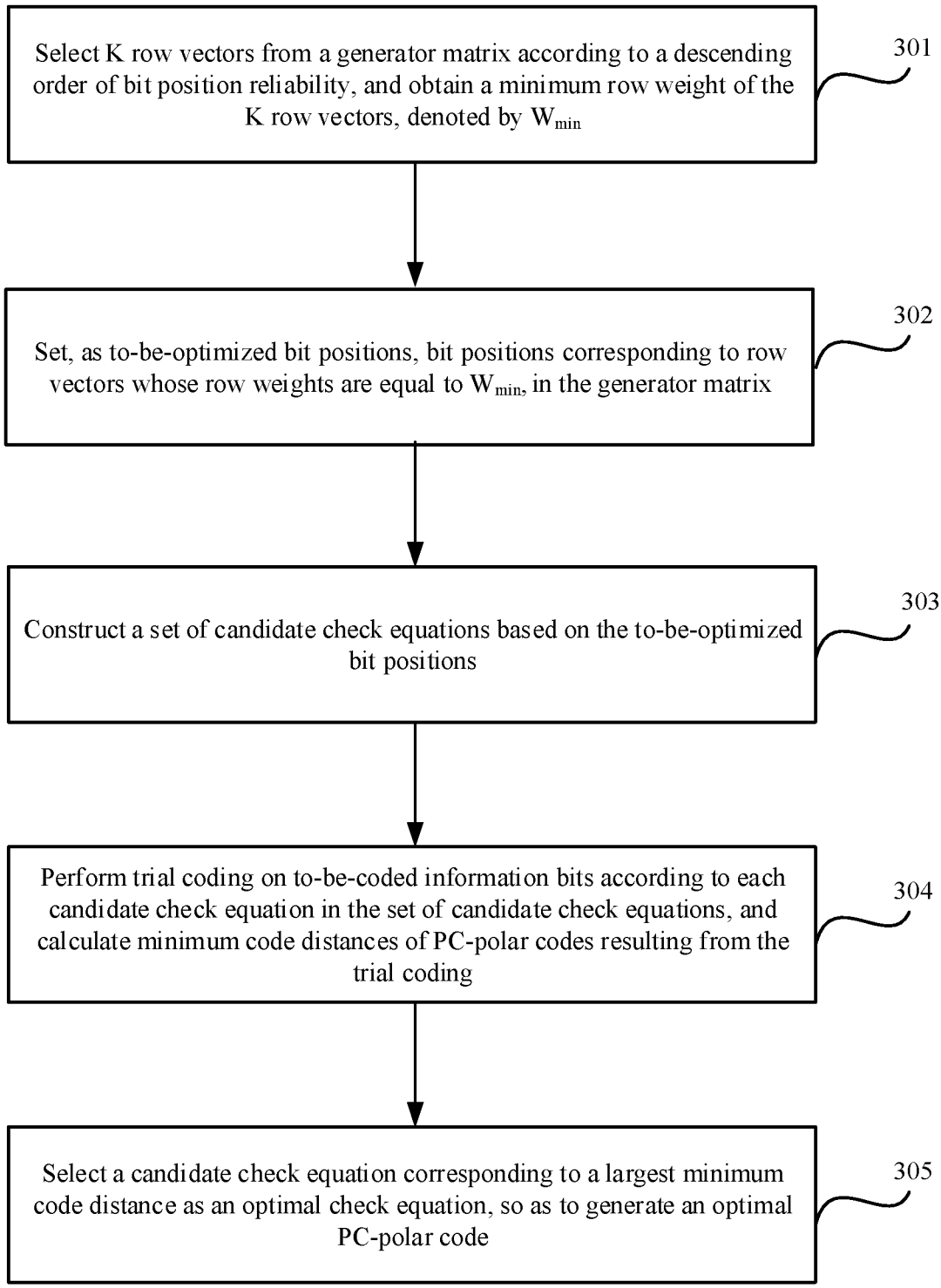
FIG. 3 is a first schematic flowchart of obtaining an optimal PC-polar code according to an embodiment of this application.

As shown in FIG. 3, when rate matching is not required, a specific procedure for obtaining an optimal PC-polar code is as follows.

Step 301: Select K row vectors from a generator matrix according to a descending order of bit position reliability, and obtain a minimum row weight, denoted by $W_{min}$, of the K row vectors.

An objective of this step is to obtain $W_{min}$. K information bit positions are first selected in a way as information bit positions are selected in the case of conventional polar codes. K bit positions may be sequentially selected as the information bit positions according to a descending order of reliability. The K information bits correspond to the K row vectors of the generator matrix. Each row vector has a Hamming weight, and the Hamming weight may also be a row weight, which is specifically a quantity of elements 1 included in the row vector. In this way, a minimum row weight $W_{min}$, of the K row vectors in the generator matrix that are corresponding to the K information bits can be found.

For example, a generator matrix G is as follows:

$$G = \begin{bmatrix} 1 & 0 & 0 & 0 \\ 1 & 1 & 0 & 0 \\ 1 & 0 & 1 & 0 \\ 1 & 1 & 1 & 1 \end{bmatrix}.$$

In the generator matrix G, row weights of a $1^{st}$ row to a $4^{th}$ row are 1, 2, 2, and 4, respectively. It is assumed that a length of to-be-coded information bits is K=2. According to how a conventional polar code is constructed, bit positions of higher reliability are selected as information bit positions. To be specific, bit positions corresponding to row vectors of the $3^{rd}$ row and the $4^{th}$ row are selected as information bit positions. As is defined, a minimum code distance $W_{min}$ of the polar code is a minimum row weight of row vectors of the $3^{rd}$ row and the $4^{th}$ row, which is 2.

Step 302: Set, as frozen bit positions, bit positions corresponding to row vectors whose row weights are less than $W_{min}$, in the generator matrix, set, as non-check-required information bit positions, bit positions corresponding to row vectors whose row weights are greater than $W_{min}$, in the generator matrix, and set, as to-be-optimized bit positions, bit positions corresponding to row vectors whose row weights are equal to $W_{min}$, in the generator matrix.

It should be noted herein that some information bits of the PC-polar code may require checking by a check bit. For convenience of description, an information bit that requires checking is referred to as a check-required information bit, and an information bit that does not require checking is referred to as a non-check-required information bit.

In this step, the frozen bit positions and the non-check-required information bit positions are selected based on Minim, and it assumed that a quantity of the non-check-required information bit positions is denoted by $M_1$. The to-be-optimized bit positions are also selected based on $W_{min}$, and it assumed that a quantity of the to-be-optimized bit positions is denoted by M, so as to obtain an optimal check equation based on the to-be-optimized bit positions.

Step 303: Construct a set of candidate check equations based on the to-be-optimized bit positions.

Specifically, the length K of the to-be-coded information bits and the quantity $M_1$ of the non-check-required information bit positions are known, and the information bits include non-check-required information bits and check-required information bits. Therefore, a quantity of the check-required information bit positions is $M_2=K-M_1$. The quantity of the to-be-optimized bit positions is M, and the to-be-optimized bit positions include check-required information bit positions and check bit positions. Therefore, a quantity of the check bit positions is $M_3=M-M_2$.

First, $M_3$ bit positions are arbitrarily selected from the to-be-optimized bit positions to serve as the check bit positions. There are a plurality of selection methods available. For example, there may be $C_M^{M_3}$ methods. This means that $C_M^{M_3}$ check bit position vectors of a length $M_3$ may be generated.

Second, for each check bit position in each check bit position vector, several check-required information bit positions whose row numbers are less than that of the check bit position are selected from the to-be-optimized bit positions. These check-required information bits and the currently selected check bit together form a candidate check equation. All check bit positions in all check bit position vectors are traversed in this way, until all possible candidate check equations are constructed to form a set of candidate check equations. Certainly, in a process of constructing the candidate check equation, it is also feasible not to select any check-required information bit position, and a candidate check equation so obtained has only one element representing a check bit position. In this case, the check bit position is equivalent to a frozen bit position.

Step 304: Perform trial coding on to-be-coded information bits according to each candidate check equation in the set of candidate check equations, and calculate minimum code distances of bit sequences resulting from the trial coding.

Specifically, when a candidate check equation is selected, constructor parameters are determined according to the foregoing steps, to obtain a combination of constructor parameters {F, I, PC, PF}, and a PC-polar code can be definitely determined. All rows whose Hamming weight is $W_{min}$ constitute a sub-matrix Gw. All information vectors making a check relationship of a currently selected candidate check equation hold are traversed, and coded with Gw. Hamming weights of all coded code words are calculated, and a minimum value $d_{min}$ of the Hamming weights is determined. This minimum value $d_{min}$ is a minimum code distance of a PC-polar code constructed by using these check equations.

Step 304: Select a candidate check equation corresponding to a largest minimum code distance as an optimal check equation, so as to generate an optimal PC-polar code.

Specifically, all eligible combinations {F, I, PC, PF} are traversed, and minimum code distances $d_{min}$ are calculated one by one, and a construction with a largest $d_{min}$, denoted by {F*, I*, PC*, PF*}, is obtained from all the combinations, where PF* is the optimal check equation.

If there are at least two PC-polar codes having a same $d_{min}$ and a largest minimum code distance, a PC-polar code having an information bit position I with highest minimum reliability (or a highest minimum polarization weight) is preferentially selected.

2. Rate matching is required, that is, N≠N0.

Figure 4:
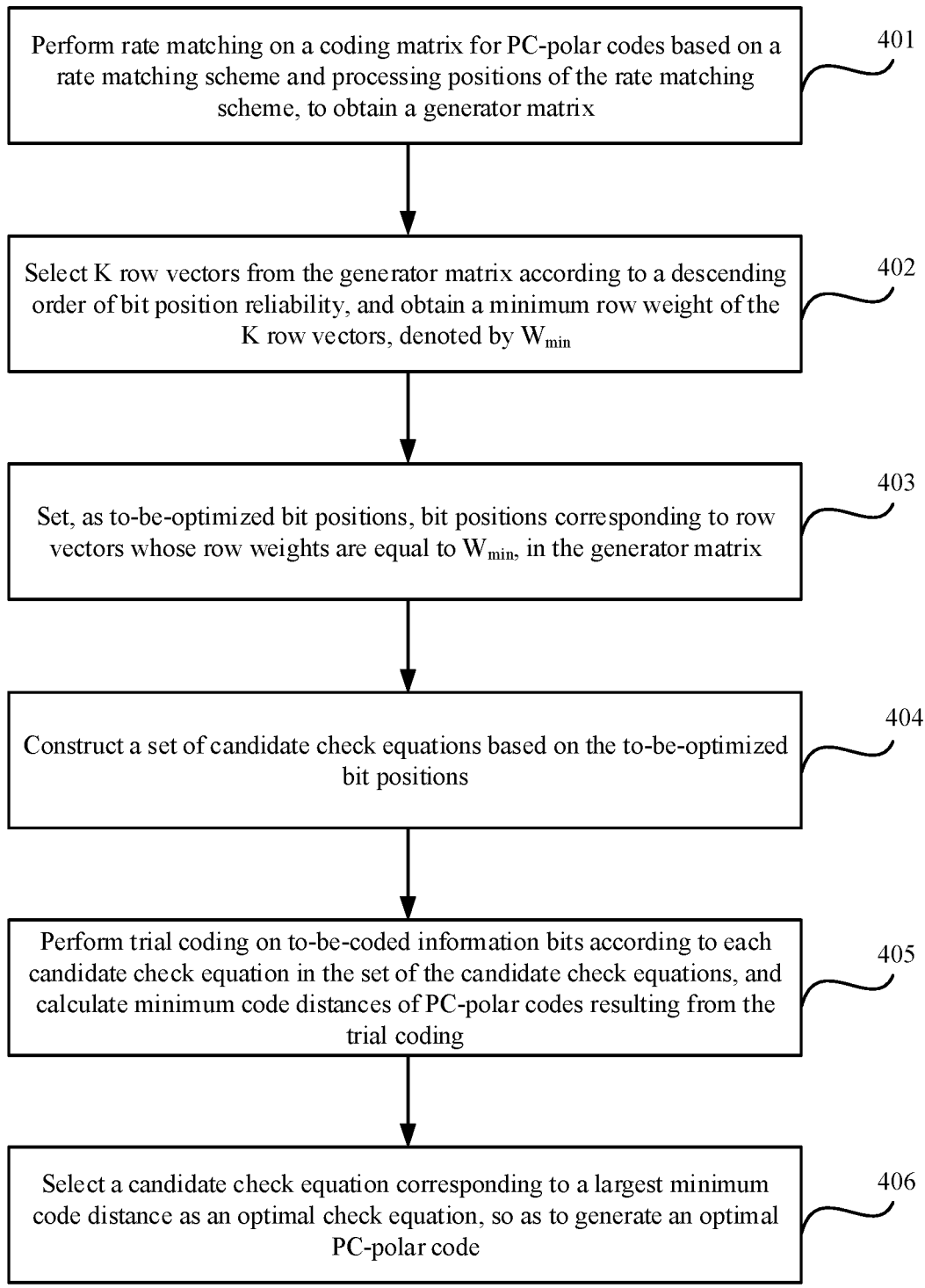
FIG. 4 is a second schematic flowchart of obtaining an optimal PC-polar code according to an embodiment of this application.

As shown in FIG. 4, when rate matching is required, a specific procedure for obtaining an optimal PC-polar code is as follows.

Step 401: Perform rate matching on a coding matrix for PC-polar codes based on a rate matching scheme and processing positions for the rate matching scheme, to obtain a generator matrix.

It is assumed that an initial coding matrix for PC-polar codes is G, and that the rate matching scheme and the processing positions, to be specific, puncturing/shortening positions, for the rate matching scheme are selected. One or a combination of rate matching schemes of repetition, puncturing, shortening is selected to generate a generator matrix G' resulting from rate matching. For example, if the repetition scheme is used, G'=[G, G, ..., G]. For another example, if the puncturing/shortening scheme is used, G' is a submatrix resulting from removal of columns corresponding to the puncturing/shortening positions from G.

Step 402 is the same as step 301. Correspondingly, steps 403 to 405 are the same as steps 302 to 304, respectively. Repetition is avoided herein.

In this way, a PC-polar code with a relatively large minimum code distance can be obtained through search. In this embodiment of this application, constructor parameters of the PC-polar code have the following characteristics:

Characteristic 1: A check equation includes a first element representing a check-required information bit position and a second element representing a check bit position, the first element corresponds to a first vector in a generator matrix for PC-polar codes, the second element corresponds to a second vector in the generator matrix, and the first vector, the second vector, and an addition modulo 2 vector of the first vector and the second vector make true that, if a first Hamming weight of the first vector is the same as a second Hamming weight of the second vector, a third Hamming weight of the addition modulo 2 vector is greater than the first Hamming weight and greater than the second Hamming weight, or if the first Hamming weight is different from the second Hamming weight, the third Hamming weight is greater than a smaller one of the first Hamming weight and the second Hamming weight.

It is assumed that a check equation is [ ..., $u_i$, ..., $u_j$], a row vector in the generator matrix corresponding to any check-required information bit is denoted by $g_i$, and a row vector in the generator matrix corresponding to a check bit is denoted by $g_j$. A Hamming weight of an addition modulo 2 vector ($g_i+g_j$) of the two vectors should meet the following condition to obtain a larger code distance:

if Hamming weights of $g_i$ and $g_j$ are the same, the Hamming weight of ($g_i+g_j$) should be greater than the Hamming weight of $g_i$ and also greater than the Hamming weight of $g_j$, or if the Hamming weights of $g_i$ and $g_j$ are different, the Hamming weight of ($g_i+g_j$) should be greater than a smaller one of the Hamming weights of $g_i$ and $g_j$.

Characteristic 2: The first element is less than the second element. The first element and the second element are both row numbers of the generator matrix. The first vector is a row vector whose row number is a value of the first element, in the generator matrix for PC-polar codes, and the second vector is a row vector whose row number is a value of the second element, in the generator matrix for PC-polar codes.

In other words, a row number, of a row vector in the generator matrix, corresponding to a check-required information bit position is less than a row number, of a row vector in the generator matrix, corresponding to a check bit position. In the check equation [ ..., $u_i$, ..., $u_j$], the check bit position has a largest row number. If a row number corresponding to an information bit position is i, and a row number corresponding to a check bit position is j, i<j must be true.

Characteristic 3: Non-check-required information bit positions make true that, according to a specified sorting manner, a first information bit position has a higher ranking than a second information bit position. The first information bit position is an information bit position having a lowest ranking among the non-check-required information bit positions, and the second information bit position is an information bit position that has a lowest ranking in a polar code obtained based on constructor parameters, of polar polar codes, including no check coding scheme. The constructor parameters of polar codes may be described as second constructor parameters while the foregoing constructor parameters of PC-polar codes may be described as first constructor parameters. The specified sorting manner includes sorting by reliability or sorting by polarization weight, and a higher ranking means higher reliability or a greater polarization weight. In the two coding schemes, a length of the to-be-coded information bits and a code length of the coded bit sequence are identical.

Characteristic 4: If $N=N_0=2^m$, and $$K = \sum_{i=0}^{r}\binom{m}{i},$$

the check equation is an empty set, where $N_0$ represents a mother code length of a PC-polar code, K represents a length of the to-be-coded information bits, N represents a length of the coded bit sequence, m, $N_0$, K, N are all positive integers, $0 \le r \le m$, and r is an integer.

Figure 5:
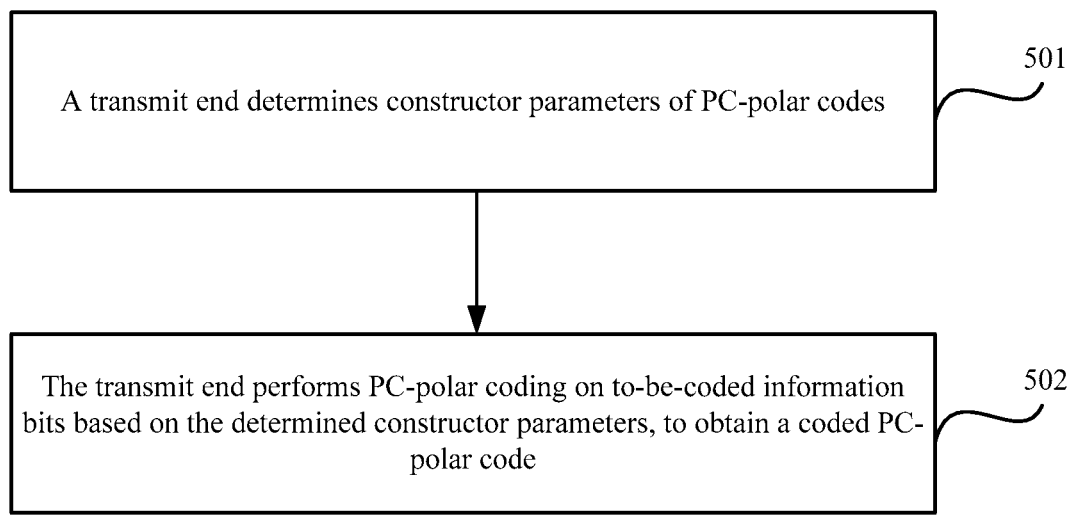
FIG. 5 is a schematic flowchart of a coding method according to an embodiment of this application.

As shown in FIG. 5, a procedure of a coding method provided in an embodiment of this application is as follows.

Step 501: A transmit end obtains to-be-coded information bits.

The transmit end may be the network device 101 or the terminal 102 in the system architecture shown in FIG. 1.

Step 502: The transmit end performs PC-polar coding on the to-be-coded information bits based on determined constructor parameters, to obtain a coded bit sequence, and sends the coded bit sequence.

The constructor parameters present at least one of the foregoing characteristics.

In this embodiment of this application, according to the foregoing methods for obtaining an optimal code in FIG. 3 and FIG. 4, an example in which an information vector length K of an ultra short code does not exceed 13 bits is used, and constructor parameters of an optimal PC-polar code are constructed for different cases of K, $N_0$, and N. It should be noted that the methods for obtaining an optimal code in FIG. 3 and FIG. 4 are applicable to most of the following constructor parameters of an optimal PC-polar code. However, the methods in FIG. 3 and FIG. 4 may not be used for some of the constructor parameters of an optimal PC-polar code, for example, when K=1, when K=2, 3, 4, 5 and $N=2^K-1$, and when K=5 and N=20.

Details are as Follows:

if K is 1 and $N_0$ is 2^ceil($\log_2 N$), where ceil is an up-rounding operation, the first constructor parameters are as follows: R is puncturing, P is any ($N_0$-N) bit positions, F is 1 to $N_0$-1, I is $N_0$, and PC and PF are both empty sets; or if K is 2, 3, 4, or 5 and $N_0$ is $2^K$, the first constructor parameters are as follows: R is shortening to $N_0$-1 followed by repeating to the length N, with a low-order bit of a code word punctured when N is a non-integer multiple of $N_0$, P is {$N_0$}, I includes all row numbers corresponding to row vectors whose row weights are $N_0/2$, F includes all row numbers except the row numbers in I, and PC and PF are both empty sets; or if K is 6, N is 32, and $N_0$ is 32, the first constructor parameters are as follows: R is no rate matching, P is an empty set, F is [1, 2, 3, 4, 5, 6, 7, 8, 9, 10, 11, 12, 13, 14, 15, 17, 18, 19, 20, 21, 22, 23, 25, 26, 27, 29], I is [16, 24, 28, 30, 31, 32], PC is an empty set, and PF is an empty set; or if K is 7, N is 32, and $N_0$ is 32, the first constructor parameters are as follows: R is no rate matching, P is an empty set, F is [1, 2, 3, 4, 5, 6, 7, 8, 9, 10, 11, 12, 13, 14, 15, 17, 18, 19, 20, 21, 22, 25, 27, 29], I is [16, 23, 24, 28, 30, 31, 32], PC is [26], and PF is [23, 26]; or if K is 8, N is 32, and $N_0$ is 32, the first constructor parameters are as follows: R is no rate matching, P is an empty set, F is [1, 2, 3, 4, 5, 6, 7, 8, 9, 10, 11, 12, 13, 15, 17, 18, 19, 20, 21, 22, 25, 29], I is [14, 16, 23, 24, 28, 30, 31, 32], PC is [26, 27], and PF is {[23, 26], [14, 27]}; or if K is 9, N is 32, and $N_0$ is 32, the first constructor parameters are as follows: R is no rate matching, P is an empty set, F is [1, 2, 3, 4, 5, 6, 7, 8, 9, 10, 11, 12, 13, 17, 18, 19, 21, 25, 29], I is [14, 15, 16, 23, 24, 28, 30, 31, 32], PC is [20, 22, 26, 27], and PF is {[15, 20], [15, 22], [15, 23, 26], [14, 27]} or {[15, 20], [22], [23, 26], [14, 27]}; or if K is 10, N is 32, and $N_0$ is 32, the first constructor parameters are as follows: R is no rate matching, P is an empty set, F is [1, 2, 3, 4, 5, 6, 7, 8, 9, 10, 11, 13, 17, 18, 19, 21, 25], I is [12, 14, 15, 16, 23, 24, 28, 30, 31, 32], PC is [20, 22, 26, 27, 29], and PF is {[15, 20], [12 22], [23, 26], [14, 27], [12, 29]} or {[15, 20], [12, 15, 22], [15, 23, 26], [14, 27], [12, 29]}; or if K is 11, N is 32, and $N_0$ is 32, the first constructor parameters are as follows: R is no rate matching, P is an empty set, F is [1, 2, 3, 4, 5, 6, 7, 8, 9, 10, 11, 13, 17, 18, 19, 21, 25], I is [12, 14, 15, 16, 23, 24, 28, 29, 30, 31, 32], PC is [20, 22, 26, 27], and PF is {[15, 20], [12, 15, 22], [15, 23, 26], [14, 27]} or {[15, 20], [12 22], [23, 26], [14, 27]}; or if K is 5, N is 24, and $N_0$ is 32, the first constructor parameters are as follows: R is puncturing, P is [1, 2, 3, 4, 5, 6, 9, 10], F is [1, 2, 3, 4, 5, 6, 7, 8, 9, 10, 11, 12, 13, 14, 15, 16, 17, 18, 19, 20, 21, 22, 23, 25, 26, 27, 29], I is [24, 28, 30, 31, 32], PC is an empty set, and PF is an empty set; or if K is 6, N is 24, and $N_0$ is 32, the first constructor parameters are as follows: R is puncturing, P is [1, 2, 3, 4, 9, 10, 17, 18], F is [1, 2, 3, 4, 5, 6, 7, 8, 9, 10, 11, 12, 13, 14, 15, 17, 18, 19, 20, 21, 22, 23, 25, 26, 27, 29], I is [16, 24, 28, 30, 31, 32], PC is an empty set, and PF is an empty set; or if K is 7, N is 24, and $N_0$ is 32, the first constructor parameters are as follows: R is puncturing, P is [1, 2, 3, 4, 5, 6, 7, 8], F is [1, 2, 3, 4, 5, 6, 7, 8, 9, 10, 11, 12, 13, 14, 15, 17, 18, 19, 20, 21, 22, 25, 27, 29], I is [16, 23, 24, 28, 30, 31, 32], PC is [26], and PF is {[23, 26]}; or if K is 8, N is 24, and $N_0$ is 32, the first constructor parameters are as follows: R is puncturing, P is [1, 2, 3, 4, 5, 6, 7, 8], F is [1, 2, 3, 4, 5, 6, 7, 8, 9, 10, 11, 12, 13, 15, 17, 18, 19, 20, 21, 22, 25, 29], I is [14, 16, 23, 24, 28, 30, 31, 32], PC is [26, 27], and PF is {[23, 26], [14, 27]}; or if K is 9, N is 24, and $N_0$ is 32, the first constructor parameters are as follows: R is puncturing, P is [1, 2, 3, 4, 5, 6, 7, 8], F is [1, 2, 3, 4, 5, 6, 7, 8, 9, 10, 11, 12, 13, 17, 18, 19, 21, 25, 29], I is [14, 15, 16, 23, 24, 28, 30, 31, 32], PC is [20, 22, 26, 27], and PF is {[15, 20], [15, 22], [15, 23, 26], [14, 27]}; or if K is 10, N is 24, and $N_0$ is 32, the first constructor parameters are as follows: R is puncturing, P is [1, 2, 3, 4, 9, 10, 17, 18], F is [1, 2, 3, 4, 5, 6, 7, 8, 9, 10, 11, 13, 17, 18, 19, 21, 25], I is [12, 14, 15, 16, 23, 24, 28, 30, 31, 32], PC is [20, 22, 26, 27, 29], and PF is {[15, 20], [12 22], [23, 26], [14, 27], [12, 29]}; or if K is 11, N is 24, and $N_0$ is 32, the first constructor parameters are as follows: R is puncturing, P is [1, 2, 3, 4, 9, 10, 17, 18], F is [1, 2, 3, 4, 5, 6, 7, 8, 9, 10, 11, 13, 17, 18, 19, 21, 25], I is [12, 14, 15, 16, 23, 24, 28, 29, 30, 31, 32], PC is [20, 22, 26, 27], and PF is {[15, 20], [12, 15, 22], [15, 23, 26], [14, 27]} or {[15, 20], [12 22], [23, 26], [14, 27]}; or if K is 5, N is 20, and $N_0$ is 32, the first constructor parameters are as follows: R is puncturing, P is [1, 3, 6, 9, 12, 16, 18, 23, 24, 27, 31, 32], F is [1, 2, 3, 4, 5, 6, 7, 8, 9, 10, 11, 12, 13, 14, 15, 16, 17, 18, 19, 20, 21, 22, 23, 25, 26, 27, 29], I is [24, 28, 30, 31, 32], PC is an empty set, and PF is an empty set; or if K is 6, N is 20, and $N_0$ is 32, the first constructor parameters are as follows: R is puncturing, P is [1, 3, 6, 9, 12, 16, 18, 23, 24, 27, 31, 32], F is [1, 2, 3, 4, 5, 6, 7, 8, 9, 10, 11, 12, 13, 14, 15, 17, 18, 19, 20, 21, 22, 23, 25, 26, 27, 29], I is [16, 24, 28, 30, 31, 32], PC is an empty set, and PF is an empty set; or if K is 7, N is 20, and $N_0$ is 32, the first constructor parameters are as follows: R is puncturing, P is [1, 2, 3, 4, 5, 6, 7, 8, 9, 10, 17, 18], F is [1, 2, 3, 4, 5, 6, 7, 8, 9, 10, 11, 12, 13, 14, 15, 17, 18, 19, 20, 21, 23, 25, 26, 29], I is [16, 22, 24, 28, 30, 31, 32], PC is [27], and PF is {[22, 27]}; or if K is 8, N is 20, and $N_0$ is 32, the first constructor parameters are as follows: R is puncturing, P is [1, 2, 3, 4, 5, 6, 7, 8, 9, 10, 17, 18], F is [1, 2, 3, 4, 5, 6, 7, 8, 9, 10, 11, 12, 13, 15, 17, 18, 19, 20, 21, 22, 25, 29], I is [14, 16, 23, 24, 28, 30, 31, 32], PC is [26, 27], and PF is {[23, 26], [14, 27]}; or if K is 9, N is 20, and $N_0$ is 32, the first constructor parameters are as follows: R is puncturing, P is [1, 2, 3, 4, 5, 6, 7, 8, 9, 10, 11, 12], F is [1, 2, 3, 4, 5, 6, 7, 8, 9, 10, 11, 12, 13, 14, 15, 17, 18, 19, 21, 25], I is [16, 22, 23, 24, 28, 29, 30, 31, 32], PC is [20, 26, 27], and PF is {[16, 20], [16, 22, 23, 26], [22, 27]}; or if K is 10, N is 20, and $N_0$ is 32, the first constructor parameters are as follows: R is puncturing, P is [1, 2, 3, 4, 5, 6, 7, 8, 9, 10, 17, 18], F is [1, 2, 3, 4, 5, 6, 8, 9, 10, 11, 12, 13, 17, 18, 19, 21, 25], I is [14, 15, 16, 23, 24, 28, 29, 30, 31, 32], PC is [20, 22, 26, 27], and PF is {[15, 20], [15, 22], [15, 23, 26], [14, 27]}; or if K is 11, N is 20, and $N_0$ is 32, the first constructor parameters are as follows: R is puncturing, P is [1, 2, 3, 4, 5, 6, 7, 8, 9, 10, 17, 18], F is [1, 2, 3, 4, 5, 6, 7, 8, 9, 10, 11, 13, 17, 18, 19, 21, 25], I is [12, 14, 15, 16, 23, 24, 28, 29, 30, 31, 32], PC is [20, 22, 26, 27], and PF is {[15, 20], [12, 15, 22], [15, 23, 26], [14, 27]} or {[15, 20], [12 22], [23, 26], [14, 27]}; or if K is 12, N is 20, and $N_0$ is 32, the first constructor parameters are as follows: R is puncturing, P is [1, 2, 3, 4, 5, 6, 7, 8, 9, 10, 17, 18], F is [1, 2, 3, 4, 5, 6, 7, 8, 9, 10, 11, 13, 17, 18, 19, 21, 25], I is [12, 14, 15, 16, 20, 24, 27, 28, 29, 30, 31, 32], PC is [22, 23, 26], and PF is {[14, 20, 22], [14, 15, 20, 23], [12, 14, 15, 20, 26]}; or if K is 13, N is 20, and $N_0$ is 32, the first constructor parameters are as follows: R is puncturing, P is [1, 2, 3, 4, 5, 6, 7, 8, 9, 10, 11, 12], F is [1, 2, 3, 4, 5, 6, 7, 8, 9, 10, 11, 12, 13, 15, 17, 21, 25], I is [14, 16, 20, 22, 23, 24, 26, 27, 28, 29, 30, 31, 32], PC is [18, 19], and PF is {[14, 18], [14, 19]}; or if K is 5, N is 24, and $N_0$ is 32, the first constructor parameters are as follows: R is shortening, P is [4, 8, 12, 16, 20, 24, 28, 32], F is [1, 2, 3, 4, 5, 6, 7, 8, 9, 10, 11, 12, 13, 16, 17, 18, 19, 20, 21, 24, 25, 28, 32], I is [14, 15, 22, 30, 31], PC is [23, 26, 27, 29], and PF is {[14, 15, 23], [14, 15, 26], [14, 22, 27], [14, 29]}; or if K is 6, N is 24, and $N_0$ is 32, the first constructor parameters are as follows: R is shortening, P is [4, 8, 12, 16, 20, 24, 28, 32], F is [1, 2, 3, 4, 5, 6, 7, 8, 9, 10, 11, 12, 13, 16, 17, 18, 19, 20, 21, 24, 25, 28, 32], I is [14, 15, 22, 23, 30, 31], PC is [26, 27, 29], and PF is {[15, 26], [22, 27], [14, 29]}; or if K is 7, N is 24, and $N_0$ is 32, the first constructor parameters are as follows: R is shortening, P is [4, 8, 12, 16, 20, 24, 28, 32], F is [1, 2, 3, 4, 5, 6, 7, 8, 9, 10, 11, 12, 13, 16, 17, 18, 19, 20, 21, 24, 25, 28, 32], I is [14, 15, 22, 23, 26, 30, 31], PC is [27, 29], and PF is {[24, 26, 27], [14, 23, 26, 29]}; or if K is 8, N is 24, and $N_0$ is 32, the first constructor parameters are as follows: R is shortening, P is [4, 8, 12, 16, 20, 24, 28, 32], F is [1, 2, 3, 4, 5, 6, 7, 8, 9, 10, 11, 12, 13, 16, 17, 18, 19, 20, 21, 24, 25, 28, 32], I is [14, 15, 22, 23, 26, 27, 30, 31], PC is [29], and PF is {[14, 15, 22, 23, 26, 27, 29]}; or if K is 9, N is 24, and $N_0$ is 32, the first constructor parameters are as follows: R is shortening, P is [4, 8, 12, 16, 20, 24, 28, 32], F is [1, 2, 3, 4, 5, 6, 7, 8, 9, 10, 11, 12, 13, 16, 17, 18, 19, 20, 21, 24, 25, 28, 32], I is [14, 15, 22, 23, 26, 27, 29, 30, 31], PC is an empty set, and PF is an empty set; or if K is 10, N is 24, and $N_0$ is 32, the first constructor parameters are as follows: R is shortening, P is [4, 8, 12, 16, 20, 24, 28, 32], F is [1, 2, 3, 4, 5, 6, 7, 8, 9, 12, 16, 17, 20, 24, 28, 32], I is [6, 14, 15, 22, 23, 26, 27, 29, 30, 31], PC is [10, 11, 13, 18, 19, 21, 25], and PF is {[6, 10], [6, 11], [6, 13], [6, 18], [6, 19], [6, 21], [6, 25]}; or if K is 11, N is 24, and $N_0$ is 32, the first constructor parameters are as follows: R is shortening, P is [4, 8, 12, 16, 20, 24, 28, 32], F is [1, 2, 3, 4, 5, 8, 9, 12, 16, 17, 20, 24, 28, 32], I is [6, 7, 14, 15, 22, 23, 26, 27, 29, 30, 31], PC is [10, 11, 13, 18, 19, 21, 25], and PF is {[7, 10], [6, 7, 11], [6, 7, 13], [6, 7, 18], [6, 7, 19], [6, 7, 21], [6, 7, 25]}; or if K is 5, N is 20, and $N_0$ is 32, the first constructor parameters are as follows: R is shortening, P is [4, 6, 8, 12, 14, 16, 20, 22, 24, 28, 32], F is [1, 2, 3, 4, 5, 6, 7, 8, 9, 10, 11, 12, 13, 14, 16, 17, 19, 20, 21, 22, 24, 25, 28, 30, 32], I is [15, 23, 27, 29, 31], PC is [18, 26], and PF is {[15, 18], [23, 26]}; or if K is 6, N is 20, and $N_0$ is 32, the first constructor parameters are as follows: R is shortening, P is [4, 6, 8, 12, 14, 16, 20, 22, 24, 28, 32], F is [1, 2, 3, 4, 5, 6, 7, 8, 9, 10, 11, 12, 13, 14, 16, 17, 19, 20, 21, 22, 24, 25, 28, 30, 32], I is [15, 23, 26, 27, 29, 31], PC is [18], and PF is {[15, 18]}; or if K is 7, N is 20, and $N_0$ is 32, the first constructor parameters are as follows: R is shortening, P is [4, 6, 8, 12, 14, 16, 20, 22, 24, 28, 32], F is [1, 2, 3, 4, 5, 6, 7, 8, 9, 12, 14, 16, 17, 18, 19, 20, 22, 24, 25, 28, 30, 32], I is [10, 15, 23, 26, 27, 29, 31], PC is [11, 13, 21], and PF is {[10, 11], [10, 13], [10, 21]}; or if K is 8, N is 20, and $N_0$ is 32, the first constructor parameters are as follows: R is shortening, P is [4, 6, 8, 12, 14, 16, 20, 22, 24, 28, 32], F is [1, 2, 3, 4, 5, 6, 7, 8, 9, 11, 12, 14, 16, 17, 20, 22, 24, 28, 30, 32], I is [10, 13, 15, 23, 26, 27, 29, 31], PC is [18, 19, 21, 25], and PF is {[13, 18], [10, 19], [10, 13, 21], [10, 25]}; or if K is 9, N is 20, and $N_0$ is 32, the first constructor parameters are as follows: R is shortening, P is [4, 6, 8, 12, 14, 16, 20, 22, 24, 28, 30, 32], F is [1, 2, 3, 4, 5, 6, 7, 8, 9, 12, 14, 16, 17, 20, 22, 24, 25, 28, 30, 32], I is [10, 11, 13, 15, 23, 26, 27, 29, 31], PC is [18, 19, 21], and PF is {[11, 18], [11, 13, 19], [10, 21]} or {[11, 18], [13, 19], [10, 21]}; or if K is 10, N is 20, and $N_0$ is 32, the first constructor parameters are as follows: R is shortening, P is [4, 6, 8, 12, 14, 16, 20, 22, 24, 28, 30, 32], F is [1, 2, 3, 4, 5, 6, 8, 9, 12, 14, 16, 17, 20, 22, 24, 28, 30, 32], I is [7, 10, 11, 13, 15, 23, 26, 27, 29, 31], PC is [18, 19, 21, 25], and PF is {[7, 11, 18], [11, 13, 19], [10, 21], [7, 25]} or {[7, 11, 18], [11, 13, 19], [10, 21], [25]}; or if K is 11, N is 20, and $N_0$ is 32, the first constructor parameters are as follows: R is shortening, P is [4, 6, 8, 12, 14, 16, 20, 22, 24, 28, 32], F is [1, 2, 3, 4, 5, 6, 7, 8, 9, 12, 14, 16, 17, 20, 22, 24, 28, 30, 32], I is [10, 11, 13, 15, 18, 23, 26, 27, 29, 31], PC is [19, 21, 25], and PF is {[10, 13, 19], [7, 10, 11, 13, 21], [7, 10, 11, 13, 25]}; or if K is 12, N is 20, and $N_0$ is 32, the first constructor parameters are as follows: R is shortening, P is [4, 6, 8, 12, 14, 16, 20, 22, 24, 28, 30, 32], F is [1, 2, 3, 4, 5, 6, 8, 9, 12, 14, 16, 17, 20, 22, 24, 28, 30, 32], I is [7, 11, 13, 15, 19, 21, 23, 25, 26, 27, 29, 31], PC is [10, 18], and PF is {[7, 10], [11, 18]}; or R is shortening, P is [4, 6, 8, 12, 14, 16, 20, 22, 24, 28, 30, 32], F is [1 2 3 4 5 6 8 9 12 14 16 18 20 22 24 28 30 32], I is [7 10 11 13 15 19 21 23 26 27 29 31], PC is [18 25], and PF is {[13 18][7 25]}; or if K is 13, N is 20, and $N_0$ is 32, the first constructor parameters are as follows: R is shortening, P is [4, 6, 8, 12, 14, 16, 20, 22, 24, 28, 30, 32], F is [1, 2, 3, 4, 5, 6, 8, 9, 12, 14, 16, 17, 20, 22, 24, 28, 30, 32], I is [7, 11, 13, 15, 18, 19, 21, 23, 25, 26, 27, 29, 31], PC is [10], and PF is {[7, 10]}; or R is shortening, P is [4, 6, 8, 12, 14, 16, 20, 22, 24, 28, 30, 32], F is [1, 2, 3, 4, 5, 6, 8, 9, 12, 14, 16, 17, 20, 22, 24, 28, 30, 32], I is [7 10 11 13 15 18 19 21 23 26 27 29 31], PC is [25], and PF is {[11 13 18 19 25]}; or if K is 5, N is 16, and $N_0$ is 32, the first constructor parameters are as follows: R is no rate matching, P is an empty set, F is [1, 2, 3, 4, 5, 6, 7, 9, 10, 11, 13], I is [8, 12, 14, 15, 16, 17, 18, 19, 20, 21, 22, 23, 24, 25, 26, 27, 28, 29, 30, 31, 32], PC is an empty set, and PF is an empty set; or if K is 6, N is 16, and $N_0$ is 32, the first constructor parameters are as follows: R is no rate matching, P is an empty set, F is [1, 2, 3, 4, 5, 7, 9, 10], I is [8, 12, 14, 15, 16, 17, 18, 19, 20, 21, 22, 23, 24, 25, 26, 27, 28, 29, 30, 31, 32], PC is [11, 13], and PF is {[6, 11], [6, 13]}; or if K is 7, N is 16, and $N_0$ is 32, the first constructor parameters are as follows: R is no rate matching, P is an empty set, F is [1, 2, 3, 5, 7, 9], I is [4, 6, 8, 12, 14, 15, 16, 17, 18, 19, 20, 21, 22, 23, 24, 25, 26, 27, 28, 29, 30, 31, 32], PC is [10, 11, 13], and PF is {[4, 10], [4, 6, 11], [4, 13]}; or if K is 8, N is 16, and $N_0$ is 32, the first constructor parameters are as follows: R is no rate matching, P is an empty set, F is [1, 2, 3, 5, 9], I is [4, 7, 8, 11, 12, 14, 15, 16, 17, 18, 19, 20, 21, 22, 23, 24, 25, 26, 27, 28, 29, 30, 31, 32], PC is [6, 10, 13], and PF is {[4, 6], [7, 10], [4, 7, 11, 13]}; or if K is 9, N is 16, and $N_0$ is 32, the first constructor parameters are as follows: R is no rate matching, P is an empty set, F is [1, 2, 3, 5, 9], I is [4, 6, 7, 8, 10, 12, 14, 15, 16, 17, 18, 19, 20, 21, 22, 23, 24, 25, 26, 27, 28, 29, 30, 31, 32], PC is [11, 13], and PF is {[4, 7, 10, 11], [4, 13]}; or if K is 10, N is 16, and $N_0$ is 32, the first constructor parameters are as follows: R is no rate matching, P is an empty set, F is [1, 2, 3, 5, 9], I is [4, 6, 7, 8, 10, 11, 12, 14, 15, 16, 17, 18, 19, 20, 21, 22, 23, 24, 25, 26, 27, 28, 29, 30, 31, 32], PC is [13], and PF is {[6, 10, 11, 13]}; or if K is 11, N is 16, and $N_0$ is 32, the first constructor parameters are as follows: R is no rate matching, P is an empty set, F is [1, 2, 3, 5, 9], I is [4, 6, 7, 8, 10, 11, 12, 13, 14, 15, 16, 17, 18, 19, 20, 21, 22, 23, 24, 25, 26, 27, 28, 29, 30, 31, 32], PC is an empty set, and PF is an empty set.

The following describes how an optimal PC-polar code is constructed by using tables. K represents the length of the to-be-coded information bits, N represents the length of the coded bit sequence, R represents the rate matching scheme, P represents the processing positions of the rate matching scheme, F represents the frozen bit positions, and PF represents the check equation. For example, in PF={[A], [B, C], [D, E, F]}, numbers in the square brackets correspond to bit positions, which are row numbers of the generator matrix, and it is true that A=0, (B+C)=0, and (D+E+F)=0. The "+" operations are all binary operations, R=Pun represents puncturing, R=Sho represents shortening, and F/PF represents frozen bits and the check equation. $N_0$ is 32, and bit positions or sub-channels are numbered from 0 to ($N_0$-1). It should be noted that to implement code matching, the bit position or sub-channel numbers may be denoted in two ways, with sequence numbers from 1 to $N_0$ or from 0 to ($N_0$-1). Whichever numbering manner is used, the coding method shall fall within the protection scope of the embodiments of this application. For example, in this application, numbers in Table 1 to Table 4 are from 0 to ($N_0$-1), but from 1 to No elsewhere.

Table 1 shows constructions of optimal PC-polar codes when R is puncturing, where bit positions or sub-channels are numbered from 0.

TABLE 1

| N | K | R: {P} [F/PF] |
|---|---|---|
| 24 | 5 | Pun: {0, 1, 2, 3, 4, 5, 8, 9} [0], [1], [2], [3], [4], [5], [6], [7], [8], [9], [10], [11], [12], [13], [14], [15], [16], [17], [18], [19], [20], [21], [22], [24], [25], [26], [28] |
|  | 6 | Pun: {0, 1, 2, 3, 8, 9, 16, 17} [0], [1], [2], [3], [4], [5], [6], [7], [8], [9], [10], [11], [12], [13], [14], [16], [17], [18], [19], [20], [21], [22], [24], [25], [26], [28] |
|  | 7 | Pun: {0, 1, 2, 3, 4, 5, 6, 7} [0], [1], [2], [3], [4], [5], [6], [7], [8], [9], [10], [11], [12], [13], [14], [16], [17], [18], [19], [20], [21], [24], [22, 25], [26], [28] |
|  | 8 | Pun: {0, 1, 2, 3, 4, 5, 6, 7} [0], [1], [2], [3], [4], [5], [6], [7], [8], [9], [10], [11], [12], [14], [16], [17], [18], [19], [20], [21], [24], [22, 25], [13, 26], [28] |
|  | 9 | Pun: {0, 1, 2, 3, 4, 5, 6, 7} [0], [1], [2], [3], [4], [5], [6], [7], [8], [9], [10], [11], [12], [16], [17], [18], [14, 19], [20], [14, 21], [24], [14, 22, 25], [13, 26], [28] |
|  | 10 | Pun: {0, 1, 2, 3, 8, 9, 16, 17} [0], [1], [2], [3], [4], [5], [6], [7], [8], [9], [10], [12], [16], [17], [18], [14, 19], [20], [11, 21], [24], [22, 25], [13, 26], [11, 28] |
|  | 11 | Pun: {0, 1, 2, 3, 8, 9, 16, 17} [0], [1], [2], [3], [4], [5], [6], [7], [8], [9], [10], [12], [16], [17], [18], [14, 19], [20], [11, 14, 21], [24], [14, 22, 25], [13, 26] |
| 20 | 5 | Pun: {0, 2, 5, 8, 11, 15, 17, 22, 23, 26, 30, 31} [0], [1], [2], [3], [4], [5], [6], [7], [8], [9], [10], [11], [12], [13], [14], [15], [16], [17], [18], [19], [20], [21], [22], [24], [25], [26], [28] |
|  | 6 | Pun: {0, 2, 5, 8, 11, 15, 17, 22, 23, 26, 30, 31} [0], [1], [2], [3], [4], [5], [6], [7], [8], [9], [10], [11], [12], [13], [14], [16], [17], [18], [19], [20], [21], [22], [24], [25], [26], [28] |
|  | 7 | Pun: {0, 1, 2, 3, 4, 5, 6, 7, 8, 9, 16, 17} [0], [1], [2], [3], [4], [5], [6], [7], [8], [9], [10], [11], [12], [13], [14], [16], [17], [18], [19], [20], [22], [24], [25], [21, 26], [28] |
|  | 8 | Pun: {0, 1, 2, 3, 4, 5, 6, 7, 8, 9, 16, 17} [0], [1], [2], [3], [4], [5], [6], [7], [8], [9], [10], [11], [12], [14], [16], [17], [18], [19], [20], [21], [24], [22, 25], [13, 26], [28] |
|  | 9 | Pun: {0, 1, 2, 3, 4, 5, 6, 7, 8, 9, 10, 11} [0], [1], [2], [3], [4], [5], [6], [7], [8], [9], [10], [11], [12], [13], [14], [16], [17], [18], [15, 19], [20], [24], [15, 21, 22, 25], [21, 26] |
|  | 10 | Pun: {0, 1, 2, 3, 4, 5, 6, 7, 8, 9, 16, 17} [0], [1], [2], [3], [4], [5], [6], [7], [8], [9], [10], [11], [12], [16], [17], [18], [14, 19], [20], [14, 21], [24], [14, 22, 25], [13, 26] |
|  | 11 | Pun: {0, 1, 2, 3, 4, 5, 6, 7, 8, 9, 16, 17} [0], [1], [2], [3], [4], [5], [6], [7], [8], [9], [10], [12], [16], [17], [18], [14, 19], [20], [11, 14, 21], [24], [14, 22, 25], [13, 26] |
|  | 12 | Pun: {0, 1, 2, 3, 4, 5, 6, 7, 8, 9, 16, 17} [0], [1], [2], [3], [4], [5], [6], [7], [8], [9], [10], [12], [16], [17], [18], [20], [13, 19, 21], [13, 14, 19, 22], [24], [11, 13, 14, 19, 25] |
|  | 13 | Pun: {0, 1, 2, 3, 4, 5, 6, 7, 8, 9, 10, 11} [0], [1], [2], [3], [4], [5], [6], [7], [8], [9], [10], [11], [12], [14], [16], [13, 17], [13, 18], [20], [24] |

For example, N=24, K=5, puncturing positions are {0, 1, 2, 3, 4, 5, 8, 9}, and the check equation is [0], [1], [2], [3], [4], [5], [6], [7], [8], [9], [10], [11], [12], [13], [14], [15], [16], [17], [18], [19], [20], [21], [22], [24], [25], [26], [28], indicating that frozen bit positions are {0, 1, 2, 3, 4, 5, 6, 7, 8, 9, 10, 11, 12, 13, 14, 15, 16, 17, 18, 19, 20, 21, 22, 24, 25, 26, 28}.

Figure 6:
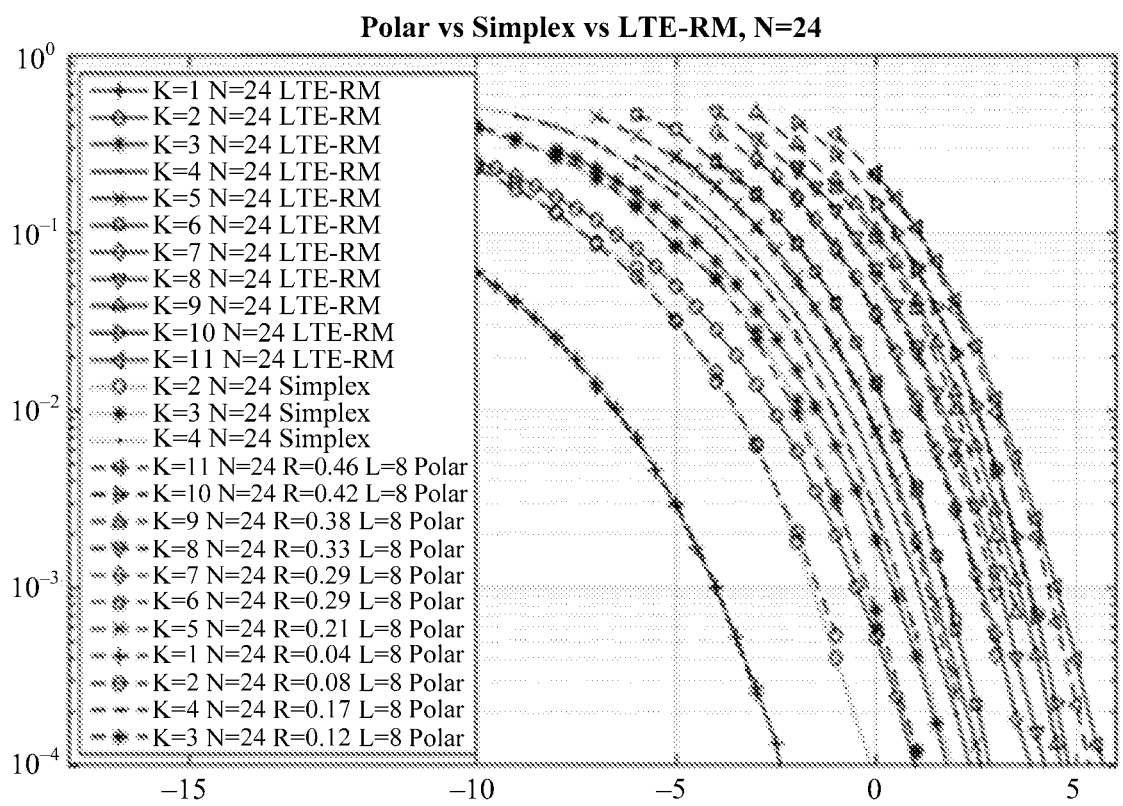
FIG. 6 is a first schematic diagram of performance simulation for constructions of optimal PC-polar codes according to an embodiment of this application.

FIG. 6 shows performance simulation, by an application-specific integrated circuit (ASIC), of corresponding constructions of optimal PC-polar codes when N=24 in Table 1. It can be seen from FIG. 6 that when a decoder has a list width of 8, performance of polar codes is better than or even to that of LTE-RM and simplex codes.

Figure 7:
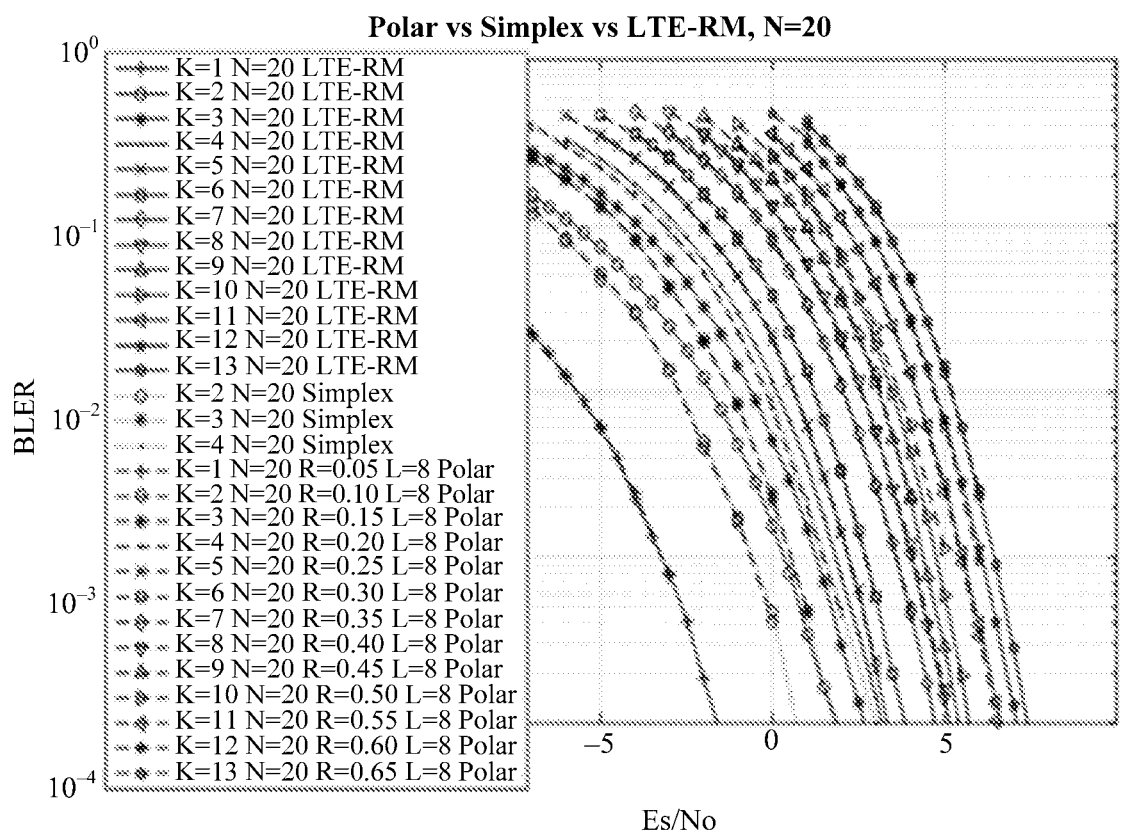
FIG. 7 is a second schematic diagram of performance simulation for constructions of optimal PC-polar codes according to an embodiment of this application.

FIG. 7 shows performance simulation, by an ASIC, of corresponding constructions of optimal PC-polar codes when N=20 in Table 1. It can be seen from FIG. 7 that when a decoder has a list width of 8, performance of polar codes is better than or even to that of LTE-RM and simplex codes.

Table 2.1 shows constructions of optimal PC-polar codes when R is shortening from back to forth with sub-channel numbers bit-reversed, where bit positions or sub-channels are numbered from 0.

TABLE 2.1

| N | K | R: {P} <br> [F/PF] |
|---|---|---|
| 24 | 5 | Sho: {3, 7, 11, 15, 19, 23, 27, 31} <br> [0], [1], [2], [3], [4], [5], [6], [7], [8], [9], [10], [11], [12], [15], [16], [17], [18], [19], [20], [13, 14, 22], [23], [24], [13, 14, 25], [13, 21, 26], [27], [13, 28], [31] |
|  | 6 | Sho: {3, 7, 11, 15, 19, 23, 27, 31} <br> [0], [1], [2], [3], [4], [5], [6], [7], [8], [9], [10], [11], [12], [15], [16], [17], [18], [19], [20], [23], [24], [14, 25], [21, 26], [27], [13, 28], [31] |
|  | 7 | Sho: {3, 7, 11, 15, 19, 23, 27, 31} <br> [0], [1], [2], [3], [4], [5], [6], [7], [8], [9], [10], [11], [12], [15], [16], [17], [18], [19], [20], [23], [24], [22, 25, 26], [27], [13, 22, 25, 28], [31] |
|  | 8 | Sho: {3, 7, 11, 15, 19, 23, 27, 31} <br> [0], [1], [2], [3], [4], [5], [6], [7], [8], [9], [10], [11], [12], [15], [16], [17], [18], [19], [20], [23], [24], [27], [13, 14, 21, 22, 25, 26, 28], [31] |
|  | 9 | Sho: {3, 7, 11, 15, 19, 23, 27, 31} <br> [0], [1], [2], [3], [4], [5], [6], [7], [8], [9], [10], [11], [12], [15], [16], [17], [18], [19], [20], [23], [24], [27], [31] |
|  | 10 | Sho: {3, 7, 11, 15, 19, 23, 27, 31} <br> [0], [1], [2], [3], [4], [6], [7], [8], [5, 9], [5, 10], [11], [5, 12], [15], [16], [5, 17], [5, 18], [19], [5, 20], [23], [5, 24], [27], [31] |
|  | 11 | Sho: {3, 7, 11, 15, 19, 23, 27, 31} <br> [0], [1], [2], [3], [4], [7], [8], [6, 9], [5, 6, 10], [11], [5, 6, 12], [15], [16], [5, 6, 17], [5, 6, 18], [19], [5, 6, 20], [23], [5, 6, 24], [27], [31] |
| 20 | 5 | Sho: {3, 5, 7, 11, 13, 15, 19, 21, 23, 27, 29, 31} <br> [0], [1], [2], [3], [4], [5], [6], [7], [8], [9], [10], [11], [12], [13], [15], [16], [14, 17], [18], [19], [20], [21], [23], [24], [22, 25], [27], [29], [31] |
|  | 6 | Sho: {3, 5, 7, 11, 13, 15, 19, 21, 23, 27, 29, 31} <br> [0], [1], [2], [3], [4], [5], [6], [7], [8], [9], [10], [11], [12], [13], [15], [16], [14, 17], [18], [19], [20], [21], [23], [24], [27], [29], [31] |
|  | 7 | Sho: {3, 5, 7, 11, 13, 15, 19, 21, 23, 27, 29, 31} <br> [0], [1], [2], [3], [4], [5], [6], [7], [8], [9, 10], [11], [9, 12], [13], [15], [16], [17], [18], [19], [9, 20], [21], [23], [24], [27], [29], [31] |
|  | 8 | Sho: {3, 5, 7, 11, 13, 15, 19, 21, 23, 27, 29, 31} <br> [0], [1], [2], [3], [4], [5], [6], [7], [8], [10], [11], [13], [15], [16], [12, 17], [9, 18], [19], [9, 12, 20], [21], [23], [9, 24], [27], [29], [31] |
|  | 9 | Sho: {3, 5, 7, 11, 13, 15, 19, 21, 23, 27, 29, 31} <br> [0], [1], [2], [3], [4], [5], [6], [7], [8], [11], [13], [15], [16], [10, 17], [10, 12, 18], [19], [9, 20], [21], [23], [24], [27], [29], [31] |
|  | 10 | Sho: {3, 5, 7, 11, 13, 15, 19, 21, 23, 27, 29, 31} <br> [0], [1], [2], [3], [4], [5], [7], [8], [11], [13], [15], [16], [6, 10, 17], [10, 12, 18], [19], [9, 20], [21], [23], [6, 24], [27], [29], [31] |
|  | 11 | Sho: {3, 5, 7, 11, 13, 15, 19, 21, 23, 27, 29, 31} <br> [0], [1], [2], [3], [4], [5], [7], [8], [11], [13], [15], [16], [9, 12, 18], [19], [6, 9, 10, 12, 20], [21], [23], [6, 9, 10, 12, 24], [27], [29], [31] |
|  | 12 | Sho: {3, 5, 7, 11, 13, 15, 19, 21, 23, 27, 29, 31} <br> [0], [1], [2], [3], [4], [5], [7], [8], [11], [13], [15], [16], [12, 17], [19], [21], [23], [6, 24], [27], [29], [31] |
|  | 13 | Sho: {3, 5, 7, 11, 13, 15, 19, 21, 23, 27, 29, 31} <br> [0], [1], [2], [3], [4], [5], [7], [8], [11], [13], [15], [16], [19], [21], [23], [10, 12, 17, 18, 24], [27], [29], [31] |

Table 2.2 shows constructions of optimal PC-polar codes when R is shortening from back to forth with sub-channel numbers in a natural order, where bit positions or sub-channels are numbered from 0.

TABLE 2.2

| N | K | R: {P}<br>[F/PF] |
|---|---|---|
| 20 | 1 | Sho: {20, 21, 22, 23, 24, 25, 26, 27, 28, 29, 30, 31}<br>[0], [1], [2], [4], [5], [6], [7], [8], [9], [10], [11], [12], [13], [14], [3, 15], [16], [17], [18], [3, 19], [20], [21], [22], [23], [24], [25], [26], [27], [28], [29], [30], [31] |
| | 2 | Sho: {20, 21, 22, 23, 24, 25, 26, 27, 28, 29, 30, 31}<br>[1], [3], [4], [5], [6], [7], [8], [9], [10], [11], [0, 12], [13], [2, 14], [0, 15], [16], [17], [18], [2, 19], [20], [21], [22], [23], [24], [25], [26], [27], [28], [29], [30], [31] |
| | 3 | Sho: {20, 21, 22, 23, 24, 25, 26, 27, 28, 29, 30, 31}<br>[1], [0, 2], [0, 4], [0, 6], [7], [8], [5, 9], [10], [0, 3, 11], [12], [0, 13], [14], [3, 15], [0, 16], [17], [18], [0, 5, 19], [20], [21], [22], [23], [24], [25], [26], [27], [28], [29], [30], [31] |
| | 4 | Sho: {20, 21, 22, 23, 24, 25, 26, 27, 28, 29, 30, 31}<br>[0], [1], [2], [3], [4], [5], [6], [8], [9], [10, 11], [7, 12], [7, 10, 14, 15], [16], [7, 13, 14, 17], [13, 18], [13, 14, 19], [20], [21], [22], [23], [24], [25], [26], [27], [28], [29], [30], [31] |
| | 5 | Sho: {20, 21, 22, 23, 24, 25, 26, 27, 28, 29, 30, 31}<br>[0, 1], [0, 2], [0, 3], [4], [5], [6], [0, 7], [0, 8], [0, 9], [10], [0, 11, 12], [11, 13, 14, 15, 16], [0, 11, 13, 17], [0, 11, 13, 14, 18], [13, 14, 15, 19], [20], [21], [22], [23], [24], [25], [26], [27], [28], [29], [30], [31] |
| | 6 | Sho: {20, 21, 22, 23, 24, 25, 26, 27, 28, 29, 30, 31}<br>[1], [0, 2], [3], [4], [5], [0, 8], [0, 6, 7, 9], [7, 10], [6, 7, 11], [12], [0, 6, 7, 13, 15], [0, 6, 13, 16], [0, 7, 17], [0, 7, 14, 18], [20], [21], [22], [23], [24], [25], [26], [27], [28], [29], [30], [31] |
| | 7 | Sho: {20, 21, 22, 23, 24, 25, 26, 27, 28, 29, 30, 31}<br>[0], [1], [2], [3], [4], [5], [6], [8], [7, 9], [7, 10, 12, 14, 16], [7, 11, 12, 13, 15, 17], [14, 18], [7, 10, 12, 15, 19], [20], [21], [22], [23], [24], [25], [26], [27], [28], [29], [30], [31] |
| | 8 | Sho: {20, 21, 22, 23, 24, 25, 26, 27, 28, 29, 30, 31}<br>[0], [3], [4], [2, 5], [1, 2, 6], [8], [1, 9], [2, 10], [12], [16], [1, 17], [2, 18], [20], [21], [22], [23], [24], [25], [26], [27], [28], [29], [30], [31] |
| | 9 | Sho: {20, 21, 22, 23, 24, 25, 26, 27, 28, 29, 30, 31}<br>[1], [2], [3], [4], [0, 5], [6, 8], [6, 7, 9], [0, 6, 7, 10, 13, 14], [7, 11, 15, 16], [0, 10, 12, 17], [0, 6, 12, 13, 18], [20], [21], [22], [23], [24], [25], [26], [27], [28], [29], [30], [31] |
| | 10 | Sho: {20, 21, 22, 23, 24, 25, 26, 27, 28, 29, 30, 31}<br>[0], [1, 2], [1, 3], [4], [5, 6, 7, 8], [6, 9, 10], [1, 5, 7, 9, 12, 13, 14, 15], [1, 5, 6, 11, 14, 16], [5, 6, 17], [1, 6, 12, 14, 18], [20], [21], [22], [23], [24], [25], [26], [27], [28], [29], [30], [31] |
| | 11 | Sho: {20, 21, 22, 23, 24, 25, 26, 27, 28, 29, 30, 31}<br>[1], [0, 3], [0, 4], [6, 7, 8], [2, 7, 9], [2, 5, 7, 13, 14], [0, 2, 6, 7, 11, 13, 15, 16], [0, 2, 5, 6, 7, 10, 11, 15, 17], [0, 5, 6, 7, 11, 12, 15, 18], [20], [21], [22], [23], [24], [25], [26], [27], [28], [29], [30], [31] |
| | 12 | Sho: {20, 21, 22, 23, 24, 25, 26, 27, 28, 29, 30, 31}<br>[0, 1], [0, 2], [0, 4], [3, 6, 7, 8], [0, 3, 6, 9, 11, 13, 14], [0, 5, 11, 16], [0, 3, 9, 10, 11, 15, 17], [0, 3, 5, 12, 15, 18], [20], [21], [22], [23], [24], [25], [26], [27], [28], [29], [30], [31] |
| | 13 | Sho: {20, 21, 22, 23, 24, 25, 26, 27, 28, 29, 30, 31}<br>[0, 1], [0, 3, 4], [2, 5], [0, 3, 7, 8, 9, 10], [0, 2, 8, 9, 12, 13], [0, 3, 7, 11, 12, 16], [3, 6, 7, 9, 14, 17, 18], [20], [21], [22], [23], [24], [25], [26], [27], [28], [29], [30], [31] |

Figure 8:
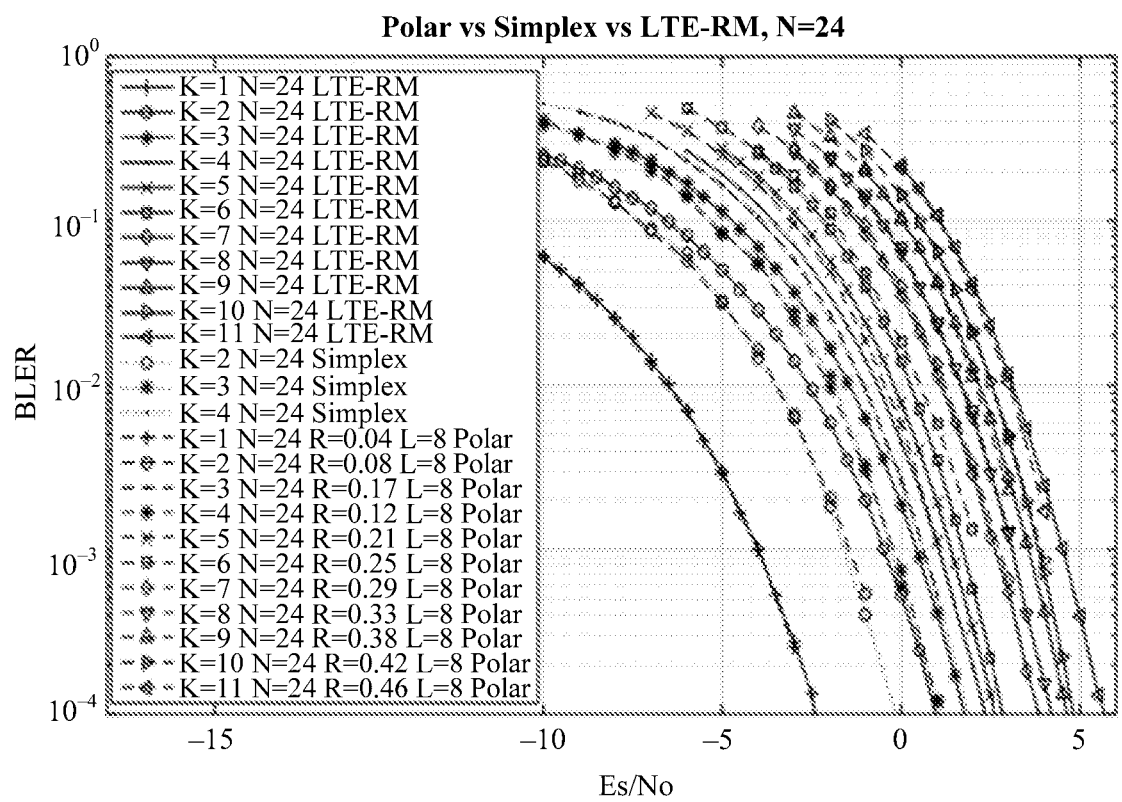
FIG. 8 is a third schematic diagram of performance simulation for constructions of optimal PC-polar codes according to an embodiment of this application.

FIG. 8 shows performance simulation, by an ASIC, of corresponding constructions of optimal PC-polar codes when N=24 in Table 2. It can be seen from FIG. 8 that when a decoder has a list width of 8, performance of polar codes is better than or even to that of LTE-RM and simplex codes.

Figure 9:
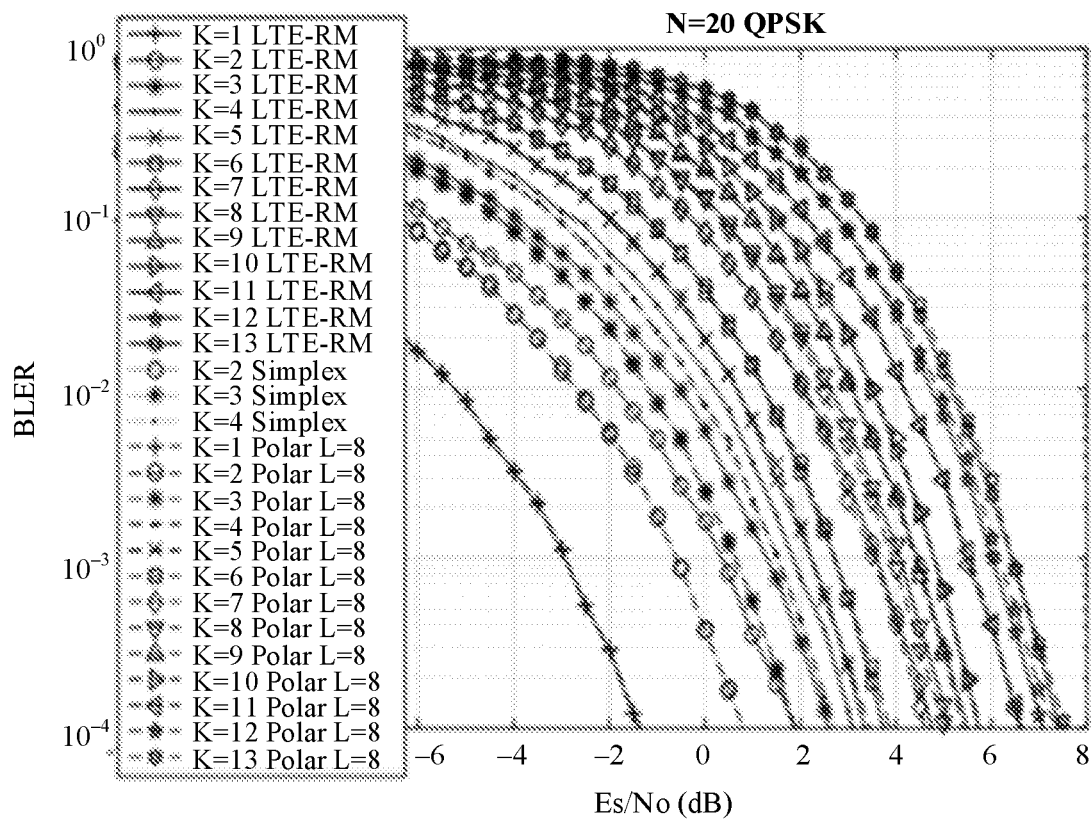
FIG. 9 is a fourth schematic diagram of performance simulation for constructions of optimal PC-polar codes according to an embodiment of this application.

FIG. 9 shows performance simulation, by an ASIC, of corresponding constructions of optimal PC-polar codes when N=20 in Table 2. It can be seen from FIG. 9 that when a decoder has a list width of 8, performance of polar codes is better than or even to that of LTE-RM and simplex codes.

Table 3, Table 4.1, and Table 4.2 show two constructions of an optimal PC-polar code when R is no rate matching, and bit position or sub-channel numbers start from 0.

TABLE 3

| N | K | {P}<br>{F/PF} |
|---|---|---|
| 16 | 5 | {[0], [1], [2], [3], [4], [5], [6], [8], [9], [10], [12]} |
| | 6 | {[0], [1], [2], [3], [4], [6], [8], [9], [5, 10], [5, 12]} |
| | 7 | {[0], [1], [2], [4], [6], [8], [3, 9], [3, 5, 10], [3, 12]} |
| | 8 | {[0], [1], [2], [4], [3, 5], [8], [6, 9], [3, 6, 10, 12]} |
| | 9 | {[0], [1], [2], [4], [8], [3, 6, 9, 10], [3, 12]} |
| | 10 | {[0], [1], [2], [4], [8], [5, 9, 10, 12]} |
| | 11 | {[0], [1], [2], [4], [8]} |

Figure 10:
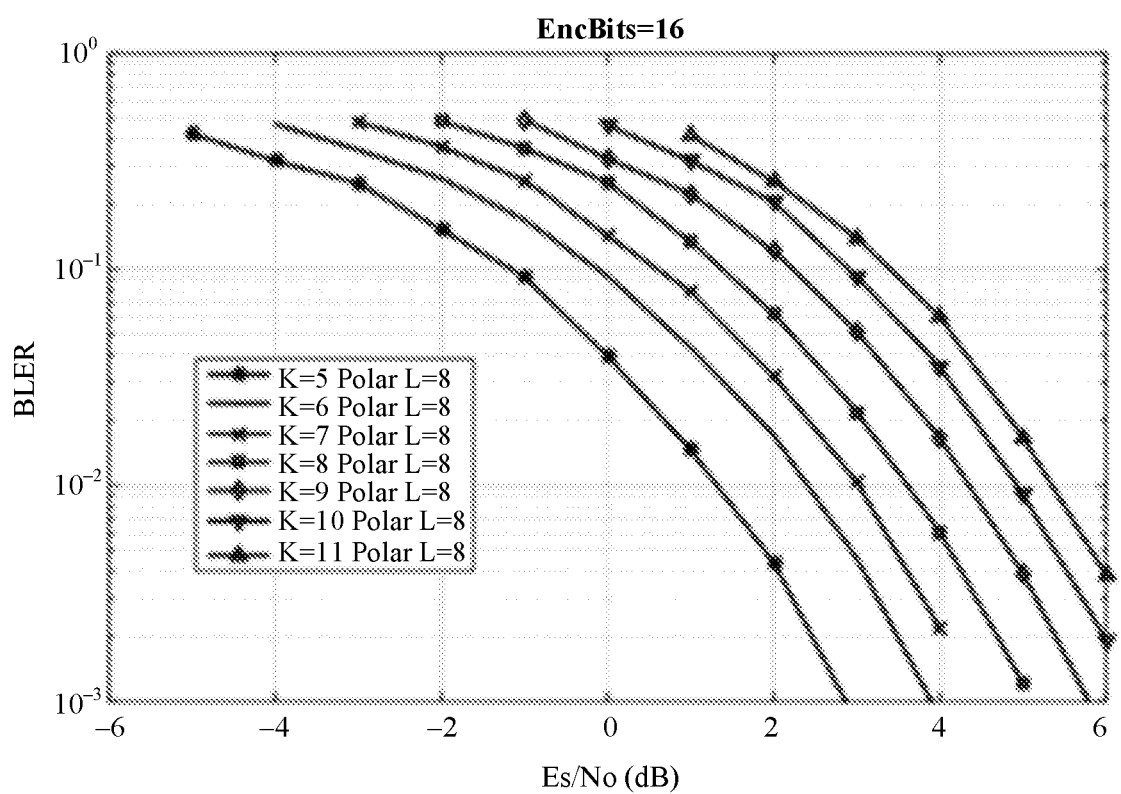
FIG. 10 is a fifth schematic diagram of performance simulation for constructions of optimal PC-polar codes according to an embodiment of this application.

FIG. 10 shows performance simulation, by an ASIC, of corresponding constructions of optimal PC-polar codes when N=16 in Table 3.

TABLE 4.1

| N | K | {P} {F} {PF} |
|---|---|---|
| 32 | 6 | { } |
|  |  | {[0], [1], [2], [3], [4], [5], [6], [7], [8], [9], [10], [11], [12], [13], [14], [16], [17], [18], [19], [20], [21][22], [24], [25], [26], [28]} |
|  | 7 | { } |
|  |  | {[0], [1], [2], [3], [4], [5], [6], [7], [8], [9], [10], [11], [12], [13], [14], [16], [17], [18], [19], [20], [21], [24], [26], [28]} |
|  |  | {[22, 25]} |
|  | 8 | { } |
|  |  | {[0], [1], [2], [3], [4], [5], [6], [7], [8], [9], [10], [11], [12], [14], [16], [17], [18], [19], [20], [21], [24], [28]} |
|  |  | {[22, 25], [13, 26]} |
|  | 9 | { } |
|  |  | {[0], [1], [2], [3], [4], [5], [6], [7], [8], [9], [10], [11], [12][16], [17], [18], [20], [24], [28]} |
|  |  | {[14, 19], [14, 21], [14, 22, 25], [13, 26]} |
|  | 10 | { } |
|  |  | {[0], [1], [2], [3], [4], [5], [6], [7], [8], [9], [10], [12], [16], [17], [18], [20], [24]} |
|  |  | {[14, 19], [11, 21], [22, 25], [13, 26], [11, 28]} |
|  | 11 | { } |
|  |  | {[0], [1], [2], [3], [4], [5], [6], [7], [8], [9], [10], [12], [16], [17], [18], [20], [24]} |
|  |  | {[14, 19], [11, 14, 21], [14, 22, 25], [13, 26]} |

TABLE 4.2

| N | K | {P} {F} {PF} |
|---|---|---|
| 32 | 1 | { } |
|  |  | [0], [1], [2], [3], [4], [5], [6], [7], [8], [9], [10], [11], [12], [13], [14], [15], [16], [17], [18], [19], [20], [21], [22], [23], [24], [25], [26], [27], [28], [29], [30] |
|  | 2 | { } |
|  |  | [1], [2], [0, 3], [4], [5], [6], [7], [9], [10], [11], [12],[13], [14], [15], [16], [17], [18], [0, 8, 19], [20], [21], [22], [0, 8, 23], [24], [25], [26], [0, 27], [28], [29], [30], [8, 31] |
|  | 3 | { } |
|  |  | [0], [1], [2], [3], [4], [5], [6], [7], [9], [10], [11], [12], [13], [14], [15], [17], [18], [19], [20], [21], [22], [23], [25], [26], [24, 27], [28], [16, 24, 29], [8, 24, 30], [8, 16, 24, 31] |
|  | 4 | { } |
|  |  | [1], [2], [3], [4], [5], [6], [7], [8], [9], [10], [11], [12],[13], [14], [15], [17], [18], [19], [20], [21], [22], [24], [25], [26], [28], [16, 27, 29], [0, 23, 30], [0, 16, 31] |
|  | 5 | { } |
|  |  | [1], [2], [3], [4], [5], [6], [7], [8], [9], [10], [11], [12], [13], [14], [16], [17], [18], [19], [20], [21], [22], [24], [25], [26], [28], [0, 30], [0, 15, 23, 27, 29, 31] |
|  | 6 | { } |
|  |  | [0], [1], [2], [3], [4], [5], [6], [7], [8], [9], [10], [11], [12], [13], [14], [16], [17], [18], [19], [20], [21], [22], [24], [25], [26], [28] |
|  | 7 | { } |
|  |  | [0], [1], [2], [3], [4], [5], [6], [8], [7, 9], [7, 10], [11, 12], [7, 11, 13], [7, 11, 14], [7, 11, 15, 16], [11, 17], [18], [11, 19], [7, 11, 15, 20], [15, 21], [11, 22], [7, 15, 24], [7, 25], [7, 11, 23, 26, 27], [7, 28], [7, 11, 15, 23, 26, 29, 30, 31] |
|  | 8 | { } |
|  |  | [1], [2], [3], [4], [0, 5], [6], [7], [8], [0, 9], [0, 10], [11], [0, 12], [13], [14], [0, 16], [15, 17], [18], [15, 20], [21], [15, 23, 24], [22, 23, 25], [0, 15, 19, 26], [19, 28], [0, 19, 22, 27, 29, 30, 31] |
|  | 9 | { } |
|  |  | [0], [1], [2], [3], [4], [5], [6], [7], [8], [9], [10], [11], [12], [16], [17], [18], [14, 19], [20], [13, 14, 21, 22], [24], [21, 25], [13, 14, 26], [13, 28] |
|  | 10 | { } |
|  |  | [0], [1], [2], [3], [4], [5], [6], [7], [8], [9], [10], [12], [16], [17], [18], [11, 14, 19], [20], [11, 13, 14, 21, 22], [24], [21, 25], [13, 14, 26], [11, 13, 28] |
|  | 11 | { } |
|  |  | [0], [1], [2], [3], [4], [5], [6], [8], [9], [10], [12], [16], [17], [18], [7, 11, 14, 19], [20], [7, 11, 13, 14, 21, 22], [24], [7, 21, 25], [13, 14, 26], [7, 11, 13, 28] |
|  | 12 | { } |
|  |  | [1], [0, 2], [0, 3], [0, 4], [0, 6], [7], [0, 8], [0, 5, 9], [0, 5, 10], [0, 11, 12], [5, 11, 13, 14, 16], [0, 5, 11, 14, 17], [5, 18], [13, 14, 15, 19, 20], [0, 15, 21], [0, 5, 11, 22], [0, 19, 23, 24], [0, 5, 15, 23, 25], [0, 13, 14, 15, 26], [14, 27, 28] |

For example, in Table 4.1, N=32, K=6, puncturing positions are an empty set, and [0] is a check equation. In the check equation, there is only one element 0, and the element 0 represents a check bit position. Because there is no check-required information bit position in the check equation, the check bit position 0 may also be considered as a frozen bit position.

Figure 11:
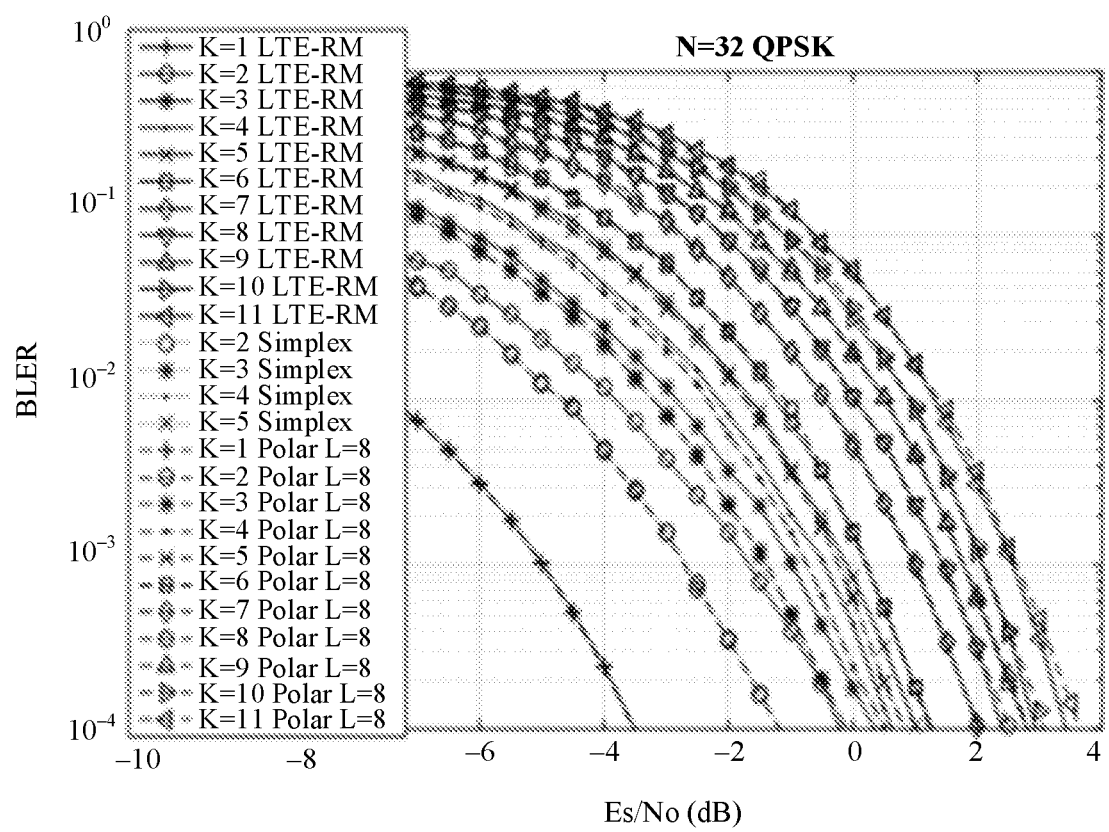
FIG. 11 is a sixth schematic diagram of performance simulation for constructions of optimal PC-polar codes according to an embodiment of this application.

FIG. 11 shows performance simulation, by an ASIC, of corresponding constructions of optimal PC-polar codes when N=32 in Table 4.1. It can be seen from FIG. 11 that when a decoder has a list width of 8, performance of polar codes is better than or even to that of LTE-RM and simplex codes.

The PC-polar coding method provided in this embodiment of this application is applied to ultra short codes. Performance of the method is even to or slightly better than that of LTE-RM, simplex, or repetition coding. In addition, with this method, all functions can be implemented using only one encoder and one decoder, with no need of using a plurality of encoders and decoders. Hardware resources are saved. For a general-purpose polar decoder, to additionally support ultra short packets, its area needs to increase only by an ignorable 1%, with no delay increase. Decoding complexity of PC-polar codes is lower than that of an ML decoding algorithm for LTE-RM and simplex codes that is based on Hadamard transform in combination with masks. Decoding of polar codes with a list width of 8 is not as complex as ML decoding, while in all scenarios in which K<6, PC-polar codes can achieve optimal performance even with a list width of 2 or 4.

Correspondingly, after obtaining the first constructor parameters, the receive end decodes the information bits sent by the transmit end based on the first constructor parameters and a received signal.

Figure 12:
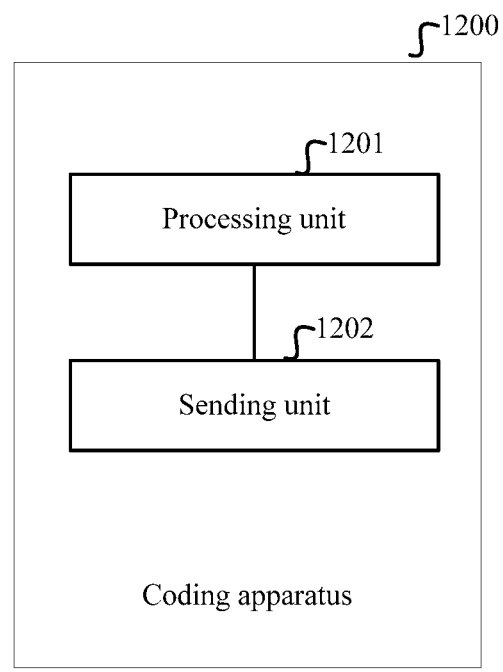
FIG. 12 is a first schematic structural diagram of a coding apparatus according to an embodiment of this application.

Based on the same inventive concept as the coding method shown in FIG. 5, as shown in FIG. 12, an embodiment of this application further provides a coding apparatus 1200. The coding apparatus 1200 includes a processing unit 1201 and a sending unit 1202. The processing unit 1201 and the sending unit 1202 have corresponding function modules to implement the method embodiment shown in FIG. 5. The coding apparatus 1200 can be configured to execute the coding method shown in FIG. 5. The coding apparatus 1200 may be the network device 101 or the terminal 102 in FIG. 1.

Figure 13:
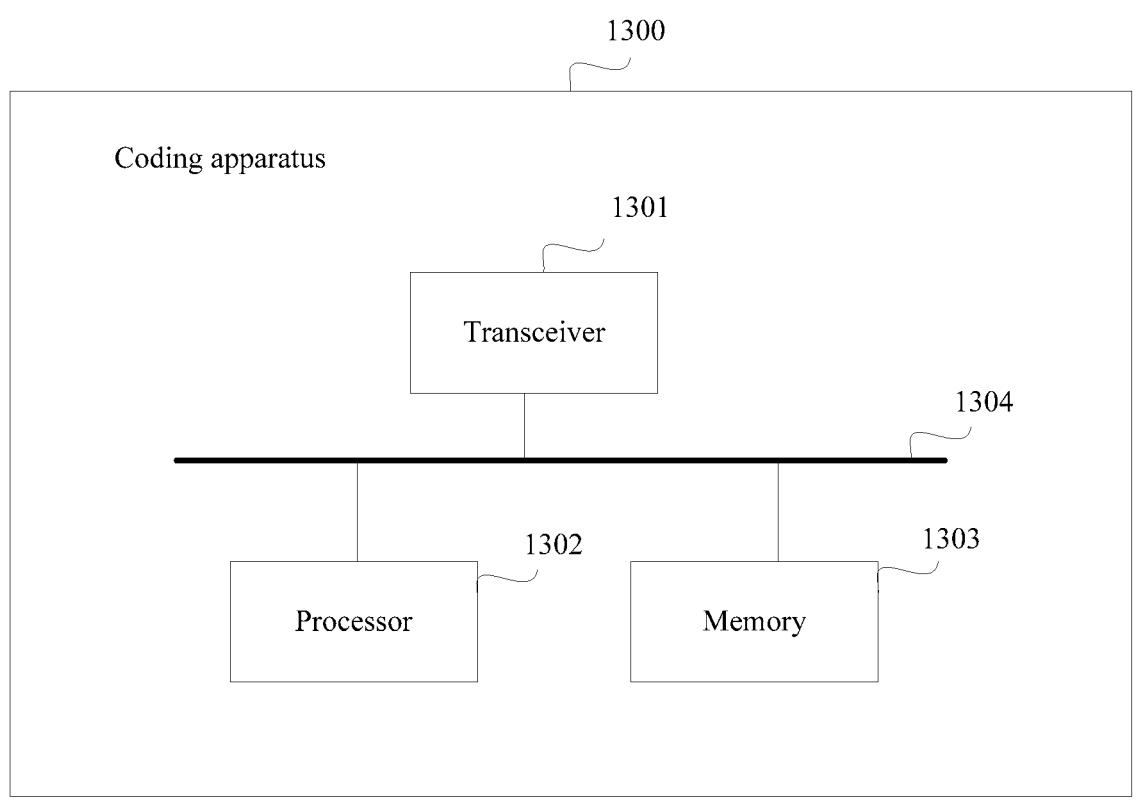
FIG. 13 is a second schematic structural diagram of a coding apparatus according to an embodiment of this application.

Based on the same inventive concept as the coding method shown in FIG. 5, as shown in FIG. 13, an embodiment of this application further provides a coding apparatus 1300. The coding apparatus 1300 can be configured to execute the method shown in FIG. 5. The coding apparatus 1300 includes a transceiver 1301, a processor 1302, a memory 1303, and a bus 1304. The processor 1302 and the memory 1303 are connected by the bus 1304 system. The processor 1302 is configured to execute code in the memory 1303. When the code is executed, the processor is caused to perform the following operations:

obtaining to-be-coded information bits; and performing parity check polar PC-polar coding on the to-be-coded information bits based on first constructor parameters, to obtain a coded bit sequence, where the first constructor parameters include a check equation, the check equation is an empty set or includes a first element representing a check-required information bit position and a second element representing a check bit position, the first element corresponds to a first vector in a generator matrix for PC-polar codes, the second element corresponds to a second vector in the generator matrix, and the first vector, the second vector, and an addition modulo 2 vector of the first vector and the second vector make true that, if a first Hamming weight of the first vector is the same as a second Hamming weight of the second vector, a third Hamming weight of the addition modulo 2 vector is greater than the first Hamming weight and greater than the second Hamming weight, or if the first Hamming weight is different from the second Hamming weight, the third Hamming weight is greater than a smaller one of the first Hamming weight and the second Hamming weight.

The transceiver 1301 is configured to send the coded bit sequence obtained by the processor 1302.

The processor 1302 may be a central processing unit (CPU), a network processor (NP), or a combination of a CPU and an NP.

The processor 1302 may further include a hardware chip. The hardware chip may be an application-specific integrated circuit (ASIC), a programmable logic device (PLD), or a combination thereof. The PLD may be a complex programmable logic device (CPLD), a field-programmable gate array (FPGA), generic array logic (GAL), or any combination thereof.

The memory 1303 may include a volatile memory, for example, a random access memory (RAM); or the memory may include a non-volatile memory, for example, a flash memory, a hard disk drive (HDD), or a solid-state drive (SSD); or the memory may include a combination of the foregoing types of memories.

Figure 14:
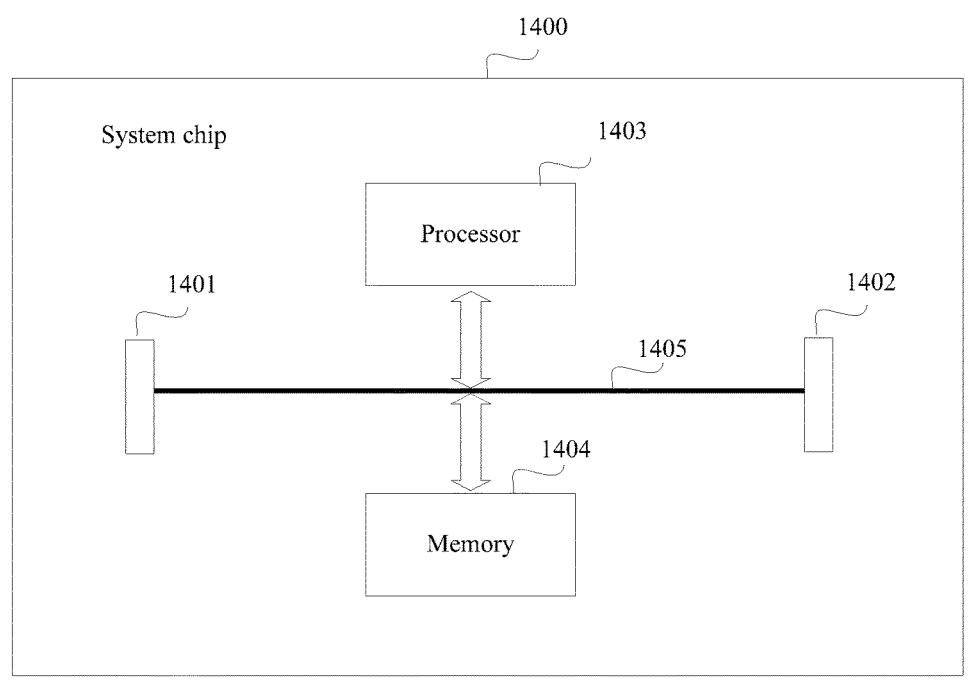
FIG. 14 is a schematic structural diagram of a system chip according to an embodiment of this application.

Based on the same inventive concept as the coding method shown in FIG. 5, as shown in FIG. 14, an embodiment of this application further provides a system chip 1400. The system chip 1400 includes an input interface 1401, an output interface 1402, at least one processor 1403, and a memory 1404. The input interface 1401, the output interface 1402, the processor 1403, and the memory 1404 are connected by a bus 1405. The processor 1403 is configured to execute code in the memory 1404. When the code is executed, the processor 1403 implements the method performed by the transmit end in FIG. 5.

The system chip 1400 shown in FIG. 14 can implement the processes implemented by the transmit end in the foregoing method embodiment in FIG. 5. To avoid repetition, details are not described herein again.

A person skilled in the art should understand that all or some of the foregoing embodiments may be implemented by using software, hardware, firmware, or any combination thereof. When software is used for implementation, the all or some of the embodiments may be implemented in a form of a computer program product. The computer program product includes one or more computer instructions. When the computer program instructions are loaded and executed on a computer, all or some of the processes or functions in the embodiments of the present disclosure are generated. The computer may be a general-purpose computer, a dedicated computer, a computer network, or other programmable apparatuses. The computer instructions may be stored in a computer-readable storage medium or may be transmitted from one computer-readable storage medium to another computer-readable storage medium. For example, the computer instructions may be transmitted from a website, computer, server, or data center to another website, computer, server, or data center in a wired (for example, through a coaxial cable, an optical fiber, or a digital subscriber line (DSL)) or wireless (for example, through infrared, radio, or a microwave) manner. The computer-readable storage medium may be any usable medium that can be accessed by a computer, or may be a data storage device, for example, a server or a data center into which one or more usable media are integrated. The usable medium may be a magnetic medium (for example, a floppy disk, a hard disk, or a magnetic tape), an optical medium (for example, an optical medium (for example, a digital versatile disc (DVD)), a semiconductor medium (for example, a solid state disk (SSD)), or the like.

Although preferred embodiments of this application have been described, a person skilled in the art can make changes and modifications to these embodiments once they learn the basic inventive concept. Therefore, the following claims are intended to be construed as covering the preferred embodiments and all changes and modifications falling within the scope of this application.

Obviously, a person skilled in the art can make various modifications and variations to the embodiments of this application without departing from the spirit and scope of the embodiments of this application. This application is intended to cover these modifications and variations to the embodiments of this application provided that they fall within the scope of protection defined by the following claims in this application and their equivalent technologies.

What is claimed is:

1. A coding method, comprising:
obtaining, by a computing device, to-be-coded information bits;
performing, by the computing device, parity check polar (PC-polar) coding on the to-be-coded information bits based on first constructor parameters, to obtain a coded bit sequence,
wherein the first constructor parameters comprise a check equation, the check equation comprises a first element representing a check-required information bit position and a second element representing a check bit position,
wherein the first element corresponds to a first vector in a generator matrix for PC-polar codes,
wherein the second element corresponds to a second vector in the generator matrix,
wherein the first element and the second element are both row numbers of the generator matrix for PC-polar codes, the first vector is a row vector whose row number is a value of the first element in the generator matrix for PC-polar codes, and the second vector is a row vector whose row number is a value of the second element in the generator matrix for PC-polar codes,
wherein the first element is less than the second element, and
wherein in response to a first Hamming weight of the first vector being the same as a second Hamming weight of the second vector, a third Hamming weight of an addition modulo 2 vector of the first vector and the second vector is greater than the first Hamming weight and greater than the second Hamming weight, and in response to the first Hamming weight of the first vector being different from the second Hamming weight of the second vector, the third Hamming weight of the addition modulo 2 vector of the first vector and the second vector is greater than a smaller one of the first Hamming weight and the second Hamming weight; and
sending, by the computing device, the coded bit sequence to another computing device in a computer network.

2. The method according to claim 1, wherein bit positions are denoted by row numbers 1, 2, . . . , and $N_0$ of the generator matrix, $N_0$ represents a mother code length of a PC-polar code, K represents a length of the to-be-coded information bits, N represents a length of the coded bit sequence, $N_0$, K, and N are all positive integers, R represents a rate matching scheme, P represents a processing position of the rate matching scheme, F represents a frozen bit position, I represents an information bit position, PC represents a check bit position, and PF represents the check equation,
wherein:
if K is 1 and $N_0$ is $2^{\text{ceil}(\log_2 N)}$, wherein ceil is an up-rounding operation, the first constructor parameters are as follows: R is puncturing, P is any ($N_0$-N) bit positions, F is 1 to $N_0$-1, I is $N_0$, and PC and PF are both empty sets; or
if K is 2, 3, 4, or 5 and $N_0$ is $2^K$, the first constructor parameters are as follows: R is shortening to $N_0$-1 followed by repeating to the length N, with a low-order bit of a code word punctured when N is a non-integer multiple of $N_0$, P is {$N_0$}, I comprises all row numbers corresponding to row vectors whose row weights are $N_0/2$, F comprises all row numbers except the row numbers in I, and PC and PF are both empty sets; or
if K is 6, N is 32, and $N_0$ is 32, the first constructor parameters are as follows: R is no rate matching, P is an empty set, F is [1, 2, 3, 4, 5, 6, 7, 8, 9, 10, 11, 12, 13, 14, 15, 17, 18, 19, 20, 21, 22, 23, 25, 26, 27, 29], I is [16, 24, 28, 30, 31, 32], PC is an empty set, and PF is an empty set; or
if K is 7, N is 32, and $N_0$ is 32, the first constructor parameters are as follows: R is no rate matching, P is an empty set, F is [1, 2, 3, 4, 5, 6, 7, 8, 9, 10, 11, 12, 13, 14, 15, 17, 18, 19, 20, 21, 22, 25, 27, 29], I is [16, 23, 24, 28, 30, 31, 32], PC is [26], and PF is [23, 26]; or
if K is 8, N is 32, and $N_0$ is 32, the first constructor parameters are as follows: R is no rate matching, P is an empty set, F is [1, 2, 3, 4, 5, 6, 7, 8, 9, 10, 11, 12, 13, 15, 17, 18, 19, 20, 21, 22, 25, 29], I is [14, 16, 23, 24, 28, 30, 31, 32], PC is [26, 27], and PF is {[23, 26], [14, 27]}; or
if K is 9, N is 32, and $N_0$ is 32, the first constructor parameters are as follows: R is no rate matching, P is an empty set, F is [1, 2, 3, 4, 5, 6, 7, 8, 9, 10, 11, 12, 13, 17, 18, 19, 21, 25, 29], I is [14, 15, 16, 23, 24, 28, 30, 31, 32], PC is [20, 22, 26, 27], and PF is {[15, 20], [15, 22], [15, 23, 26], [14, 27]} or {[15, 20], [22], [23, 26], [14, 27]}; or
if K is 10, N is 32, and $N_0$ is 32, the first constructor parameters are as follows: R is no rate matching, P is an empty set, F is [1, 2, 3, 4, 5, 6, 7, 8, 9, 10, 11, 13, 17, 18, 19, 21, 25], I is [12, 14, 15, 16, 23, 24, 28, 30, 31, 32], PC is [20, 22, 26, 27, 29], and PF is {[15, 20], [12 22], [23, 26], [14, 27], [12, 29]} or {[15, 20], [12, 15, 22], [15, 23, 26], [14, 27], [12, 29]}; or
if K is 11, N is 32, and $N_0$ is 32, the first constructor parameters are as follows: R is no rate matching, P is an empty set, F is [1, 2, 3, 4, 5, 6, 7, 8, 9, 10, 11, 13, 17, 18, 19, 21, 25], I is [12, 14, 15, 16, 23, 24, 28, 29, 30, 31, 32], PC is [20, 22, 26, 27], and PF is {[15, 20], [12, 15, 22], [15, 23, 26], [14, 27]} or {[15, 20], [12 22], [23, 26], [14, 27]}; or
if K is 5, N is 24, and $N_0$ is 32, the first constructor parameters are as follows: R is puncturing, P is [1, 2, 3, 4, 5, 6, 9, 10], F is [1, 2, 3, 4, 5, 6, 7, 8, 9, 10, 11, 12, 13, 14, 15, 16, 17, 18, 19, 20, 21, 22, 23, 25, 26, 27, 29], I is [24, 28, 30, 31, 32], PC is an empty set, and PF is an empty set; or
if K is 6, N is 24, and $N_0$ is 32, the first constructor parameters are as follows: R is puncturing, P is [1, 2, 3, 4, 9, 10, 17, 18], F is [1, 2, 3, 4, 5, 6, 7, 8, 9, 10, 11, 12, 13, 14, 15, 17, 18, 19, 20, 21, 22, 23, 25, 26, 27, 29], I is [16, 24, 28, 30, 31, 32], PC is an empty set, and PF is an empty set; or
if K is 7, N is 24, and $N_0$ is 32, the first constructor parameters are as follows: R is puncturing, P is [1, 2, 3, 4, 5, 6, 7, 8], F is [1, 2, 3, 4, 5, 6, 7, 8, 9, 10, 11, 12, 13, 14, 15, 17, 18, 19, 20, 21, 22, 25, 27, 29], I is [16, 23, 24, 28, 30, 31, 32], PC is [26], and PF is {[23, 26]}; or
if K is 8, N is 24, and $N_0$ is 32, the first constructor parameters are as follows: R is puncturing, P is [1, 2, 3, 4, 5, 6, 7, 8], F is [1, 2, 3, 4, 5, 6, 7, 8, 9, 10, 11, 12, 13, 15, 17, 18, 19, 20, 21, 22, 25, 29], I is [14, 16, 23, 24, 28, 30, 31, 32], PC is [26, 27], and PF is {[23, 26], [14, 27]}; or if K is 9, N is 24, and $N_0$ is 32, the first constructor parameters are as follows: R is puncturing, P is [1, 2, 3, 4, 5, 6, 7, 8], F is [1, 2, 3, 4, 5, 6, 7, 8, 9, 10, 11, 12, 13, 17, 18, 19, 21, 25, 29], I is [14, 15, 16, 23, 24, 28, 30, 31, 32], PC is [20, 22, 26, 27], and PF is {[15, 20], [15, 22], [15, 23, 26], [14, 27]}; or if K is 10, N is 24, and $N_0$ is 32, the first constructor parameters are as follows: R is puncturing, P is [1, 2, 3, 4, 9, 10, 17, 18], F is [1, 2, 3, 4, 5, 6, 7, 8, 9, 10, 11, 13, 17, 18, 19, 21, 25], I is [12, 14, 15, 16, 23, 24, 28, 30, 31, 32], PC is [20, 22, 26, 27, 29], and PF is {[15, 20], [12 22], [23, 26], [14, 27], [12, 29]}; or if K is 11, N is 24, and $N_0$ is 32, the first constructor parameters are as follows: R is puncturing, P is [1, 2, 3, 4, 9, 10, 17, 18], F is [1, 2, 3, 4, 5, 6, 7, 8, 9, 10, 11, 13, 17, 18, 19, 21, 25], I is [12, 14, 15, 16, 23, 24, 28, 29, 30, 31, 32], PC is [20, 22, 26, 27], and PF is {[15, 20], [12, 15, 22], [15, 23, 26], [14, 27]} or {[15, 20], [12 22], [23, 26], [14, 27]}; or if K is 5, N is 20, and $N_0$ is 32, the first constructor parameters are as follows: R is puncturing, P is [1, 3, 6, 9, 12, 16, 18, 23, 24, 27, 31, 32], F is [1, 2, 3, 4, 5, 6, 7, 8, 9, 10, 11, 12, 13, 14, 15, 16, 17, 18, 19, 20, 21, 22, 23, 25, 26, 27, 29], I is [24, 28, 30, 31, 32], PC is an empty set, and PF is an empty set; or if K is 6, N is 20, and $N_0$ is 32, the first constructor parameters are as follows: R is puncturing, P is [1, 3, 6, 9, 12, 16, 18, 23, 24, 27, 31, 32], F is [1, 2, 3, 4, 5, 6, 7, 8, 9, 10, 11, 12, 13, 14, 15, 17, 18, 19, 20, 21, 22, 23, 25, 26, 27, 29], I is [16, 24, 28, 30, 31, 32], PC is an empty set, and PF is an empty set; or if K is 7, N is 20, and $N_0$ is 32, the first constructor parameters are as follows: R is puncturing, P is [1, 2, 3, 4, 5, 6, 7, 8, 9, 10, 17, 18], F is [1, 2, 3, 4, 5, 6, 7, 8, 9, 10, 11, 12, 13, 14, 15, 17, 18, 19, 20, 21, 23, 25, 26, 29], I is [16, 22, 24, 28, 30, 31, 32], PC is [27], and PF is {[22, 27]}; or if K is 8, N is 20, and $N_0$ is 32, the first constructor parameters are as follows: R is puncturing, P is [1, 2, 3, 4, 5, 6, 7, 8, 9, 10, 17, 18], F is [1, 2, 3, 4, 5, 6, 7, 8, 9, 10, 11, 12, 13, 15, 17, 18, 19, 20, 21, 22, 25, 29], I is [14, 16, 23, 24, 28, 30, 31, 32], PC is [26, 27], and PF is {[23, 26], [14, 27]}; or if K is 9, N is 20, and $N_0$ is 32, the first constructor parameters are as follows: R is puncturing, P is [1, 2, 3, 4, 5, 6, 7, 8, 9, 10, 11, 12], F is [1, 2, 3, 4, 5, 6, 7, 8, 9, 10, 11, 12, 13, 14, 15, 17, 18, 19, 21, 25], I is [16, 22, 23, 24, 28, 29, 30, 31, 32], PC is [20, 26, 27], and PF is {[16, 20], [16, 22, 23, 26], [22, 27]}; or if K is 10, N is 20, and $N_0$ is 32, the first constructor parameters are as follows: R is puncturing, P is [1, 2, 3, 4, 5, 6, 7, 8, 9, 10, 17, 18], F is [1, 2, 3, 4, 5, 6, 8, 9, 10, 11, 12, 13, 17, 18, 19, 21, 25], I is [14, 15, 16, 23, 24, 28, 29, 30, 31, 32], PC is [20, 22, 26, 27], and PF is {[15, 20], [15, 22], [15, 23, 26], [14, 27]}; or if K is 11, N is 20, and $N_0$ is 32, the first constructor parameters are as follows: R is puncturing, P is [1, 2, 3, 4, 5, 6, 7, 8, 9, 10, 17, 18], F is [1, 2, 3, 4, 5, 6, 7, 8, 9, 10, 11, 13, 17, 18, 19, 21, 25], I is [12, 14, 15, 16, 23, 24, 28, 29, 30, 31, 32], PC is [20, 22, 26, 27], and PF is {[15, 20], [12, 15, 22], [15, 23, 26], [14, 27]} or {[15, 20], [12 22], [23, 26], [14, 27]}; or if K is 12, N is 20, and $N_0$ is 32, the first constructor parameters are as follows: R is puncturing, P is [1, 2, 3, 4, 5, 6, 7, 8, 9, 10, 17, 18], F is [1, 2, 3, 4, 5, 6, 7, 8, 9, 10, 11, 13, 17, 18, 19, 21, 25], I is [12, 14, 15, 16, 20, 24, 27, 28, 29, 30, 31, 32], PC is [22, 23, 26], and PF is {[14, 20, 22], [14, 15, 20, 23], [12, 14, 15, 20, 26]}; or if K is 13, N is 20, and $N_0$ is 32, the first constructor parameters are as follows: R is puncturing, P is [1, 2, 3, 4, 5, 6, 7, 8, 9, 10, 11, 12], F is [1, 2, 3, 4, 5, 6, 7, 8, 9, 10, 11, 12, 13, 15, 17, 21, 25], I is [14, 16, 20, 22, 23, 24, 26, 27, 28, 29, 30, 31, 32], PC is [18, 19], and PF is {[14, 18], [14, 19]}; or if K is 5, N is 24, and $N_0$ is 32, the first constructor parameters are as follows: R is shortening, P is [4, 8, 12, 16, 20, 24, 28, 32], F is [1, 2, 3, 4, 5, 6, 7, 8, 9, 10, 11, 12, 13, 16, 17, 18, 19, 20, 21, 24, 25, 28, 32], I is [14, 15, 22, 30, 31], PC is [23, 26, 27, 29], and PF is {[14, 15, 23], [14, 15, 26], [14, 22, 27], [14, 29]}; or if K is 6, N is 24, and $N_0$ is 32, the first constructor parameters are as follows: R is shortening, P is [4, 8, 12, 16, 20, 24, 28, 32], F is [1, 2, 3, 4, 5, 6, 7, 8, 9, 10, 11, 12, 13, 16, 17, 18, 19, 20, 21, 24, 25, 28, 32], I is [14, 15, 22, 23, 30, 31], PC is [26, 27, 29], and PF is {[15, 26], [22, 27], [14, 29]}; or if K is 7, N is 24, and $N_0$ is 32, the first constructor parameters are as follows: R is shortening, P is [4, 8, 12, 16, 20, 24, 28, 32], F is [1, 2, 3, 4, 5, 6, 7, 8, 9, 10, 11, 12, 13, 16, 17, 18, 19, 20, 21, 24, 25, 28, 32], I is [14, 15, 22, 23, 26, 30, 31], PC is [27, 29], and PF is {[24, 26, 27], [14, 23, 26, 29]}; or if K is 8, N is 24, and $N_0$ is 32, the first constructor parameters are as follows: R is shortening, P is [4, 8, 12, 16, 20, 24, 28, 32], F is [1, 2, 3, 4, 5, 6, 7, 8, 9, 10, 11, 12, 13, 16, 17, 18, 19, 20, 21, 24, 25, 28, 32], I is [14, 15, 22, 23, 26, 27, 30, 31], PC is [29], and PF is {[14, 15, 22, 23, 26, 27, 29]}; or if K is 9, N is 24, and $N_0$ is 32, the first constructor parameters are as follows: R is shortening, P is [4, 8, 12, 16, 20, 24, 28, 32], F is [1, 2, 3, 4, 5, 6, 7, 8, 9, 10, 11, 12, 13, 16, 17, 18, 19, 20, 21, 24, 25, 28, 32], I is [14, 15, 22, 23, 26, 27, 29, 30, 31], PC is an empty set, and PF is an empty set; or if K is 10, N is 24, and $N_0$ is 32, the first constructor parameters are as follows: R is shortening, P is [4, 8, 12, 16, 20, 24, 28, 32], F is [1, 2, 3, 4, 5, 6, 7, 8, 9, 12, 16, 17, 20, 24, 28, 32], I is [6, 14, 15, 22, 23, 26, 27, 29, 30, 31], PC is [10, 11, 13, 18, 19, 21, 25], and PF is {[6, 10], [6, 11], [6, 13], [6, 18], [6, 19], [6, 21], [6, 25]}; or if K is 11, N is 24, and $N_0$ is 32, the first constructor parameters are as follows: R is shortening, P is [4, 8, 12, 16, 20, 24, 28, 32], F is [1, 2, 3, 4, 5, 8, 9, 12, 16, 17, 20, 24, 28, 32], I is [6, 7, 14, 15, 22, 23, 26, 27, 29, 30, 31], PC is [10, 11, 13, 18, 19, 21, 25], and PF is {[7, 10], [6, 7, 11], [6, 7, 13], [6, 7, 18], [6, 7, 19], [6, 7, 21], [6, 7, 25]}; or if K is 5, N is 20, and $N_0$ is 32, the first constructor parameters are as follows: R is shortening, P is [4, 6, 8, 12, 14, 16, 20, 22, 24, 28, 32], F is [1, 2, 3, 4, 5, 6, 7, 8, 9, 10, 11, 12, 13, 14, 16, 17, 19, 20, 21, 22, 24, 25, 28, 30, 32], I is [15, 23, 27, 29, 31], PC is [18, 26], and PF is {[15, 18], [23, 26]}; or if K is 6, N is 20, and $N_0$ is 32, the first constructor parameters are as follows: R is shortening, P is [4, 6, 8, 12, 14, 16, 20, 22, 24, 28, 32], F is [1, 2, 3, 4, 5, 6, 7, 8, 9, 10, 11, 12, 13, 14, 16, 17, 19, 20, 21, 22, 24, 25, 28, 30, 32], I is [15, 23, 26, 27, 29, 31], PC is [18], and PF is {[15, 18]}; or if K is 7, N is 20, and $N_0$ is 32, the first constructor parameters are as follows: R is shortening, P is [4, 6, 8, 12, 14, 16, 20, 22, 24, 28, 32], F is [1, 2, 3, 4, 5, 6, 7, 8, 9, 12, 14, 16, 17, 18, 19, 20, 22, 24, 25, 28, 30, 32], I is [10, 15, 23, 26, 27, 29, 31], PC is [11, 13, 21], and PF is {[10, 11], [10, 13], [10, 21]}; or if K is 8, N is 20, and $N_0$ is 32, the first constructor parameters are as follows: R is shortening, P is [4, 6, 8, 12, 14, 16, 20, 22, 24, 28, 32], F is [1, 2, 3, 4, 5, 6, 7, 8, 9, 11, 12, 14, 16, 17, 20, 22, 24, 28, 30, 32], I is [10, 13, 15, 23, 26, 27, 29, 31], PC is [18, 19, 21, 25], and PF is {[13, 18], [10, 19], [10, 13, 21], [10, 25]}; or if K is 9, N is 20, and $N_0$ is 32, the first constructor parameters are as follows: R is shortening, P is [4, 6, 8, 12, 14, 16, 20, 22, 24, 28, 30, 32], F is [1, 2, 3, 4, 5, 6, 7, 8, 9, 12, 14, 16, 17, 20, 22, 24, 25, 28, 30, 32], I is [10, 11, 13, 15, 23, 26, 27, 29, 31], PC is [18, 19, 21], and PF is {[11, 18], [11, 13, 19], [10, 21]} or {[11, 18], [13, 19], [10, 21]}; or if K is 10, N is 20, and $N_0$ is 32, the first constructor parameters are as follows: R is shortening, P is [4, 6, 8, 12, 14, 16, 20, 22, 24, 28, 30, 32], F is [1, 2, 3, 4, 5, 6, 8, 9, 12, 14, 16, 17, 20, 22, 24, 28, 30, 32], I is [7, 10, 11, 13, 15, 23, 26, 27, 29, 31], PC is [18, 19, 21, 25], and PF is {[7, 11, 18], [11, 13, 19], [10, 21], [7, 25]} or {[7, 11, 18], [11, 13, 19], [10, 21], [25]}; or if K is 11, N is 20, and $N_0$ is 32, the first constructor parameters are as follows: R is shortening, P is [4, 6, 8, 12, 14, 16, 20, 22, 24, 28, 32], F is [1, 2, 3, 4, 5, 6, 7, 8, 9, 12, 14, 16, 17, 20, 22, 24, 28, 30, 32], I is [10, 11, 13, 15, 18, 23, 26, 27, 29, 31], PC is [19, 21, 25], and PF is {[10, 13, 19], [7, 10, 11, 13, 21], [7, 10, 11, 13, 25]}; or if K is 12, N is 20, and $N_0$ is 32, the first constructor parameters are as follows: R is shortening, P is [4, 6, 8, 12, 14, 16, 20, 22, 24, 28, 30, 32], F is [1, 2, 3, 4, 5, 6, 8, 9, 12, 14, 16, 17, 20, 22, 24, 28, 30, 32], I is [7, 11, 13, 15, 19, 21, 23, 25, 26, 27, 29, 31], PC is [10, 18], and PF is {[7, 10], [11, 18]}; or if K is 13, N is 20, and $N_0$ is 32, the first constructor parameters are as follows: R is shortening, P is [4, 6, 8, 12, 14, 16, 20, 22, 24, 28, 30, 32], F is [1, 2, 3, 4, 5, 6, 8, 9, 12, 14, 16, 17, 20, 22, 24, 28, 30, 32], I is [7, 11, 13, 15, 18, 19, 21, 23, 25, 26, 27, 29, 31], PC is [10], and PF is {[7, 10]}; or if K is 5, N is 16, and $N_0$ is 32, the first constructor parameters are as follows: R is no rate matching, P is an empty set, F is [1, 2, 3, 4, 5, 6, 7, 9, 10, 11, 13], I is [8, 12, 14, 15, 16, 17, 18, 19, 20, 21, 22, 23, 24, 25, 26, 27, 28, 29, 30, 31, 32], PC is an empty set, and PF is an empty set; or if K is 6, N is 16, and $N_0$ is 32, the first constructor parameters are as follows: R is no rate matching, P is an empty set, F is [1, 2, 3, 4, 5, 7, 9, 10], I is [8, 12, 14, 15, 16, 17, 18, 19, 20, 21, 22, 23, 24, 25, 26, 27, 28, 29, 30, 31, 32], PC is [11, 13], and PF is {[6, 11], [6, 13]}; or if K is 7, N is 16, and $N_0$ is 32, the first constructor parameters are as follows: R is no rate matching, P is an empty set, F is [1, 2, 3, 5, 7, 9], I is [4, 6, 8, 12, 14, 15, 16, 17, 18, 19, 20, 21, 22, 23, 24, 25, 26, 27, 28, 29, 30, 31, 32], PC is [10, 11, 13], and PF is {[4, 10], [4, 6, 11], [4, 13]}; or if K is 8, N is 16, and $N_0$ is 32, the first constructor parameters are as follows: R is no rate matching, P is an empty set, F is [1, 2, 3, 5, 9], I is [4, 7, 8, 11, 12, 14, 15, 16, 17, 18, 19, 20, 21, 22, 23, 24, 25, 26, 27, 28, 29, 30, 31, 32], PC is [6, 10, 13], and PF is {[4, 6], [7, 10], [4, 7, 11, 13]}; or if K is 9, N is 16, and $N_0$ is 32, the first constructor parameters are as follows: R is no rate matching, P is an empty set, F is [1, 2, 3, 5, 9], I is [4, 6, 7, 8, 10, 12, 14, 15, 16, 17, 18, 19, 20, 21, 22, 23, 24, 25, 26, 27, 28, 29, 30, 31, 32], PC is [11, 13], and PF is {[4, 7, 10, 11], [4, 13]}; or if K is 10, N is 16, and $N_0$ is 32, the first constructor parameters are as follows: R is no rate matching, P is an empty set, F is [1, 2, 3, 5, 9], I is [4, 6, 7, 8, 10, 11, 12, 14, 15, 16, 17, 18, 19, 20, 21, 22, 23, 24, 25, 26, 27, 28, 29, 30, 31, 32], PC is [13], and PF is {[6, 10, 11, 13]}; or if K is 11, N is 16, and $N_0$ is 32, the first constructor parameters are as follows: R is no rate matching, P is an empty set, F is [1, 2, 3, 5, 9], I is [4, 6, 7, 8, 10, 11, 12, 13, 14, 15, 16, 17, 18, 19, 20, 21, 22, 23, 24, 25, 26, 27, 28, 29, 30, 31, 32], PC is an empty set, and PF is an empty set.

3. A coding apparatus, comprising:
a processor, configured to:
   obtain to-be-coded information bits;
   perform parity check polar (PC-polar) coding on the to-be-coded information bits based on first constructor parameters, to obtain a coded bit sequence,
      wherein the first constructor parameters comprise a check equation, the check equation comprises a first element representing a check-required information bit position and a second element representing a check bit position,
      wherein the first element corresponds to a first vector in a generator matrix for PC-polar codes,
      wherein the second element corresponds to a second vector in the generator matrix,
      wherein the first element and the second element are both row numbers of the generator matrix for PC-polar codes, the first vector is a row vector whose row number is a value of the first element in the generator matrix for PC-polar codes, and the second vector is a row vector whose row number is a value of the second element in the generator matrix for PC-polar codes,
      wherein the first element is less than the second element, and
      wherein in response to a first Hamming weight of the first vector being the same as a second Hamming weight of the second vector, a third Hamming weight of an addition modulo 2 vector of the first vector and the second vector is greater than the first Hamming weight and greater than the second Hamming weight, and in response to the first Hamming weight of the first vector being different from the second Hamming weight of the second vector, the third Hamming weight of the addition modulo 2 vector of the first vector and the second vector is greater than a smaller one of the first Hamming weight and the second Hamming weight; and
a transmitter, configured to send the coded bit sequence obtained by the processor to another computing device in a computer network.

4. The apparatus according to claim 3, wherein bit positions are denoted by row numbers 1, 2, . . . , and $N_0$ of the generator matrix, $N_0$ represents a mother code length of a PC-polar code, K represents a length of the to-be-coded information bits, N represents a length of the coded bit sequence, $N_0$, K, and N are all positive integers, R represents a rate matching scheme, P represents a processing position of the rate matching scheme, F represents a frozen bit position, I represents an information bit position, PC represents a check bit position, and PF represents the check equation, wherein:
if K is 1 and $N_0$ is $2^{ceil(log_2 N)}$, wherein ceil is an up-rounding operation, the first constructor parameters are as follows: R is puncturing, P is any ($N_0$-N) bit positions, F is 1 to $N_0$-1, I is $N_0$, and PC and PF are both empty sets; or if K is 2, 3, 4, or 5 and $N_0$ is $2^K$, the first constructor parameters are as follows: R is shortening to $N_0$-1 followed by repeating to the length N, with a low-order bit of a code word punctured when N is a non-integer multiple of $N_0$, P is {$N_0$}, I comprises all row numbers corresponding to row vectors whose row weights are $N_0/2$, F comprises all row numbers except the row numbers in I, and PC and PF are both empty sets; or if K is 6, N is 32, and $N_0$ is 32, the first constructor parameters are as follows: R is no rate matching, P is an empty set, F is [1, 2, 3, 4, 5, 6, 7, 8, 9, 10, 11, 12, 13, 14, 15, 17, 18, 19, 20, 21, 22, 23, 25, 26, 27, 29], I is [16, 24, 28, 30, 31, 32], PC is an empty set, and PF is an empty set; or if K is 7, N is 32, and $N_0$ is 32, the first constructor parameters are as follows: R is no rate matching, P is an empty set, F is [1, 2, 3, 4, 5, 6, 7, 8, 9, 10, 11, 12, 13, 14, 15, 17, 18, 19, 20, 21, 22, 25, 27, 29], I is [16, 23, 24, 28, 30, 31, 32], PC is [26], and PF is [23, 26]; or if K is 8, N is 32, and $N_0$ is 32, the first constructor parameters are as follows: R is no rate matching, P is an empty set, F is [1, 2, 3, 4, 5, 6, 7, 8, 9, 10, 11, 12, 13, 15, 17, 18, 19, 20, 21, 22, 25, 29], I is [14, 16, 23, 24, 28, 30, 31, 32], PC is [26, 27], and PF is {[23, 26], [14, 27]}; or if K is 9, N is 32, and $N_0$ is 32, the first constructor parameters are as follows: R is no rate matching, P is an empty set, F is [1, 2, 3, 4, 5, 6, 7, 8, 9, 10, 11, 12, 13, 17, 18, 19, 21, 25, 29], I is [14, 15, 16, 23, 24, 28, 30, 31, 32], PC is [20, 22, 26, 27], and PF is {[15, 20], [15, 22], [15, 23, 26], [14, 27]} or {[15, 20], [22], [23, 26], [14, 27]}; or if K is 10, N is 32, and $N_0$ is 32, the first constructor parameters are as follows: R is no rate matching, P is an empty set, F is [1, 2, 3, 4, 5, 6, 7, 8, 9, 10, 11, 13, 17, 18, 19, 21, 25], I is [12, 14, 15, 16, 23, 24, 28, 30, 31, 32], PC is [20, 22, 26, 27, 29], and PF is {[15, 20], [12 22], [23, 26], [14, 27], [12, 29]} or {[15, 20], [12, 15, 22], [15, 23, 26], [14, 27], [12, 29]}; or if K is 11, N is 32, and $N_0$ is 32, the first constructor parameters are as follows: R is no rate matching, P is an empty set, F is [1, 2, 3, 4, 5, 6, 7, 8, 9, 10, 11, 13, 17, 18, 19, 21, 25], I is [12, 14, 15, 16, 23, 24, 28, 29, 30, 31, 32], PC is [20, 22, 26, 27], and PF is {[15, 20], [12, 15, 22], [15, 23, 26], [14, 27]} or {[15, 20], [12 22], [23, 26], [14, 27]}; or if K is 5, N is 24, and $N_0$ is 32, the first constructor parameters are as follows: R is puncturing, P is [1, 2, 3, 4, 5, 6, 9, 10], F is [1, 2, 3, 4, 5, 6, 7, 8, 9, 10, 11, 12, 13, 14, 15, 16, 17, 18, 19, 20, 21, 22, 23, 25, 26, 27, 29], I is [24, 28, 30, 31, 32], PC is an empty set, and PF is an empty set; or if K is 6, N is 24, and $N_0$ is 32, the first constructor parameters are as follows: R is puncturing, P is [1, 2, 3, 4, 9, 10, 17, 18], F is [1, 2, 3, 4, 5, 6, 7, 8, 9, 10, 11, 12, 13, 14, 15, 17, 18, 19, 20, 21, 22, 23, 25, 26, 27, 29], I is [16, 24, 28, 30, 31, 32], PC is an empty set, and PF is an empty set; or if K is 7, N is 24, and $N_0$ is 32, the first constructor parameters are as follows: R is puncturing, P is [1, 2, 3, 4, 5, 6, 7, 8], F is [1, 2, 3, 4, 5, 6, 7, 8, 9, 10, 11, 12, 13, 14, 15, 17, 18, 19, 20, 21, 22, 25, 27, 29], I is [16, 23, 24, 28, 30, 31, 32], PC is [26], and PF is {[23, 26]}; or if K is 8, N is 24, and $N_0$ is 32, the first constructor parameters are as follows: R is puncturing, P is [1, 2, 3, 4, 5, 6, 7, 8], F is [1, 2, 3, 4, 5, 6, 7, 8, 9, 10, 11, 12, 13, 15, 17, 18, 19, 20, 21, 22, 25, 29], I is [14, 16, 23, 24, 28, 30, 31, 32], PC is [26, 27], and PF is {[23, 26], [14, 27]}; or if K is 9, N is 24, and $N_0$ is 32, the first constructor parameters are as follows: R is puncturing, P is [1, 2, 3, 4, 5, 6, 7, 8], F is [1, 2, 3, 4, 5, 6, 7, 8, 9, 10, 11, 12, 13, 17, 18, 19, 21, 25, 29], I is [14, 15, 16, 23, 24, 28, 30, 31, 32], PC is [20, 22, 26, 27], and PF is {[15, 20], [15, 22], [15, 23, 26], [14, 27]}; or if K is 10, N is 24, and $N_0$ is 32, the first constructor parameters are as follows: R is puncturing, P is [1, 2, 3, 4, 9, 10, 17, 18], F is [1, 2, 3, 4, 5, 6, 7, 8, 9, 10, 11, 13, 17, 18, 19, 21, 25], I is [12, 14, 15, 16, 23, 24, 28, 30, 31, 32], PC is [20, 22, 26, 27, 29], and PF is {[15, 20], [12 22], [23, 26], [14, 27], [12, 29]}; or if K is 11, N is 24, and $N_0$ is 32, the first constructor parameters are as follows: R is puncturing, P is [1, 2, 3, 4, 9, 10, 17, 18], F is [1, 2, 3, 4, 5, 6, 7, 8, 9, 10, 11, 13, 17, 18, 19, 21, 25], I is [12, 14, 15, 16, 23, 24, 28, 29, 30, 31, 32], PC is [20, 22, 26, 27], and PF is {[15, 20], [12, 15, 22], [15, 23, 26], [14, 27]} or {[15, 20], [12 22], [23, 26], [14, 27]}; or if K is 5, N is 20, and $N_0$ is 32, the first constructor parameters are as follows: R is puncturing, P is [1, 3, 6, 9, 12, 16, 18, 23, 24, 27, 31, 32], F is [1, 2, 3, 4, 5, 6, 7, 8, 9, 10, 11, 12, 13, 14, 15, 16, 17, 18, 19, 20, 21, 22, 23, 25, 26, 27, 29], I is [24, 28, 30, 31, 32], PC is an empty set, and PF is an empty set; or if K is 6, N is 20, and $N_0$ is 32, the first constructor parameters are as follows: R is puncturing, P is [1, 3, 6, 9, 12, 16, 18, 23, 24, 27, 31, 32], F is [1, 2, 3, 4, 5, 6, 7, 8, 9, 10, 11, 12, 13, 14, 15, 17, 18, 19, 20, 21, 22, 23, 25, 26, 27, 29], I is [16, 24, 28, 30, 31, 32], PC is an empty set, and PF is an empty set; or if K is 7, N is 20, and $N_0$ is 32, the first constructor parameters are as follows: R is puncturing, P is [1, 2, 3, 4, 5, 6, 7, 8, 9, 10, 17, 18], F is [1, 2, 3, 4, 5, 6, 7, 8, 9, 10, 11, 12, 13, 14, 15, 17, 18, 19, 20, 21, 23, 25, 26, 29], I is [16, 22, 24, 28, 30, 31, 32], PC is [27], and PF is {[22, 27]}; or if K is 8, N is 20, and $N_0$ is 32, the first constructor parameters are as follows: R is puncturing, P is [1, 2, 3, 4, 5, 6, 7, 8, 9, 10, 17, 18], F is [1, 2, 3, 4, 5, 6, 7, 8, 9, 10, 11, 12, 13, 15, 17, 18, 19, 20, 21, 22, 25, 29], I is [14, 16, 23, 24, 28, 30, 31, 32], PC is [26, 27], and PF is {[23, 26], [14, 27]}; or if K is 9, N is 20, and $N_0$ is 32, the first constructor parameters are as follows: R is puncturing, P is [1, 2, 3, 4, 5, 6, 7, 8, 9, 10, 11, 12], F is [1, 2, 3, 4, 5, 6, 7, 8, 9, 10, 11, 12, 13, 14, 15, 17, 18, 19, 21, 25], I is [16, 22, 23, 24, 28, 29, 30, 31, 32], PC is [20, 26, 27], and PF is {[16, 20], [16, 22, 23, 26], [22, 27]}; or if K is 10, N is 20, and $N_0$ is 32, the first constructor parameters are as follows: R is puncturing, P is [1, 2, 3, 4, 5, 6, 7, 8, 9, 10, 17, 18], F is [1, 2, 3, 4, 5, 6, 8, 9, 10, 11, 12, 13, 17, 18, 19, 21, 25], I is [14, 15, 16, 23, 24, 28, 29, 30, 31, 32], PC is [20, 22, 26, 27], and PF is {[15, 20], [15, 22], [15, 23, 26], [14, 27]}; or if K is 11, N is 20, and $N_0$ is 32, the first constructor parameters are as follows: R is puncturing, P is [1, 2, 3, 4, 5, 6, 7, 8, 9, 10, 17, 18], F is [1, 2, 3, 4, 5, 6, 7, 8, 9, 10, 11, 13, 17, 18, 19, 21, 25], I is [12, 14, 15, 16, 23, 24, 28, 29, 30, 31, 32], PC is [20, 22, 26, 27], and PF is {[15, 20], [12, 15, 22], [15, 23, 26], [14, 27]} or {[15, 20], [12 22], [23, 26], [14, 27]}; or if K is 12, N is 20, and $N_0$ is 32, the first constructor parameters are as follows: R is puncturing, P is [1, 2, 3, 4, 5, 6, 7, 8, 9, 10, 17, 18], F is [1, 2, 3, 4, 5, 6, 7, 8, 9, 10, 11, 13, 17, 18, 19, 21, 25], I is [12, 14, 15, 16, 20, 24, 27, 28, 29, 30, 31, 32], PC is [22, 23, 26], and PF is {[14, 20, 22], [14, 15, 20, 23], [12, 14, 15, 20, 26]}; or if K is 13, N is 20, and $N_0$ is 32, the first constructor parameters are as follows: R is puncturing, P is [1, 2, 3, 4, 5, 6, 7, 8, 9, 10, 11, 12], F is [1, 2, 3, 4, 5, 6, 7, 8, 9, 10, 11, 12, 13, 15, 17, 21, 25], I is [14, 16, 20, 22, 23, 24, 26, 27, 28, 29, 30, 31, 32], PC is [18, 19], and PF is {[14, 18], [14, 19]}; or if K is 5, N is 24, and $N_0$ is 32, the first constructor parameters are as follows: R is shortening, P is [4, 8, 12, 16, 20, 24, 28, 32], F is [1, 2, 3, 4, 5, 6, 7, 8, 9, 10, 11, 12, 13, 16, 17, 18, 19, 20, 21, 24, 25, 28, 32], I is [14, 15, 22, 30, 31], PC is [23, 26, 27, 29], and PF is {[14, 15, 23], [14, 15, 26], [14, 22, 27], [14, 29]}; or if K is 6, N is 24, and $N_0$ is 32, the first constructor parameters are as follows: R is shortening, P is [4, 8, 12, 16, 20, 24, 28, 32], F is [1, 2, 3, 4, 5, 6, 7, 8, 9, 10, 11, 12, 13, 16, 17, 18, 19, 20, 21, 24, 25, 28, 32], I is [14, 15, 22, 23, 30, 31], PC is [26, 27, 29], and PF is {[15, 26], [22, 27], [14, 29]}; or if K is 7, N is 24, and $N_0$ is 32, the first constructor parameters are as follows: R is shortening, P is [4, 8, 12, 16, 20, 24, 28, 32], F is [1, 2, 3, 4, 5, 6, 7, 8, 9, 10, 11, 12, 13, 16, 17, 18, 19, 20, 21, 24, 25, 28, 32], I is [14, 15, 22, 23, 26, 30, 31], PC is [27, 29], and PF is {[24, 26, 27], [14, 23, 26, 29]}; or if K is 8, N is 24, and $N_0$ is 32, the first constructor parameters are as follows: R is shortening, P is [4, 8, 12, 16, 20, 24, 28, 32], F is [1, 2, 3, 4, 5, 6, 7, 8, 9, 10, 11, 12, 13, 16, 17, 18, 19, 20, 21, 24, 25, 28, 32], I is [14, 15, 22, 23, 26, 27, 30, 31], PC is [29], and PF is {[14, 15, 22, 23, 26, 27, 29]}; or if K is 9, N is 24, and $N_0$ is 32, the first constructor parameters are as follows: R is shortening, P is [4, 8, 12, 16, 20, 24, 28, 32], F is [1, 2, 3, 4, 5, 6, 7, 8, 9, 10, 11, 12, 13, 16, 17, 18, 19, 20, 21, 24, 25, 28, 32], I is [14, 15, 22, 23, 26, 27, 29, 30, 31], PC is an empty set, and PF is an empty set; or if K is 10, N is 24, and $N_0$ is 32, the first constructor parameters are as follows: R is shortening, P is [4, 8, 12, 16, 20, 24, 28, 32], F is [1, 2, 3, 4, 5, 6, 7, 8, 9, 12, 16, 17, 20, 24, 28, 32], I is [6, 14, 15, 22, 23, 26, 27, 29, 30, 31], PC is [10, 11, 13, 18, 19, 21, 25], and PF is {[6, 10], [6, 11], [6, 13], [6, 18], [6, 19], [6, 21], [6, 25]}; or if K is 11, N is 24, and $N_0$ is 32, the first constructor parameters are as follows: R is shortening, P is [4, 8, 12, 16, 20, 24, 28, 32], F is [1, 2, 3, 4, 5, 8, 9, 12, 16, 17, 20, 24, 28, 32], I is [6, 7, 14, 15, 22, 23, 26, 27, 29, 30, 31], PC is [10, 11, 13, 18, 19, 21, 25], and PF is {[7, 10], [6, 7, 11], [6, 7, 13], [6, 7, 18], [6, 7, 19], [6, 7, 21], [6, 7, 25]}; or if K is 5, N is 20, and $N_0$ is 32, the first constructor parameters are as follows: R is shortening, P is [4, 6, 8, 12, 14, 16, 20, 22, 24, 28, 32], F is [1, 2, 3, 4, 5, 6, 7, 8, 9, 10, 11, 12, 13, 14, 16, 17, 19, 20, 21, 22, 24, 25, 28, 30, 32], I is [15, 23, 27, 29, 31], PC is [18, 26], and PF is {[15, 18], [23, 26]}; or if K is 6, N is 20, and $N_0$ is 32, the first constructor parameters are as follows: R is shortening, P is [4, 6, 8, 12, 14, 16, 20, 22, 24, 28, 32], F is [1, 2, 3, 4, 5, 6, 7, 8, 9, 10, 11, 12, 13, 14, 16, 17, 19, 20, 21, 22, 24, 25, 28, 30, 32], I is [15, 23, 26, 27, 29, 31], PC is [18], and PF is {[15, 18]}; or if K is 7, N is 20, and $N_0$ is 32, the first constructor parameters are as follows: R is shortening, P is [4, 6, 8, 12, 14, 16, 20, 22, 24, 28, 32], F is [1, 2, 3, 4, 5, 6, 7, 8, 9, 12, 14, 16, 17, 18, 19, 20, 22, 24, 25, 28, 30, 32], I is [10, 15, 23, 26, 27, 29, 31], PC is [11, 13, 21], and PF is {[10, 11], [10, 13], [10, 21]}; or if K is 8, N is 20, and $N_0$ is 32, the first constructor parameters are as follows: R is shortening, P is [4, 6, 8, 12, 14, 16, 20, 22, 24, 28, 32], F is [1, 2, 3, 4, 5, 6, 7, 8, 9, 11, 12, 14, 16, 17, 20, 22, 24, 28, 30, 32], I is [10, 13, 15, 23, 26, 27, 29, 31], PC is [18, 19, 21, 25], and PF is {[13, 18], [10, 19], [10, 13, 21], [10, 25]}; or if K is 9, N is 20, and $N_0$ is 32, the first constructor parameters are as follows: R is shortening, P is [4, 6, 8, 12, 14, 16, 20, 22, 24, 28, 32], F is [1, 2, 3, 4, 5, 6, 7, 8, 9, 12, 14, 16, 17, 20, 22, 24, 28, 30, 32], I is [10, 11, 13, 15, 23, 26, 27, 29, 31], PC is [18, 19, 21], and PF is {[11, 18], [11, 13, 19], [10, 21]} or {[11, 18], [13, 19], [10, 21]}; or if K is 10, N is 20, and $N_0$ is 32, the first constructor parameters are as follows: R is shortening, P is [4, 6, 8, 12, 14, 16, 20, 22, 24, 28, 30, 32], F is [1, 2, 3, 4, 5, 6, 8, 9, 12, 14, 16, 17, 20, 22, 24, 28, 30, 32], I is [7, 10, 11, 13, 15, 23, 26, 27, 29, 31], PC is [18, 19, 21, 25], and PF is {[7, 11, 18], [11, 13, 19], [10, 21], [7, 25]} or {[7, 11, 18], [11, 13, 19], [10, 21], [25]}; or if K is 11, N is 20, and $N_0$ is 32, the first constructor parameters are as follows: R is shortening, P is [4, 6, 8, 12, 14, 16, 20, 22, 24, 28, 30, 32], F is [1, 2, 3, 4, 5, 6, 7, 8, 9, 12, 14, 16, 17, 20, 22, 24, 28, 30, 32], I is [10, 11, 13, 15, 18, 23, 26, 27, 29, 31], PC is [19, 21, 25], and PF is {[10, 13, 19], [7, 10, 11, 13, 21], [7, 10, 11, 13, 25]}; or if K is 12, N is 20, and $N_0$ is 32, the first constructor parameters are as follows: R is shortening, P is [4, 6, 8, 12, 14, 16, 20, 22, 24, 28, 30, 32], F is [1, 2, 3, 4, 5, 6, 8, 9, 12, 14, 16, 17, 20, 22, 24, 28, 30, 32], I is [7, 11, 13, 15, 19, 21, 23, 25, 26, 27, 29, 31], PC is [10, 18], and PF is {[7, 10], [11, 18]}; or if K is 13, N is 20, and $N_0$ is 32, the first constructor parameters are as follows: R is shortening, P is [4, 6, 8, 12, 14, 16, 20, 22, 24, 28, 30, 32], F is [1, 2, 3, 4, 5, 6, 8, 9, 12, 14, 16, 17, 20, 22, 24, 28, 30, 32], I is [7, 11, 13, 15, 18, 19, 21, 23, 25, 26, 27, 29, 31], PC is [10], and PF is {[7, 10]}; or if K is 5, N is 16, and $N_0$ is 32, the first constructor parameters are as follows: R is no rate matching, P is an empty set, F is [1, 2, 3, 4, 5, 6, 7, 9, 10, 11, 13], I is [8, 12, 14, 15, 16, 17, 18, 19, 20, 21, 22, 23, 24, 25, 26, 27, 28, 29, 30, 31, 32], PC is an empty set, and PF is an empty set; or if K is 6, N is 16, and $N_0$ is 32, the first constructor parameters are as follows: R is no rate matching, P is an empty set, F is [1, 2, 3, 4, 5, 7, 9, 10], I is [8, 12, 14, 15, 16, 17, 18, 19, 20, 21, 22, 23, 24, 25, 26, 27, 28, 29, 30, 31, 32], PC is [11, 13], and PF is {[6, 11], [6, 13]}; or if K is 7, N is 16, and $N_0$ is 32, the first constructor parameters are as follows: R is no rate matching, P is an empty set, F is [1, 2, 3, 5, 7, 9], I is [4, 6, 8, 12, 14, 15, 16, 17, 18, 19, 20, 21, 22, 23, 24, 25, 26, 27, 28, 29, 30, 31, 32], PC is [10, 11, 13], and PF is {[4, 10], [4, 6, 11], [4, 13]}; or if K is 8, N is 16, and $N_0$ is 32, the first constructor parameters are as follows: R is no rate matching, P is an empty set, F is [1, 2, 3, 5, 9], I is [4, 7, 8, 11, 12, 14, 15, 16, 17, 18, 19, 20, 21, 22, 23, 24, 25, 26, 27, 28, 29, 30, 31, 32], PC is [6, 10, 13], and PF is {[4, 6], [7, 10], [4, 7, 11, 13]}; or if K is 9, N is 16, and $N_0$ is 32, the first constructor parameters are as follows: R is no rate matching, P is an empty set, F is [1, 2, 3, 5, 9], I is [4, 6, 7, 8, 10, 12, 14, 15, 16, 17, 18, 19, 20, 21, 22, 23, 24, 25, 26, 27, 28, 29, 30, 31, 32], PC is [11, 13], and PF is {[4, 7, 10, 11], [4, 13]}; or if K is 10, N is 16, and $N_0$ is 32, the first constructor parameters are as follows: R is no rate matching, P is an empty set, F is [1, 2, 3, 5, 9], I is [4, 6, 7, 8, 10, 11, 12, 14, 15, 16, 17, 18, 19, 20, 21, 22, 23, 24, 25, 26, 27, 28, 29, 30, 31, 32], PC is [13], and PF is {[6, 10, 11, 13]}; or if K is 11, N is 16, and $N_0$ is 32, the first constructor parameters are as follows: R is no rate matching, P is an empty set, F is [1, 2, 3, 5, 9], I is [4, 6, 7, 8, 10, 11, 12, 13, 14, 15, 16, 17, 18, 19, 20, 21, 22, 23, 24, 25, 26, 27, 28, 29, 30, 31, 32], PC is an empty set, and PF is an empty set.

5. A non-transitory computer-readable storage medium storing instructions that, when executed on a computer, cause the computer to perform a coding method comprising:
obtaining to-be-coded information bits;
performing parity check polar (PC-polar) coding on the to-be-coded information bits based on first constructor parameters, to obtain a coded bit sequence,
wherein the first constructor parameters comprise a check equation, the check equation comprises a first element representing a check-required information bit position and a second element representing a check bit position,
wherein the first element corresponds to a first vector in a generator matrix for PC-polar codes,
wherein the second element corresponds to a second vector in the generator matrix,
wherein the first element and the second element are both row numbers of the generator matrix for PC-polar codes, the first vector is a row vector whose row number is a value of the first element in the generator matrix for PC-polar codes, and the second vector is a row vector whose row number is a value of the second element in the generator matrix for PC-polar codes,
wherein the first element is less than the second element, and
wherein in response to a first Hamming weight of the first vector being the same as a second Hamming weight of the second vector, a third Hamming weight of an addition modulo 2 vector of the first vector and the second vector is greater than the first Hamming weight and greater than the second Hamming weight, and in response to the first Hamming weight of the first vector being different from the second Hamming weight of the second vector, the third Hamming weight of the addition modulo 2 vector of the first vector and the second vector is greater than a smaller one of the first Hamming weight and the second Hamming weight; and
sending the coded bit sequence to another computing device in a computer network.

6. The computer-readable storage medium according to claim 5, wherein bit positions are denoted by row numbers 1, 2, . . . , and $N_0$ of the generator matrix, $N_0$ represents a mother code length of a PC-polar code, K represents a length of the to-be-coded information bits, N represents a length of the coded bit sequence, $N_0$, K, and N are all positive integers, R represents a rate matching scheme, P represents a processing position of the rate matching scheme, F represents a frozen bit position, I represents an information bit position, PC represents a check bit position, and PF represents the check equation,
wherein:
if K is 1 and $N_0$ is $2^{\operatorname{ceil}(\log_2 N)}$, wherein ceil is an up-rounding operation, the first constructor parameters are as follows: R is puncturing, P is any ($N_0$-N) bit positions, F is 1 to $N_0$-1, I is $N_0$, and PC and PF are both empty sets; or if K is 2, 3, 4, or 5 and $N_0$ is $2^K$, the first constructor parameters are as follows: R is shortening to $N_0$-1 followed by repeating to the length N, with a low-order bit of a code word punctured when N is a non-integer multiple of $N_0$, P is $\{N_0\}$, I comprises all row numbers corresponding to row vectors whose row weights are $N_0/2$, F comprises all row numbers except the row numbers in I, and PC and PF are both empty sets; or if K is 6, N is 32, and $N_0$ is 32, the first constructor parameters are as follows: R is no rate matching, P is an empty set, F is [1, 2, 3, 4, 5, 6, 7, 8, 9, 10, 11, 12, 13, 14, 15, 17, 18, 19, 20, 21, 22, 23, 25, 26, 27, 29], I is [16, 24, 28, 30, 31, 32], PC is an empty set, and PF is an empty set; or if K is 7, N is 32, and $N_0$ is 32, the first constructor parameters are as follows: R is no rate matching, P is an empty set, F is [1, 2, 3, 4, 5, 6, 7, 8, 9, 10, 11, 12, 13, 14, 15, 17, 18, 19, 20, 21, 22, 25, 27, 29], I is [16, 23, 24, 28, 30, 31, 32], PC is [26], and PF is [23, 26]; or if K is 8, N is 32, and $N_0$ is 32, the first constructor parameters are as follows: R is no rate matching, P is an empty set, F is [1, 2, 3, 4, 5, 6, 7, 8, 9, 10, 11, 12, 13, 15, 17, 18, 19, 20, 21, 22, 25, 29], I is [14, 16, 23, 24, 28, 30, 31, 32], PC is [26, 27], and PF is {[23, 26], [14, 27]}; or if K is 9, N is 32, and $N_0$ is 32, the first constructor parameters are as follows: R is no rate matching, P is an empty set, F is [1, 2, 3, 4, 5, 6, 7, 8, 9, 10, 11, 12, 13, 17, 18, 19, 21, 25, 29], I is [14, 15, 16, 23, 24, 28, 30, 31, 32], PC is [20, 22, 26, 27], and PF is {[15, 20], [15, 22], [15, 23, 26], [14, 27]} or {[15, 20], [22], [23, 26], [14, 27]}; or if K is 10, N is 32, and $N_0$ is 32, the first constructor parameters are as follows: R is no rate matching, P is an empty set, F is [1, 2, 3, 4, 5, 6, 7, 8, 9, 10, 11, 13, 17, 18, 19, 21, 25], I is [12, 14, 15, 16, 23, 24, 28, 30, 31, 32], PC is [20, 22, 26, 27, 29], and PF is {[15, 20], [12 22], [23, 26], [14, 27], [12, 29]} or {[15, 20], [12, 15, 22], [15, 23, 26], [14, 27], [12, 29]}; or if K is 11, N is 32, and $N_0$ is 32, the first constructor parameters are as follows: R is no rate matching, P is an empty set, F is [1, 2, 3, 4, 5, 6, 7, 8, 9, 10, 11, 13, 17, 18, 19, 21, 25], I is [12, 14, 15, 16, 23, 24, 28, 29, 30, 31, 32], PC is [20, 22, 26, 27], and PF is {[15, 20], [12, 15, 22], [15, 23, 26], [14, 27]} or {[15, 20], [12 22], [23, 26], [14, 27]}; or if K is 5, N is 24, and $N_O$ is 32, the first constructor parameters are as follows: R is puncturing, P is [1, 2, 3, 4, 5, 6, 9, 10], F is [1, 2, 3, 4, 5, 6, 7, 8, 9, 10, 11, 12, 13, 14, 15, 16, 17, 18, 19, 20, 21, 22, 23, 25, 26, 27, 29], I is [24, 28, 30, 31, 32], PC is an empty set, and PF is an empty set; or if K is 6, N is 24, and $N_O$ is 32, the first constructor parameters are as follows: R is puncturing, P is [1, 2, 3, 4, 9, 10, 17, 18], F is [1, 2, 3, 4, 5, 6, 7, 8, 9, 10, 11, 12, 13, 14, 15, 17, 18, 19, 20, 21, 22, 23, 25, 26, 27, 29], I is [16, 24, 28, 30, 31, 32], PC is an empty set, and PF is an empty set; or if K is 7, N is 24, and $N_O$ is 32, the first constructor parameters are as follows: R is puncturing, P is [1, 2, 3, 4, 5, 6, 7, 8], F is [1, 2, 3, 4, 5, 6, 7, 8, 9, 10, 11, 12, 13, 14, 15, 17, 18, 19, 20, 21, 22, 25, 27, 29], I is [16, 23, 24, 28, 30, 31, 32], PC is [26], and PF is {[23, 26]}; or if K is 8, N is 24, and $N_O$ is 32, the first constructor parameters are as follows: R is puncturing, P is [1, 2, 3, 4, 5, 6, 7, 8], F is [1, 2, 3, 4, 5, 6, 7, 8, 9, 10, 11, 12, 13, 15, 17, 18, 19, 20, 21, 22, 25, 29], I is [14, 16, 23, 24, 28, 30, 31, 32], PC is [26, 27], and PF is {[23, 26], [14, 27]}; or if K is 9, N is 24, and $N_O$ is 32, the first constructor parameters are as follows: R is puncturing, P is [1, 2, 3, 4, 5, 6, 7, 8], F is [1, 2, 3, 4, 5, 6, 7, 8, 9, 10, 11, 12, 13, 17, 18, 19, 21, 25, 29], I is [14, 15, 16, 23, 24, 28, 30, 31, 32], PC is [20, 22, 26, 27], and PF is {[15, 20], [15, 22], [15, 23, 26], [14, 27]}; or if K is 10, N is 24, and $N_O$ is 32, the first constructor parameters are as follows: R is puncturing, P is [1, 2, 3, 4, 9, 10, 17, 18], F is [1, 2, 3, 4, 5, 6, 7, 8, 9, 10, 11, 13, 17, 18, 19, 21, 25], I is [12, 14, 15, 16, 23, 24, 28, 30, 31, 32], PC is [20, 22, 26, 27, 29], and PF is {[15, 20], [12 22], [23, 26], [14, 27], [12, 29]}; or if K is 11, N is 24, and $N_O$ is 32, the first constructor parameters are as follows: R is puncturing, P is [1, 2, 3, 4, 9, 10, 17, 18], F is [1, 2, 3, 4, 5, 6, 7, 8, 9, 10, 11, 13, 17, 18, 19, 21, 25], I is [12, 14, 15, 16, 23, 24, 28, 29, 30, 31, 32], PC is [20, 22, 26, 27], and PF is {[15, 20], [12, 15, 22], [15, 23, 26], [14, 27]} or {[15, 20], [12 22], [23, 26], [14, 27]}; or if K is 5, N is 20, and $N_O$ is 32, the first constructor parameters are as follows: R is puncturing, P is [1, 3, 6, 9, 12, 16, 18, 23, 24, 27, 31, 32], F is [1, 2, 3, 4, 5, 6, 7, 8, 9, 10, 11, 12, 13, 14, 15, 16, 17, 18, 19, 20, 21, 22, 23, 25, 26, 27, 29], I is [24, 28, 30, 31, 32], PC is an empty set, and PF is an empty set; or if K is 6, N is 20, and $N_O$ is 32, the first constructor parameters are as follows: R is puncturing, P is [1, 3, 6, 9, 12, 16, 18, 23, 24, 27, 31, 32], F is [1, 2, 3, 4, 5, 6, 7, 8, 9, 10, 11, 12, 13, 14, 15, 17, 18, 19, 20, 21, 22, 23, 25, 26, 27, 29], I is [16, 24, 28, 30, 31, 32], PC is an empty set, and PF is an empty set; or if K is 7, N is 20, and $N_O$ is 32, the first constructor parameters are as follows: R is puncturing, P is [1, 2, 3, 4, 5, 6, 7, 8, 9, 10, 17, 18], F is [1, 2, 3, 4, 5, 6, 7, 8, 9, 10, 11, 12, 13, 14, 15, 17, 18, 19, 20, 21, 23, 25, 26, 29], I is [16, 22, 24, 28, 30, 31, 32], PC is [27], and PF is {[22, 27]}; or if K is 8, N is 20, and $N_O$ is 32, the first constructor parameters are as follows: R is puncturing, P is [1, 2, 3, 4, 5, 6, 7, 8, 9, 10, 17, 18], F is [1, 2, 3, 4, 5, 6, 7, 8, 9, 10, 11, 12, 13, 15, 17, 18, 19, 20, 21, 22, 25, 29], I is [14, 16, 23, 24, 28, 30, 31, 32], PC is [26, 27], and PF is {[23, 26], [14, 27]}; or if K is 9, N is 20, and $N_O$ is 32, the first constructor parameters are as follows: R is puncturing, P is [1, 2, 3, 4, 5, 6, 7, 8, 9, 10, 11, 12], F is [1, 2, 3, 4, 5, 6, 7, 8, 9, 10, 11, 12, 13, 14, 15, 17, 18, 19, 21, 25], I is [16, 22, 23, 24, 28, 29, 30, 31, 32], PC is [20, 26, 27], and PF is {[16, 20], [16, 22, 23, 26], [22, 27]}; or if K is 10, N is 20, and $N_O$ is 32, the first constructor parameters are as follows: R is puncturing, P is [1, 2, 3, 4, 5, 6, 7, 8, 9, 10, 17, 18], F is [1, 2, 3, 4, 5, 6, 8, 9, 10, 11, 12, 13, 17, 18, 19, 21, 25], I is [14, 15, 16, 23, 24, 28, 29, 30, 31, 32], PC is [20, 22, 26, 27], and PF is {[15, 20], [15, 22], [15, 23, 26], [14, 27]}; or if K is 11, N is 20, and $N_O$ is 32, the first constructor parameters are as follows: R is puncturing, P is [1, 2, 3, 4, 5, 6, 7, 8, 9, 10, 17, 18], F is [1, 2, 3, 4, 5, 6, 7, 8, 9, 10, 11, 13, 17, 18, 19, 21, 25], I is [12, 14, 15, 16, 23, 24, 28, 29, 30, 31, 32], PC is [20, 22, 26, 27], and PF is {[15, 20], [12, 15, 22], [15, 23, 26], [14, 27]} or {[15, 20], [12 22], [23, 26], [14, 27]}; or if K is 12, N is 20, and $N_O$ is 32, the first constructor parameters are as follows: R is puncturing, P is [1, 2, 3, 4, 5, 6, 7, 8, 9, 10, 17, 18], F is [1, 2, 3, 4, 5, 6, 7, 8, 9, 10, 11, 13, 17, 18, 19, 21, 25], I is [12, 14, 15, 16, 20, 24, 27, 28, 29, 30, 31, 32], PC is [22, 23, 26], and PF is {[14, 20, 22], [14, 15, 20, 23], [12, 14, 15, 20, 26]}; or if K is 13, N is 20, and $N_O$ is 32, the first constructor parameters are as follows: R is puncturing, P is [1, 2, 3, 4, 5, 6, 7, 8, 9, 10, 11, 12], F is [1, 2, 3, 4, 5, 6, 7, 8, 9, 10, 11, 12, 13, 15, 17, 21, 25], I is [14, 16, 20, 22, 23, 24, 26, 27, 28, 29, 30, 31, 32], PC is [18, 19], and PF is {[14, 18], [14, 19]}; or if K is 5, N is 24, and $N_O$ is 32, the first constructor parameters are as follows: R is shortening, P is [4, 8, 12, 16, 20, 24, 28, 32], F is [1, 2, 3, 4, 5, 6, 7, 8, 9, 10, 11, 12, 13, 16, 17, 18, 19, 20, 21, 24, 25, 28, 32], I is [14, 15, 22, 30, 31], PC is [23, 26, 27, 29], and PF is {[14, 15, 23], [14, 15, 26], [14, 22, 27], [14, 29]}; or if K is 6, N is 24, and $N_O$ is 32, the first constructor parameters are as follows: R is shortening, P is [4, 8, 12, 16, 20, 24, 28, 32], F is [1, 2, 3, 4, 5, 6, 7, 8, 9, 10, 11, 12, 13, 16, 17, 18, 19, 20, 21, 24, 25, 28, 32], I is [14, 15, 22, 23, 30, 31], PC is [26, 27, 29], and PF is {[15, 26], [22, 27], [14, 29]}; or if K is 7, N is 24, and $N_O$ is 32, the first constructor parameters are as follows: R is shortening, P is [4, 8, 12, 16, 20, 24, 28, 32], F is [1, 2, 3, 4, 5, 6, 7, 8, 9, 10, 11, 12, 13, 16, 17, 18, 19, 20, 21, 24, 25, 28, 32], I is [14, 15, 22, 23, 26, 30, 31], PC is [27, 29], and PF is {[24, 26, 27], [14, 23, 26, 29]}; or if K is 8, N is 24, and $N_O$ is 32, the first constructor parameters are as follows: R is shortening, P is [4, 8, 12, 16, 20, 24, 28, 32], F is [1, 2, 3, 4, 5, 6, 7, 8, 9, 10, 11, 12, 13, 16, 17, 18, 19, 20, 21, 24, 25, 28, 32], I is [14, 15, 22, 23, 26, 27, 30, 31], PC is [29], and PF is {[14, 15, 22, 23, 26, 27, 29]}; or if K is 9, N is 24, and $N_O$ is 32, the first constructor parameters are as follows: R is shortening, P is [4, 8, 12, 16, 20, 24, 28, 32], F is [1, 2, 3, 4, 5, 6, 7, 8, 9, 10, 11, 12, 13, 16, 17, 18, 19, 20, 21, 24, 25, 28, 32], I is [14, 15, 22, 23, 26, 27, 29, 30, 31], PC is an empty set, and PF is an empty set; or if K is 10, N is 24, and $N_O$ is 32, the first constructor parameters are as follows: R is shortening, P is [4, 8, 12, 16, 20, 24, 28, 32], F is [1, 2, 3, 4, 5, 6, 7, 8, 9, 12, 16, 17, 20, 24, 28, 32], I is [6, 14, 15, 22, 23, 26, 27, 29, 30, 31], PC is [10, 11, 13, 18, 19, 21, 25], and PF is {[6, 10], [6, 11], [6, 13], [6, 18], [6, 19], [6, 21], [6, 25]}; or if K is 11, N is 24, and $N_0$ is 32, the first constructor parameters are as follows: R is shortening, P is [4, 8, 12, 16, 20, 24, 28, 32], F is [1, 2, 3, 4, 5, 8, 9, 12, 16, 17, 20, 24, 28, 32], I is [6, 7, 14, 15, 22, 23, 26, 27, 29, 30, 31], PC is [10, 11, 13, 18, 19, 21, 25], and PF is {[7, 10], [6, 7, 11], [6, 7, 13], [6, 7, 18], [6, 7, 19], [6, 7, 21], [6, 7, 25]}; or if K is 5, N is 20, and $N_0$ is 32, the first constructor parameters are as follows: R is shortening, P is [4, 6, 8, 12, 14, 16, 20, 22, 24, 28, 32], F is [1, 2, 3, 4, 5, 6, 7, 8, 9, 10, 11, 12, 13, 14, 16, 17, 19, 20, 21, 22, 24, 25, 28, 30, 32], I is [15, 23, 27, 29, 31], PC is [18, 26], and PF is {[15, 18], [23, 26]}; or if K is 6, N is 20, and $N_0$ is 32, the first constructor parameters are as follows: R is shortening, P is [4, 6, 8, 12, 14, 16, 20, 22, 24, 28, 32], F is [1, 2, 3, 4, 5, 6, 7, 8, 9, 10, 11, 12, 13, 14, 16, 17, 19, 20, 21, 22, 24, 25, 28, 30, 32], I is [15, 23, 26, 27, 29, 31], PC is [18], and PF is {[15, 18]}; or if K is 7, N is 20, and $N_0$ is 32, the first constructor parameters are as follows: R is shortening, P is [4, 6, 8, 12, 14, 16, 20, 22, 24, 28, 32], F is [1, 2, 3, 4, 5, 6, 7, 8, 9, 12, 14, 16, 17, 18, 19, 20, 22, 24, 25, 28, 30, 32], I is [10, 15, 23, 26, 27, 29, 31], PC is [11, 13, 21], and PF is {[10, 11], [10, 13], [10, 21]}; or if K is 8, N is 20, and $N_0$ is 32, the first constructor parameters are as follows: R is shortening, P is [4, 6, 8, 12, 14, 16, 20, 22, 24, 28, 32], F is [1, 2, 3, 4, 5, 6, 7, 8, 9, 11, 12, 14, 16, 17, 20, 22, 24, 28, 30, 32], I is [10, 13, 15, 23, 26, 27, 29, 31], PC is [18, 19, 21, 25], and PF is {[13, 18], [10, 19], [10, 13, 21], [10, 25]}; or if K is 9, N is 20, and $N_0$ is 32, the first constructor parameters are as follows: R is shortening, P is [4, 6, 8, 12, 14, 16, 20, 22, 24, 28, 30, 32], F is [1, 2, 3, 4, 5, 6, 7, 8, 9, 12, 14, 16, 17, 20, 22, 24, 25, 28, 30, 32], I is [10, 11, 13, 15, 23, 26, 27, 29, 31], PC is [18, 19, 21], and PF is {[11, 18], [11, 13, 19], [10, 21]} or {[11, 18], [13, 19], [10, 21]}; or if K is 10, N is 20, and $N_0$ is 32, the first constructor parameters are as follows: R is shortening, P is [4, 6, 8, 12, 14, 16, 20, 22, 24, 28, 30, 32], F is [1, 2, 3, 4, 5, 6, 8, 9, 12, 14, 16, 17, 20, 22, 24, 28, 30, 32], I is [7, 10, 11, 13, 15, 23, 26, 27, 29, 31], PC is [18, 19, 21, 25], and PF is {[7, 11, 18], [11, 13, 19], [10, 21], [7, 25]} or {[7, 11, 18], [11, 13, 19], [10, 21], [25]}; or if K is 11, N is 20, and $N_0$ is 32, the first constructor parameters are as follows: R is shortening, P is [4, 6, 8, 12, 14, 16, 20, 22, 24, 28, 30, 32], F is [1, 2, 3, 4, 5, 6, 7, 8, 9, 12, 14, 16, 17, 20, 22, 24, 28, 30, 32], I is [10, 11, 13, 15, 18, 23, 26, 27, 29, 31], PC is [19, 21, 25], and PF is {[10, 13, 19], [7, 10, 11, 13, 21], [7, 10, 11, 13, 25]}; or if K is 12, N is 20, and $N_0$ is 32, the first constructor parameters are as follows: R is shortening, P is [4, 6, 8, 12, 14, 16, 20, 22, 24, 28, 30, 32], F is [1, 2, 3, 4, 5, 6, 8, 9, 12, 14, 16, 17, 20, 22, 24, 28, 30, 32], I is [7, 11, 13, 15, 19, 21, 23, 25, 26, 27, 29, 31], PC is [10, 18], and PF is {[7, 10], [11, 18]}; or if K is 13, N is 20, and $N_0$ is 32, the first constructor parameters are as follows: R is shortening, P is [4, 6, 8, 12, 14, 16, 20, 22, 24, 28, 30, 32], F is [1, 2, 3, 4, 5, 6, 8, 9, 12, 14, 16, 17, 20, 22, 24, 28, 30, 32], I is [7, 11, 13, 15, 18, 19, 21, 23, 25, 26, 27, 29, 31], PC is [10], and PF is {[7, 10]}; or if K is 5, N is 16, and $N_0$ is 32, the first constructor parameters are as follows: R is no rate matching, P is an empty set, F is [1, 2, 3, 4, 5, 6, 7, 9, 10, 11, 13], I is [8, 12, 14, 15, 16, 17, 18, 19, 20, 21, 22, 23, 24, 25, 26, 27, 28, 29, 30, 31, 32], PC is an empty set, and PF is an empty set; or if K is 6, N is 16, and $N_0$ is 32, the first constructor parameters are as follows: R is no rate matching, P is an empty set, F is [1, 2, 3, 4, 5, 7, 9, 10], I is [8, 12, 14, 15, 16, 17, 18, 19, 20, 21, 22, 23, 24, 25, 26, 27, 28, 29, 30, 31, 32], PC is [11, 13], and PF is {[6, 11], [6, 13]}; or if K is 7, N is 16, and $N_0$ is 32, the first constructor parameters are as follows: R is no rate matching, P is an empty set, F is [1, 2, 3, 5, 7, 9], I is [4, 6, 8, 12, 14, 15, 16, 17, 18, 19, 20, 21, 22, 23, 24, 25, 26, 27, 28, 29, 30, 31, 32], PC is [10, 11, 13], and PF is {[4, 10], [4, 6, 11], [4, 13]}; or if K is 8, N is 16, and $N_0$ is 32, the first constructor parameters are as follows: R is no rate matching, P is an empty set, F is [1, 2, 3, 5, 9], I is [4, 7, 8, 11, 12, 14, 15, 16, 17, 18, 19, 20, 21, 22, 23, 24, 25, 26, 27, 28, 29, 30, 31, 32], PC is [6, 10, 13], and PF is {[4, 6], [7, 10], [4, 7, 11, 13]}; or if K is 9, N is 16, and $N_0$ is 32, the first constructor parameters are as follows: R is no rate matching, P is an empty set, F is [1, 2, 3, 5, 9], I is [4, 6, 7, 8, 10, 12, 14, 15, 16, 17, 18, 19, 20, 21, 22, 23, 24, 25, 26, 27, 28, 29, 30, 31, 32], PC is [11, 13], and PF is {[4, 7, 10, 11], [4, 13]}; or if K is 10, N is 16, and $N_0$ is 32, the first constructor parameters are as follows: R is no rate matching, P is an empty set, F is [1, 2, 3, 5, 9], I is [4, 6, 7, 8, 10, 11, 12, 14, 15, 16, 17, 18, 19, 20, 21, 22, 23, 24, 25, 26, 27, 28, 29, 30, 31, 32], PC is [13], and PF is {[6, 10, 11, 13]}; or if K is 11, N is 16, and $N_0$ is 32, the first constructor parameters are as follows: R is no rate matching, P is an empty set, F is [1, 2, 3, 5, 9], I is [4, 6, 7, 8, 10, 11, 12, 13, 14, 15, 16, 17, 18, 19, 20, 21, 22, 23, 24, 25, 26, 27, 28, 29, 30, 31, 32], PC is an empty set, and PF is an empty set.

* * * * *